(12) United States Patent
Konda

(10) Patent No.: US 10,554,583 B2
(45) Date of Patent: *Feb. 4, 2020

(54) VLSI LAYOUTS OF FULLY CONNECTED GENERALIZED AND PYRAMID NETWORKS WITH LOCALITY EXPLOITATION

(71) Applicant: Venkat Konda, San Jose, CA (US)

(72) Inventor: Venkat Konda, San Jose, CA (US)

(73) Assignee: Konda Technologies Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/029,645

(22) Filed: Jul. 8, 2018

(65) Prior Publication Data

US 2019/0036844 A1 Jan. 31, 2019

Related U.S. Application Data

(63) Continuation of application No. 15/351,453, filed on Nov. 15, 2016, now Pat. No. 10,050,904, which is a
(Continued)

(51) Int. Cl.
*G06F 17/50* (2006.01)
*H04L 12/933* (2013.01)
*H04L 12/50* (2006.01)

(52) U.S. Cl.
CPC ...... *H04L 49/1507* (2013.01); *G06F 17/5054* (2013.01); *G06F 17/5077* (2013.01); *H04L 12/50* (2013.01); *H04L 49/10* (2013.01)

(58) Field of Classification Search
CPC . G06F 3/017; G06F 1/163; G06F 3/00; G06F 17/5054; G06F 3/0325;
(Continued)

(56) References Cited

U.S. PATENT DOCUMENTS 5,153,843 A 10/1992 Batcher
5,451,936 A 9/1995 Yang et al.
(Continued)

OTHER PUBLICATIONS

Guy Lemieux et.al., Generating highlyroutablesparse crossbars for PLDs. In ACMISIGDA Int'l. Symposium on Field Programmable Gate Arrays, pp. 155-164, Monterey, CA, Feb. 2000.
(Continued)

*Primary Examiner* — Binh C Tat

(57) ABSTRACT

VLSI layouts of generalized multi-stage and pyramid networks for broadcast, unicast and multicast connections are presented using only horizontal and vertical links with spacial locality exploitation. The VLSI layouts employ shuffle exchange links where outlet links of cross links from switches in a stage in one sub-integrated circuit block are connected to inlet links of switches in the succeeding stage in another sub-integrated circuit block so that said cross links are either vertical links or horizontal and vice versa. Furthermore the shuffle exchange links are employed between different sub-integrated circuit blocks so that spacially nearer sub-integrated circuit blocks are connected with shorter links compared to the shuffle exchange links between spacially farther sub-integrated circuit blocks. In one embodiment the sub-integrated circuit blocks are arranged in a hypercube arrangement in a two-dimensional plane. The VLSI layouts exploit the benefits of significantly lower cross points, lower signal latency, lower power and full connectivity with significantly fast compilation.

The VLSI layouts with spacial locality exploitation presented are applicable to generalized multi-stage and pyramid networks, generalized folded multi-stage and pyramid networks, generalized butterfly fat tree and pyramid networks, generalized multi-link multi-stage and pyramid networks, generalized folded multi-link multi-stage and pyramid networks, generalized multi-link butterfly fat tree and pyramid
(Continued)

networks, generalized hypercube networks, and generalized cube connected cycles networks for speedup of $s \geq 1$. The embodiments of VLSI layouts are useful in wide target applications such as FPGAs, CPLDs, pSoCs, ASIC placement and route tools, networking applications, parallel & distributed computing, and reconfigurable computing.

20 Claims, 43 Drawing Sheets

Related U.S. Application Data continuation of application No. 14/522,599, filed on Oct. 24, 2014, now Pat. No. 9,529,958, which is a continuation of application No. 13/502,207, filed as application No. PCT/US2010/052984 on Oct. 16, 2010, now Pat. No. 8,898,611.

(60) Provisional application No. 61/252,603, filed on Oct. 16, 2009, provisional application No. 61/252,609, filed on Oct. 16, 2009.

(58) Field of Classification Search
CPC ............ G06F 3/04842; G06F 3/04845; G06F 17/5077; G06F 3/02; G06F 3/0236; G06F 3/0304; G06F 3/0346; G06F 3/03545; G06F 3/04812; G06F 3/0425; G06F 3/147; G06F 15/7867; G06F 15/8015; G06F 3/013; G06F 3/014; G06F 17/509; G06F 15/08; G06F 17/13; G06F 19/00; G06F 2203/011; G06F 2203/0384; G06F 3/011; G06F 3/012; A61B 5/0022; G16H 50/20
USPC .................................................. 716/126–131
See application file for complete search history.

(56) References Cited

U.S. PATENT DOCUMENTS

| | | | |
|---|---|---|---|
| 6,018,523 A | 1/2000 | Even | |
| 6,185,220 B1 | 2/2001 | Muthukrishnan et al. | |
| 6,940,308 B2 | 9/2005 | Wong | |
| 8,170,040 B2 | 5/2012 | Konda | |
| 8,269,523 B2* | 9/2012 | Konda | G06F 17/5077 326/38 |
| 8,270,400 B2 | 9/2012 | Konda | |
| 8,363,649 B2 | 1/2013 | Konda | |
| 8,898,611 B2* | 11/2014 | Konda | G06F 17/509 716/121 |
| 9,374,322 B2* | 6/2016 | Konda | H04L 49/1515 |
| 9,509,634 B2* | 11/2016 | Konda | H04L 49/102 |
| 9,529,958 B2* | 12/2016 | Konda | G06F 17/5077 |
| 10,050,904 B2* | 8/2018 | Konda | G06F 17/5077 |

OTHER PUBLICATIONS

S. Sivaswamy et. al., "HARP: hard-wired routing pattern FPGAs", FPGA'05, Monterey, California, USA, Feb. 20-22, 2005.
Yeh, C.-H., E.A. Varvarigos, and B. Parhami, "Efficient VLSI layouts of hypercubic networks," Proc. Symp. Frontiers of Massively Parallel Computation, Feb. 1999.
Ivo Dobbelaere, Mark Horowitz, and Abbas El Gamal. Regenerative feedback repeaters for programmable interconnections. IEEE Journal of Solid-State Circuits, 30(11), 1995.
F. Petrini et. al., k-ary n-trees: High performance networks for massively parallel architectures, in: Proceedings of the 11th Intl Parallel Proc. Symp. , IPPS'97, pp. 87-93.
P.Pande et al. "Evaluation of MP-SoC Interconnect Architectures: a Case Study", Proceedings of 4th IWSOC, Banff, Alberta, Canada, Jul. 19-21, 2004.
Yeh, C.-H., Varvarigos, E.A., Parhami, B.: Multilayer VLSI layout for interconnection networks. In: Proc. Intl. Conf. on Parallel Processing, 2000.
M. Lin, A. El Gamal, "A Low-Power Field-Programmable Gate Array Routing Fabric," IEEE Transactions on Very Large Scale Integration, vol. 17, No. 10, pp. 1481-1494, Oct. 2009.
Avior, A et. al., A Tight Layout of the Butterfly Network. Proc. 8-th Annual ACM Symp. on Parallel Alg. and Arch. (SPAA '96), ACM Press Ed., 1996, pp. 170-175.
A. El Gamal et. al., "An Architecture for Electrically Configurable Gate Arrays," IEEE Jrnl of Solid-State Circuits, vol. 24, No. 2, pp. 394-398, Apr. 1989.
Vaughn Betz et. al., Directional bias and non-uniformity in FPGA global routing architectures. In IEEE/ACM Intl. Conference on Computer-Aided Design, pp. 652-659, san jose, 96.
André DeHon. Rent's Rule Based Switching Requirements. In System-Level Interconnect Prediction (SLIP 2001), pp. 197-204, Mar. 31-Apr. 1, 2001.
C. Clos, "A Study of Non-Blocking Switching Networks," Bell System Technical Journal, 32:406-424, 1953.
A. DeHon, "Balancing Interconnect and Computation in a Reconfigurable Computing Array," ACM Int. Symp. on FPGA, pp. 69-78, Feb. 1999.
Chihming Chang, Rami Melhem, "Arbitrary Size Benes Networks", Journal: Parallel Processing Letters—PPL , vol. 7, No. 3, pp. 279-284, 1997.
Hoda El-Sayed and Abdou Youssef; "The r-truncated Benes Networks and their Randomized Routing Algorithms" 1997 Intl Conf on Parallel and Dist Sys, Seoul, Korea, Dec. 1997.
Guy Lemieux and David Lewis, "Using Sparse Crossbars within LUT Clusters", Procds of the ACM/SIGDA Intl Symp on Field Prog Gate Arrays 2001, Feb. 11-13, 2001, Monterey, CA.
P. Manuel, W. K. Qureshi, A. William, A. Muthumalai, "VLSI layout of Benes networks,", J. of Discrete Math. Sci. & Cryptography, vol. 10, No. 4, pp. 461-472, 2007.
Quinn, Michael J, "Parallel Computing: Theory and Practice", 2nd. ed., 1994, McGraw Hill Series in computer Science, Networks, and parallel computing, ISBN 0-07-051294-9.
Ronald I. Greenberg, "The Fat-Pyramid and Universal Parallel Computation Independent of wire delay" IEEE Trans. Computers, 43(12):1358-1364, Dec. 1994.
Hypertree: A Multiprocessor Interconnection Topology , by James R. Goodman and Carlo H Sequin, Computer Science Technical Report #427, Dept , of EECS, University of California.
Data Movement Techniques for the pyramid computer, Russ Miller and Quentin F. Stout, SIAM Journal on Computing, vol. 16, No. 1, pp. 38-60, Feb. 1987.
A. DeHon, "Unifying Mesh- and Tree-Based Programmable Interconnect," IEEE Trans. on Very Large Scale Int. Systems, vol. 12, No. 10, pp. 1051-1065, Oct. 2004.
Guy Lemieux and David Lewis. Analtyical framework for switch block design. In Intl. Conference on Field Programmable Logic and Applications, pp. 122-131, Sep. 2002.
Chen, G; Lau, FCM, "A tight layout of the cube-connected cycles", The 4th International Conference on High Perf. Computing, Bangalore, India, Dec. 18-21, 1997, p. 422-427.
Michael Shyu, Yu-Dong Chang, Guang-Ming Wu, and Yao-Wen Chang, Generic universal switch blocks. IEEE Transactions on Computers,49(4):348-359, Apr. 2000.
Y. Yamada, et. al. , "Folded Fat H-Tree: an interconnection topology for Dynamically Reconfigurable Processor Array", Embed and Ubiq. Cmpting, Intl Conf. EUC 2004.
A. DeHon. Balancing Interconnect and Computation in a Reconfigurable Computing Array (or, why you don't really want 100% LUT utili). In Proc. of intl. symp. on FPGAs, Feb. 1999.
André DeHon. Compact, Multilayer Layout for Butterfly Fat-Tree. In Twelfth Annual ACM Symposium on Parallel Algs and Architectures (SPAA 2000), pp. 206-215, Jul. 9-12, 2000.
V. P. Roychdowdhury et. al., "Segmented Channel Routing," IEEE Trans on Computer-Aided Design of Integrated Circuits and Systems, vol. 12, No. 1, pp. 79-95, Jan. 1993.

* cited by examiner

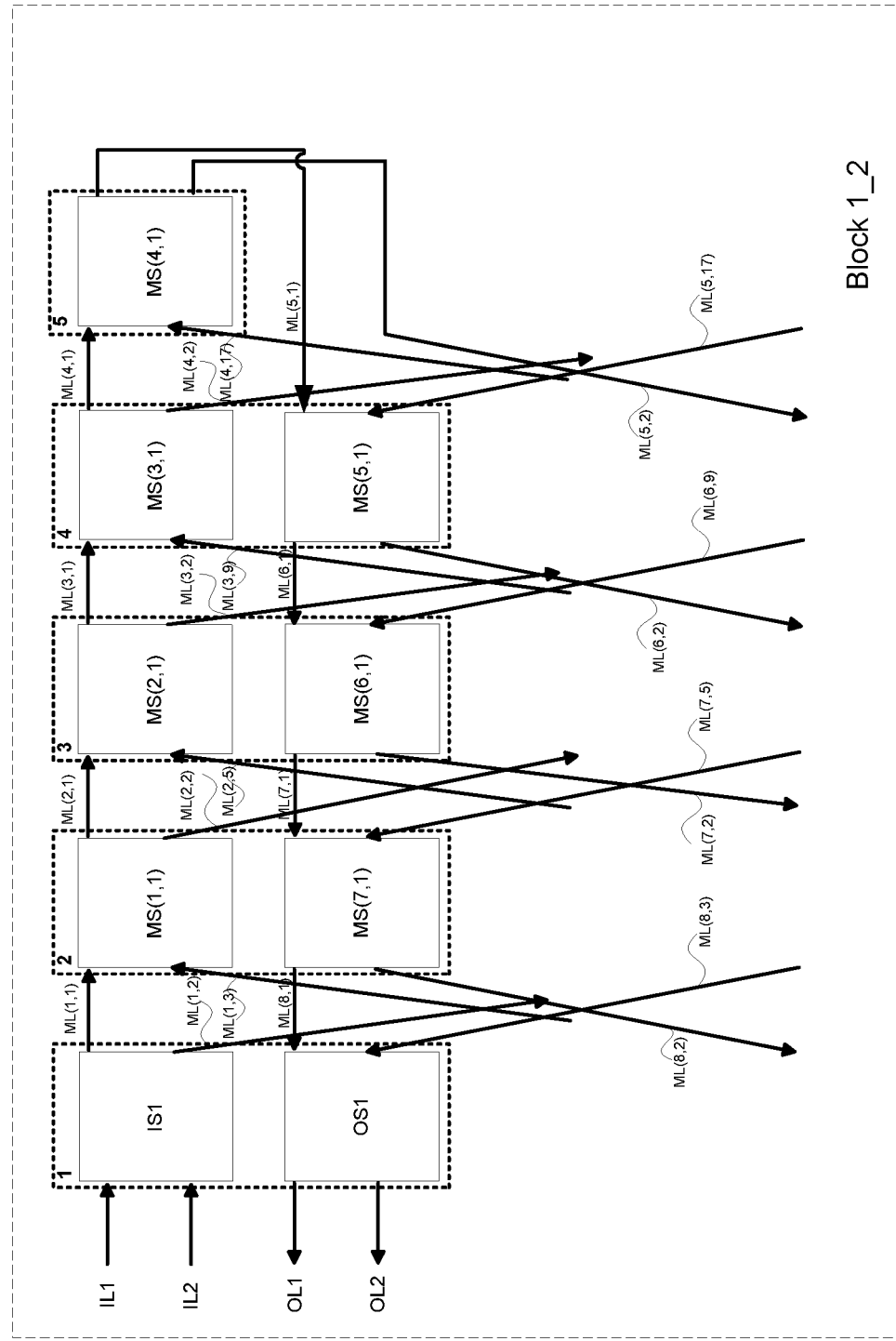
FIG. 1K1

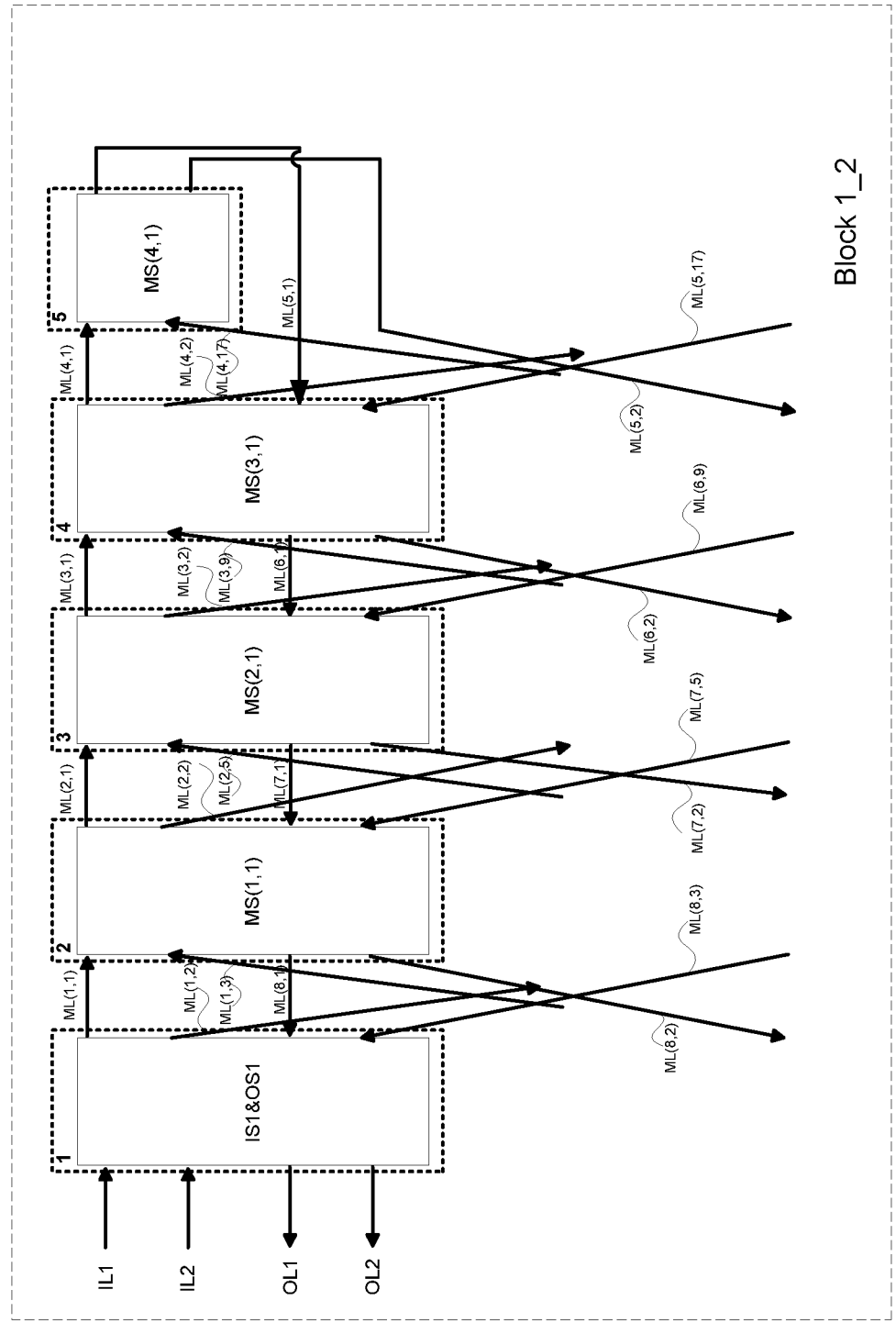
FIG. 1L1

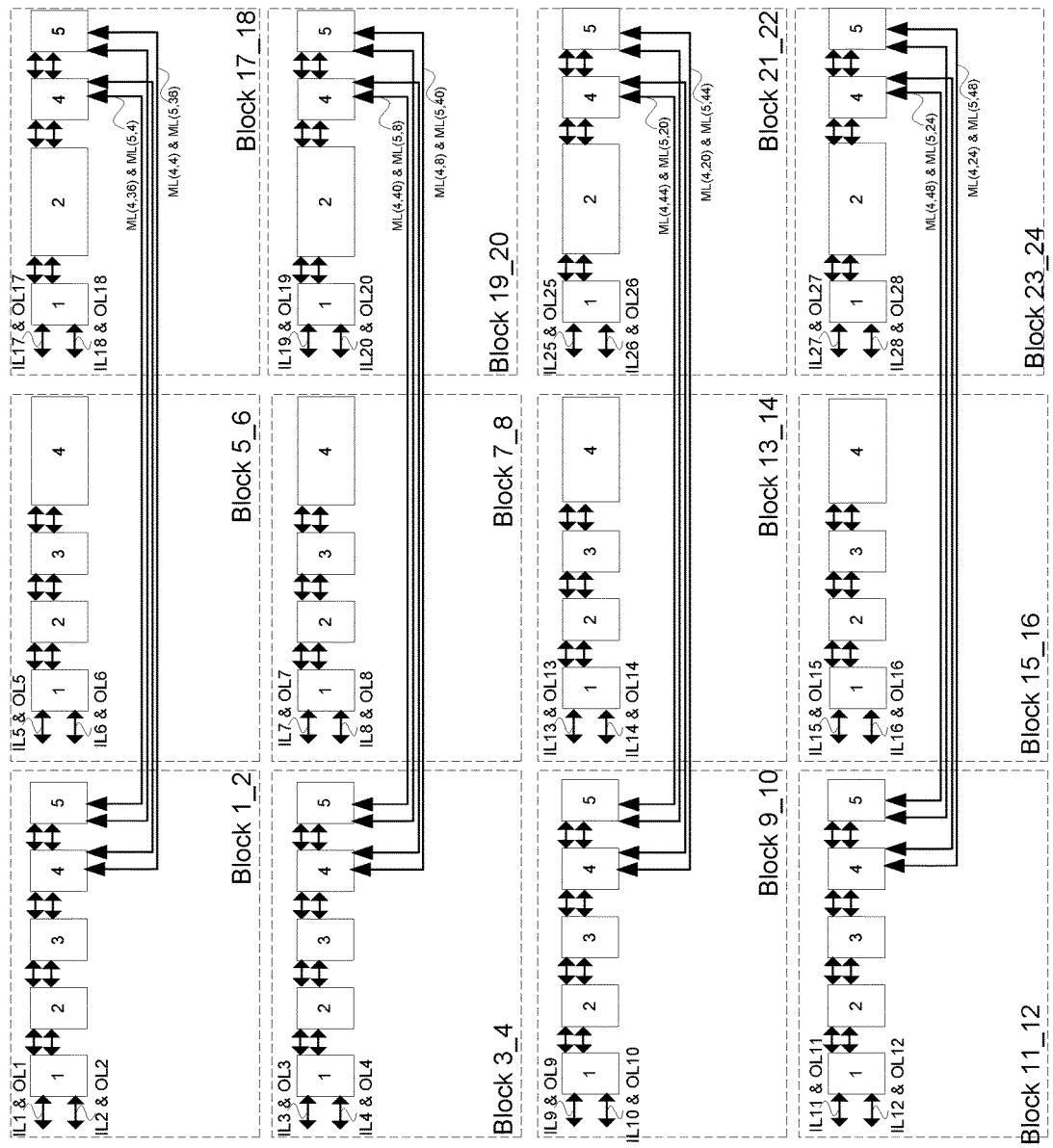

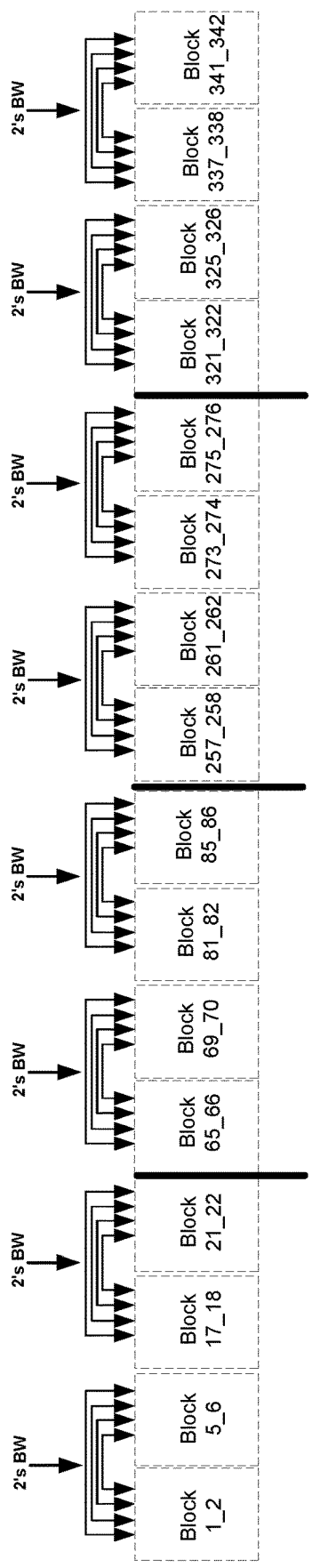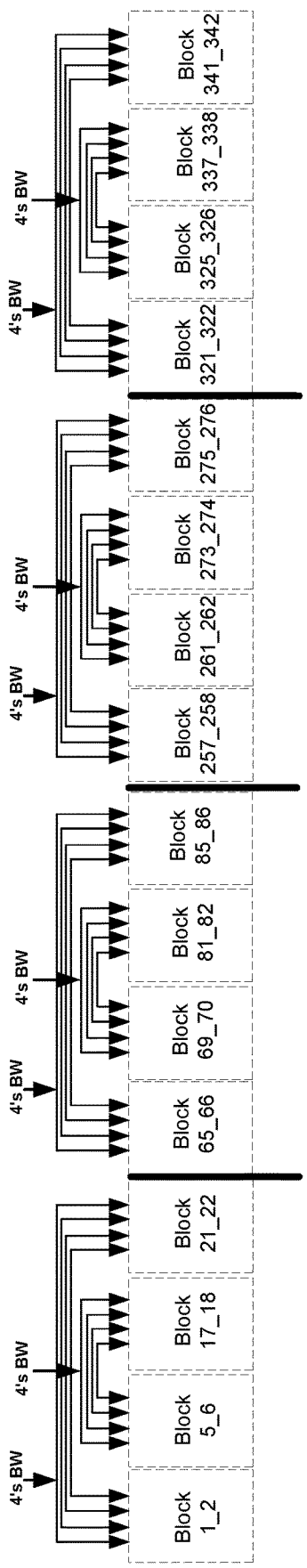
FIG. 3A
FIG. 3B

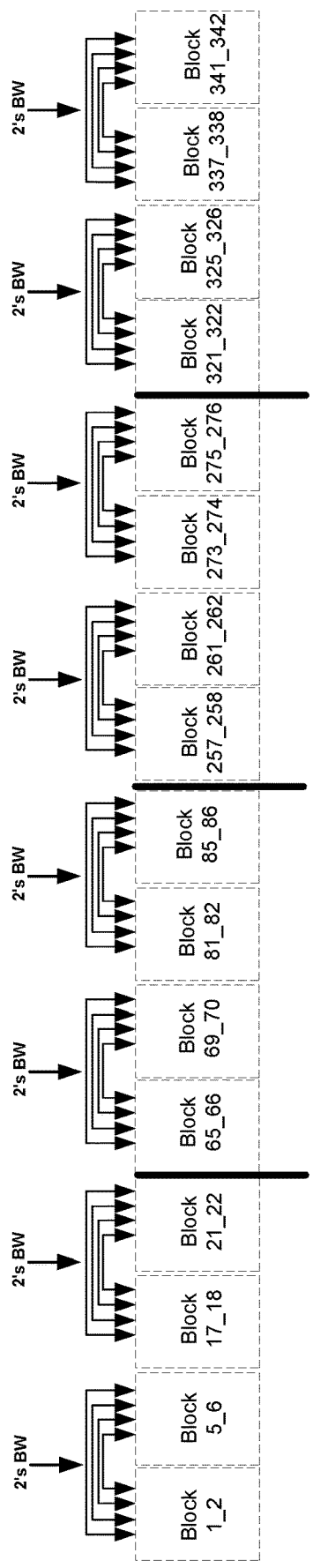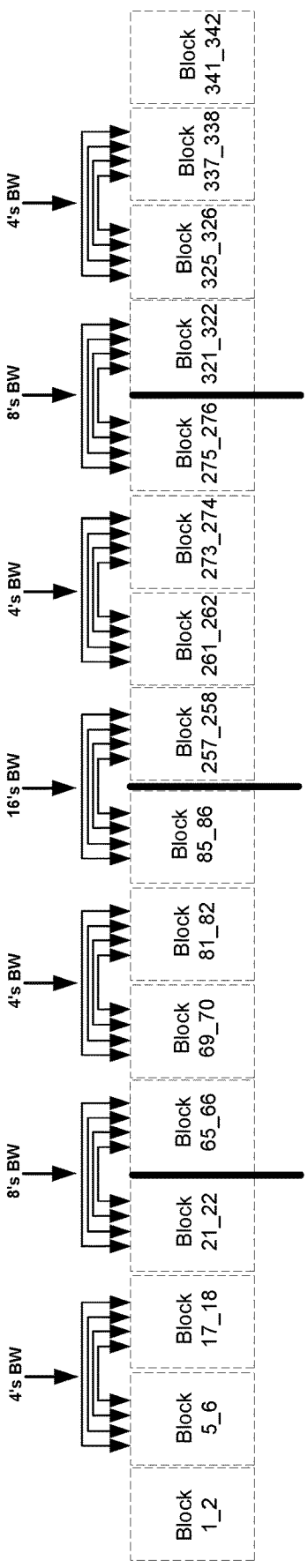

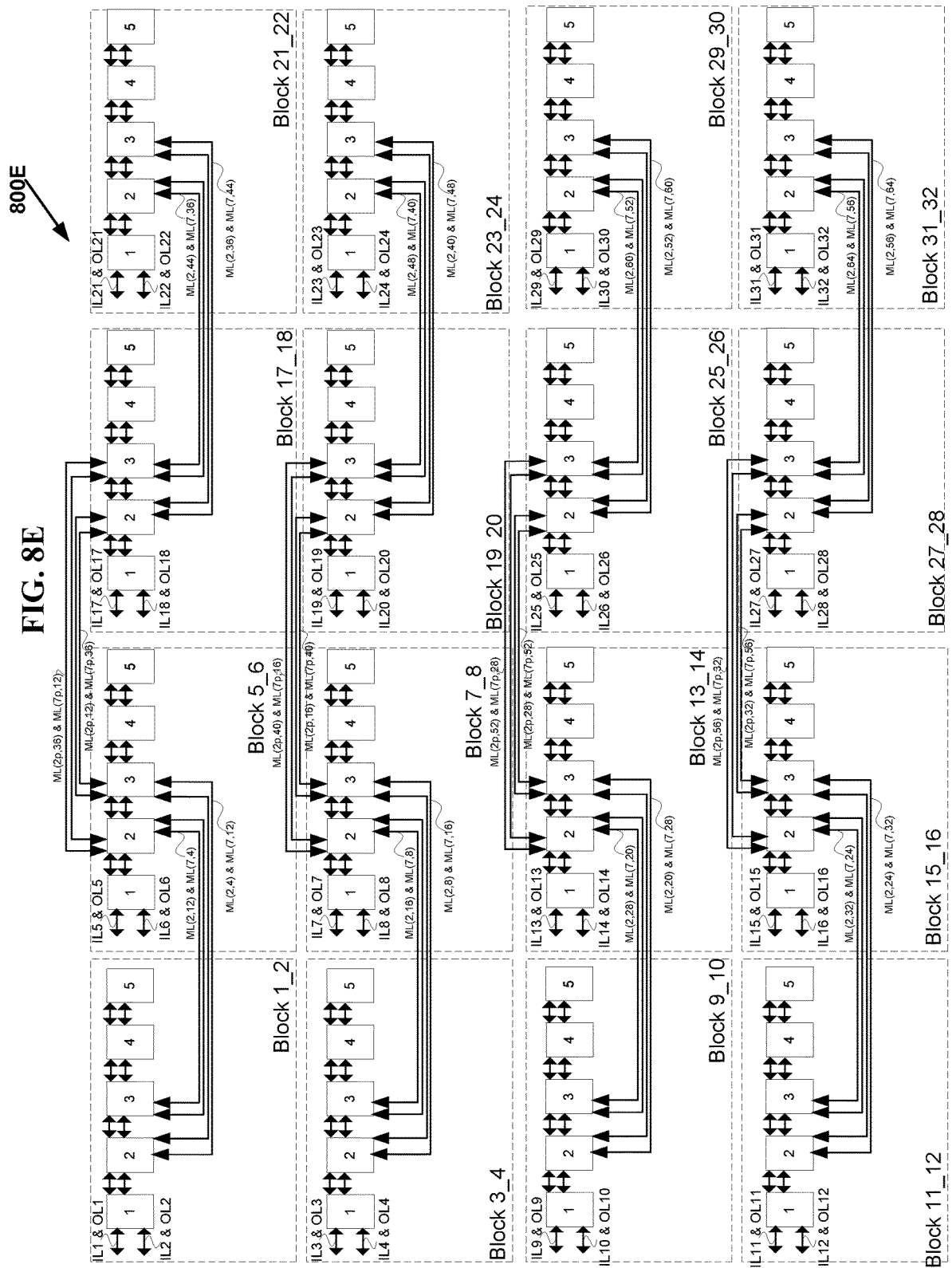

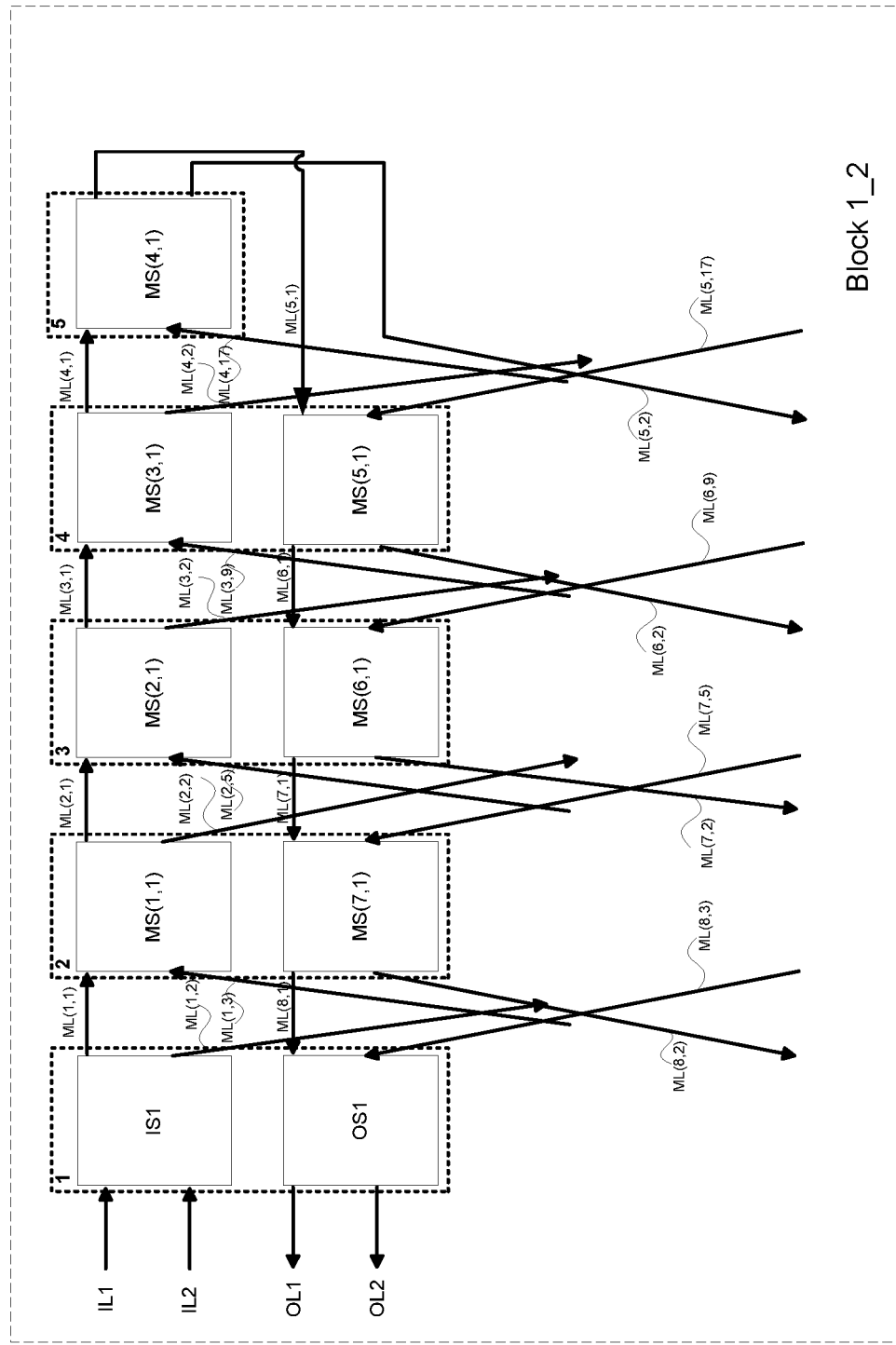
FIG. 8K1

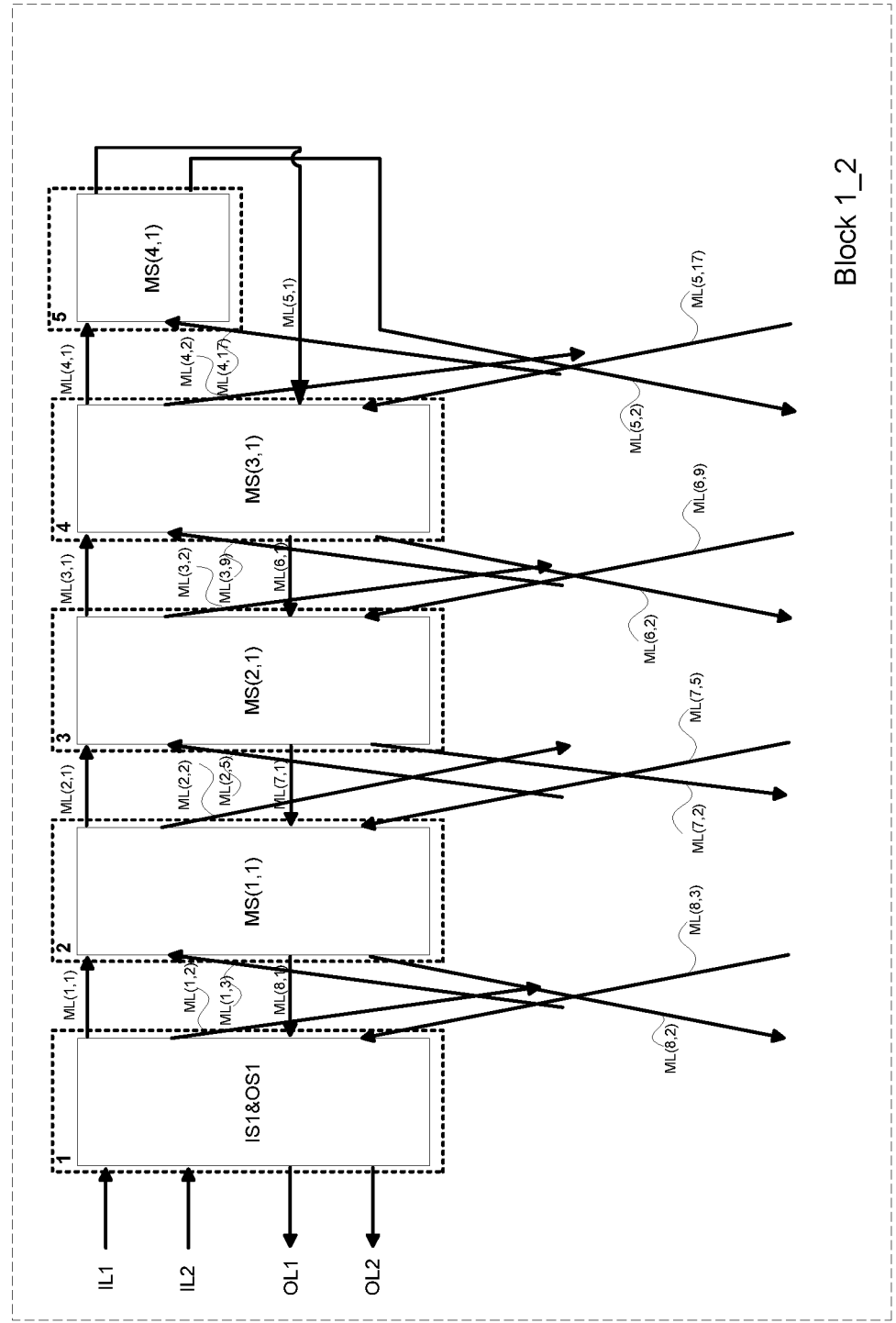
FIG. 8L1

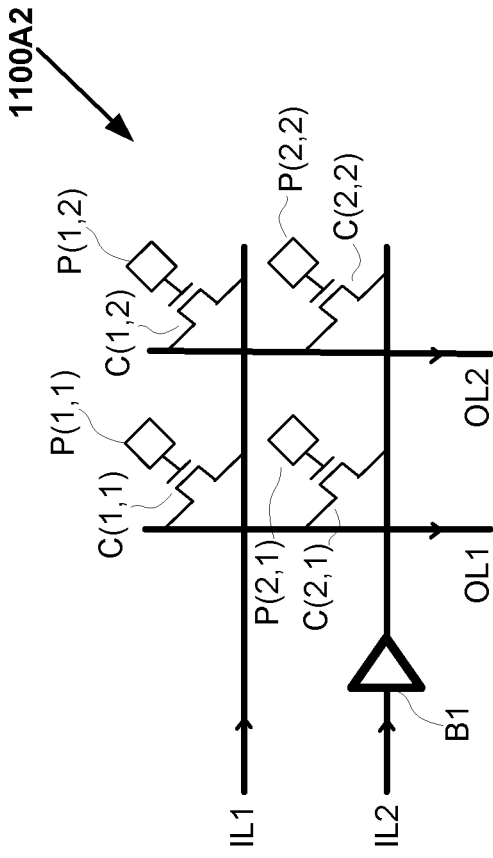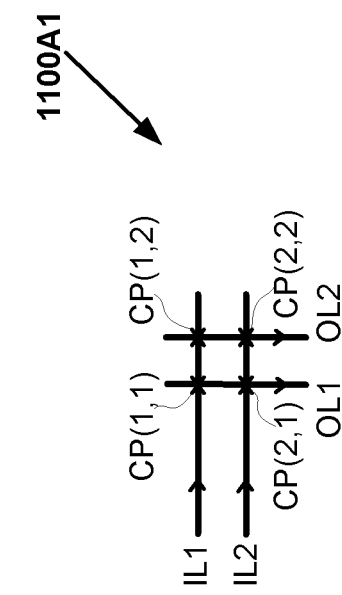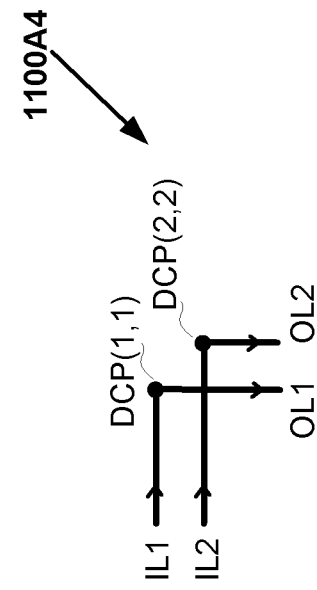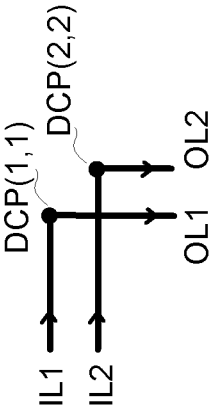
FIG. 11A2 (Prior Art)
FIG. 11A4
FIG. 11A1 (Prior Art)
FIG. 11A3 (Prior Art)

VLSI LAYOUTS OF FULLY CONNECTED GENERALIZED AND PYRAMID NETWORKS WITH LOCALITY EXPLOITATION

CROSS REFERENCE TO RELATED APPLICATIONS

This is a Continuation Application and claims priority of U.S. patent application Ser. No. 15/351,453 entitled "VLSI LAYOUTS OF FULLY CONNECTED GENERALIZED AND PYRAMID NETWORKS WITH LOCALITY EXPLOITATION" by Venkat Konda assigned to the same assignee as the current application and filed Nov. 15, 2016, which in turn is a Continuation Application and claims priority of U.S. Pat. No. 9,529,958 entitled "VLSI LAYOUTS OF FULLY CONNECTED GENERALIZED AND PYRAMID NETWORKS WITH LOCALITY EXPLOITATION" by Venkat Konda assigned to the same assignee as the current application and issued Dec. 27, 2016, which in turn is a Continuation Application and claims priority of U.S. Pat. No. 8,898,611 entitled "VLSI LAYOUTS OF FULLY CONNECTED GENERALIZED AND PYRAMID NETWORKS WITH LOCALITY EXPLOITATION" by Venkat Konda assigned to the same assignee as the current application and issued Nov. 25, 2014, which in turn is national stage entry application and claims priority to the PCT Application Serial No. PCT/US10/52984 entitled "VLSI LAYOUTS OF FULLY CONNECTED GENERALIZED AND PYRAMID NETWORKS WITH LOCALITY EXPLOITATION" by Venkat Konda assigned to the same assignee as the current application, filed Oct. 16, 2010, and which in turn claims priority to the U.S. Provisional Patent Application Ser. No. 61/252,603 entitled "VLSI LAYOUTS OF FULLY CONNECTED NETWORKS WITH LOCALITY EXPLOITATION" by Venkat Konda assigned to the same assignee as the current application, filed Oct. 16, 2009, and the U.S. Provisional Patent Application Ser. No. 61/252,609 entitled "VLSI LAYOUTS OF FULLY CONNECTED GENERALIZED AND PYRAMID NETWORKS" by Venkat Konda assigned to the same assignee as the current application, filed Oct. 16, 2009.

This application is related to and incorporates by reference in its entirety the U.S. Pat. No. 8,270,400 entitled "FULLY CONNECTED GENERALIZED MULTI-STAGE NETWORKS" by Venkat Konda assigned to the same assignee as the current application, issued Sep. 18, 2012, the U.S. Provisional Patent Application Ser. No. 60/905,526 entitled "LARGE SCALE CROSSPOINT REDUCTION WITH NONBLOCKING UNICAST & MULTICAST IN ARBITRARILY LARGE MULTI-STAGE NETWORKS" by Venkat Konda assigned to the same assignee as the current application, filed Mar. 6, 2007, and the U.S. Provisional Patent Application Ser. No. 60/940,383 entitled "FULLY CONNECTED GENERALIZED MULTI-STAGE NETWORKS" by Venkat Konda assigned to the same assignee as the current application, filed May 25, 2007.

This application is related to and incorporates by reference in its entirety the U.S. Pat. No. 8,170,040 entitled "FULLY CONNECTED GENERALIZED BUTTERFLY FAT TREE NETWORKS" by Venkat Konda assigned to the same assignee as the current application, issued May 1, 2012, the U.S. Provisional Patent Application Ser. No. 60/940,387 entitled "FULLY CONNECTED GENERALIZED BUTTERFLY FAT TREE NETWORKS" by Venkat Konda assigned to the same assignee as the current application, filed May 25, 2007, and the U.S. Provisional Patent Application Ser. No. 60/940,390 entitled "FULLY CONNECTED GENERALIZED MULTI-LINK BUTTERFLY FAT TREE NETWORKS" by Venkat Konda assigned to the same assignee as the current application, filed May 25, 2007

This application is related to and incorporates by reference in its entirety the U.S. Pat. No. 8,363,649 entitled "FULLY CONNECTED GENERALIZED MULTI-LINK MULTI-STAGE NETWORKS" by Venkat Konda assigned to the same assignee as the current application, issued Jan. 29, 2013, the U.S. Provisional Patent Application Ser. No. 60/940,389 entitled "FULLY CONNECTED GENERALIZED REARRANGEABLY NONBLOCKING MULTI-LINK MULTI-STAGE NETWORKS" by Venkat Konda assigned to the same assignee as the current application, filed May 25, 2007, the U.S. Provisional Patent Application Ser. No. 60/940,391 entitled "FULLY CONNECTED GENERALIZED FOLDED MULTI-STAGE NETWORKS" by Venkat Konda assigned to the same assignee as the current application, filed May 25, 2007 and the U.S. Provisional Patent Application Ser. No. 60/940,392 entitled "FULLY CONNECTED GENERALIZED STRICTLY NONBLOCKING MULTI-LINK MULTI-STAGE NETWORKS" by Venkat Konda assigned to the same assignee as the current application, filed May 25, 2007.

BACKGROUND OF INVENTION

Multi-stage interconnection networks such as Benes networks and butterfly fat tree networks are widely useful in telecommunications, parallel and distributed computing. However VLSI layouts, known in the prior art, of these interconnection networks in an integrated circuit are inefficient and complicated.

Other multi-stage interconnection networks including butterfly fat tree networks, Banyan networks, Batcher-Banyan networks, Baseline networks, Delta networks, Omega networks and Flip networks have been widely studied particularly for self routing packet switching applications. Also Benes Networks with radix of two have been widely studied and it is known that Benes Networks of radix two are shown to be built with back to back baseline networks which are rearrangeably nonblocking for unicast connections.

The most commonly used VLSI layout in an integrated circuit is based on a two-dimensional grid model comprising only horizontal and vertical tracks. An intuitive interconnection network that utilizes two-dimensional grid model is 2D Mesh Network and its variations such as segmented mesh networks. Hence routing networks used in VLSI layouts are typically 2D mesh networks and its variations. However Mesh Networks require large scale cross points typically with a growth rate of $O(N^2)$ where N is the number of computing elements, ports, or logic elements depending on the application.

Multi-stage interconnection network with a growth rate of $O(N \times \log N)$ requires significantly small number of cross points. U.S. Pat. No. 6,185,220 entitled "Grid Layouts of Switching and Sorting Networks" granted to Muthukrishnan et al. describes a VLSI layout using existing VLSI grid model for Benes and Butterfly networks. U.S. Pat. No. 6,940,308 entitled "Interconnection Network for a Field Programmable Gate Array" granted to Wong describes a VLSI layout where switches belonging to lower stage of Benes Network are layed out close to the logic cells and switches belonging to higher stages are layed out towards the center of the layout.

Due to the inefficient and in some cases impractical VLSI layout of Benes and butterfly fat tree networks on a semiconductor chip, today mesh networks and segmented mesh networks are widely used in the practical applications such as field programmable gate arrays (FPGAs), programmable logic devices (PLDs), and parallel computing interconnects. The prior art VLSI layouts of Benes and butterfly fat tree networks and VLSI layouts of mesh networks and segmented mesh networks require large area to implement the switches on the chip, large number of wires, longer wires, with increased power consumption, increased latency of the signals which effect the maximum clock speed of operation. Some networks may not even be implemented practically on a chip due to the lack of efficient layouts.

SUMMARY OF INVENTION

When large scale sub-integrated circuit blocks with inlet and outlet links are layed out in an integrated circuit device in a two-dimensional grid arrangement, (for example in an FPGA where the sub-integrated circuit blocks are Lookup Tables) the most intuitive routing network is a network that uses horizontal and vertical links only (the most often used such a network is one of the variations of a 2D Mesh network). A direct embedding of a generalized multi-stage network on to a 2D Mesh network is neither simple nor efficient.

In accordance with the invention, VLSI layouts of generalized multi-stage and pyramid networks for broadcast, unicast and multicast connections are presented using only horizontal and vertical links with spacial locality exploitation. The VLSI layouts employ shuffle exchange links where outlet links of cross links from switches in a stage in one sub-integrated circuit block are connected to inlet links of switches in the succeeding stage in another sub-integrated circuit block so that said cross links are either vertical links or horizontal and vice versa. Furthermore the shuffle exchange links are employed between different sub-integrated circuit blocks so that spacially nearer sub-integrated circuit blocks are connected with shorter links compared to the shuffle exchange links between spacially farther sub-integrated circuit blocks. In one embodiment the sub-integrated circuit blocks are arranged in a hypercube arrangement in a two-dimensional plane. The VLSI layouts exploit the benefits of significantly lower cross points, lower signal latency, lower power and full connectivity with significantly fast compilation.

The VLSI layouts with spacial locality exploitation presented are applicable to generalized multi-stage and pyramid networks $V(N_1,N_2,d,s)$ & $V_p(N_1,N_2,d,s)$, generalized folded multi-stage and pyramid networks $V_{fold}(N_1,N_2,d,s)$ & $V_{fold-p}(N_1,N_2,d,s)$, generalized butterfly fat tree and butterfly fat pyramid networks $V_{bft}(N_1,N_2,d,s)$ & $V_{bfp}(N_1,N_2,d,s)$, generalized multi-link multi-stage and pyramid networks $V_{mlink}(N_1,N_2,d,s)$ & $V_{mlink-p}(N_1,N_2,d,s)$, generalized folded multi-link multi-stage and pyramid networks $V_{fold-mlink}(N_1,N_2,d,s)$ & $V_{fold-mlink-p}(N_1,N_2,d,s)$, generalized multi-link butterfly fat tree and butterfly fat pyramid networks $V_{mlink-bft}(N_1,N_2,d,s)$ & $V_{mlink-bfp}(N_1,N_2,d,s)$, generalized hypercube networks $V_{hcube}(N_1,N_2,d,s)$, and generalized cube connected cycles networks $V_{CCC}(N_1,N_2,d,s)$ for s=1, 2, 3 or any number in general. The embodiments of VLSI layouts are useful in wide target applications such as FPGAs, CPLDs, pSoCs, ASIC placement and route tools, networking applications, parallel & distributed computing, and reconfigurable computing.

BRIEF DESCRIPTION OF DRAWINGS

FIG. 1K1 is a diagram 100M1 detailed connections of BLOCK 1_2 in the network layout 100C in one embodiment, illustrating the connection links going in and coming out when the layout 100C is implementing $V(N,d,s)$ or $V_{fold}(N,d,s)$ for s=1.

FIG. 1L1 is a diagram 100L1 detailed connections of BLOCK 1_2 in the network layout 100C in one embodiment, illustrating the connection links going in and coming out when the layout 100C is implementing $V_{bft}(N,d,s)$ for s=1.

FIG. 2G is a diagram 200G layout of the network $V_{fold-mlink}(N,d,s)$ shown in FIG. 2B, in one embodiment, illustrating the connection links $ML(4,i)$ for i=[1, 64] and $ML(5,i)$ for i=[1,64].

FIG. 3A is a diagram 300A layout of the topmost row of the network $V_{fold-mlink}(N,d,s)$ with N=512, d=2 and s=2, in one embodiment, illustrating the provisioning of 2's BW.

FIG. 3B is a diagram 300B layout of the topmost row of the network $V_{fold-mlink}(N,d,s)$ with N=512, d=2 and s=2, in one embodiment, illustrating the provisioning of 4's BW.

FIG. 4A is a diagram 400A layout of the topmost row of the network $V_{fold-mlink}(N,d,s)$ with N=512, d=2 and s=2, in one embodiment, illustrating the provisioning of 2's BW in first stage.

FIG. 4B is a diagram 400B layout of the topmost row of the network $V_{fold-mlink}(N,d,s)$ with N=512, d=2 and s=2, in one embodiment, illustrating the remaining nearest neighbor connectivity in the second stage by provisioning 4's BW, 8's BW etc.

FIG. 8E is a diagram 800E layout of the network $V_{fold-mlink-p}(N,d,s)$ shown in FIG. 8B, in one embodiment, illustrating the connection links $ML(2,i)$ for i=[1, 64] and $ML(7,i)$ for i=[1,64].

FIG. 8K1 is a diagram 800M1 detailed connections of BLOCK 1_2 in the network layout 800C in one embodiment, illustrating the connection links going in and coming out when the layout 800C is implementing $V_p(N,d,s)$ or $V_{fold-p}(N,d,s)$ for s=1.

FIG. 8L1 is a diagram 800L1 detailed connections of BLOCK 1_2 in the network layout 800C in one embodiment, illustrating the connection links going in and coming out when the layout 800C is implementing $V_{bfp}(N,d,s)$ for s=1.

FIG. 11A1 is a diagram 1100A1 of an exemplary prior art implementation of a two by two switch; FIG. 11A2 is a diagram 1100A2 for programmable integrated circuit prior art implementation of the diagram 1100A1 of FIG. 11A1; FIG. 11A3 is a diagram 1100A3 for one-time programmable integrated circuit prior art implementation of the diagram 1100A1 of FIG. 11A1; FIG. 11A4 is a diagram 1100A4 for integrated circuit placement and route implementation of the diagram 1100A1 of FIG. 11A1.

DETAILED DESCRIPTION OF THE INVENTION

Figure 1A:
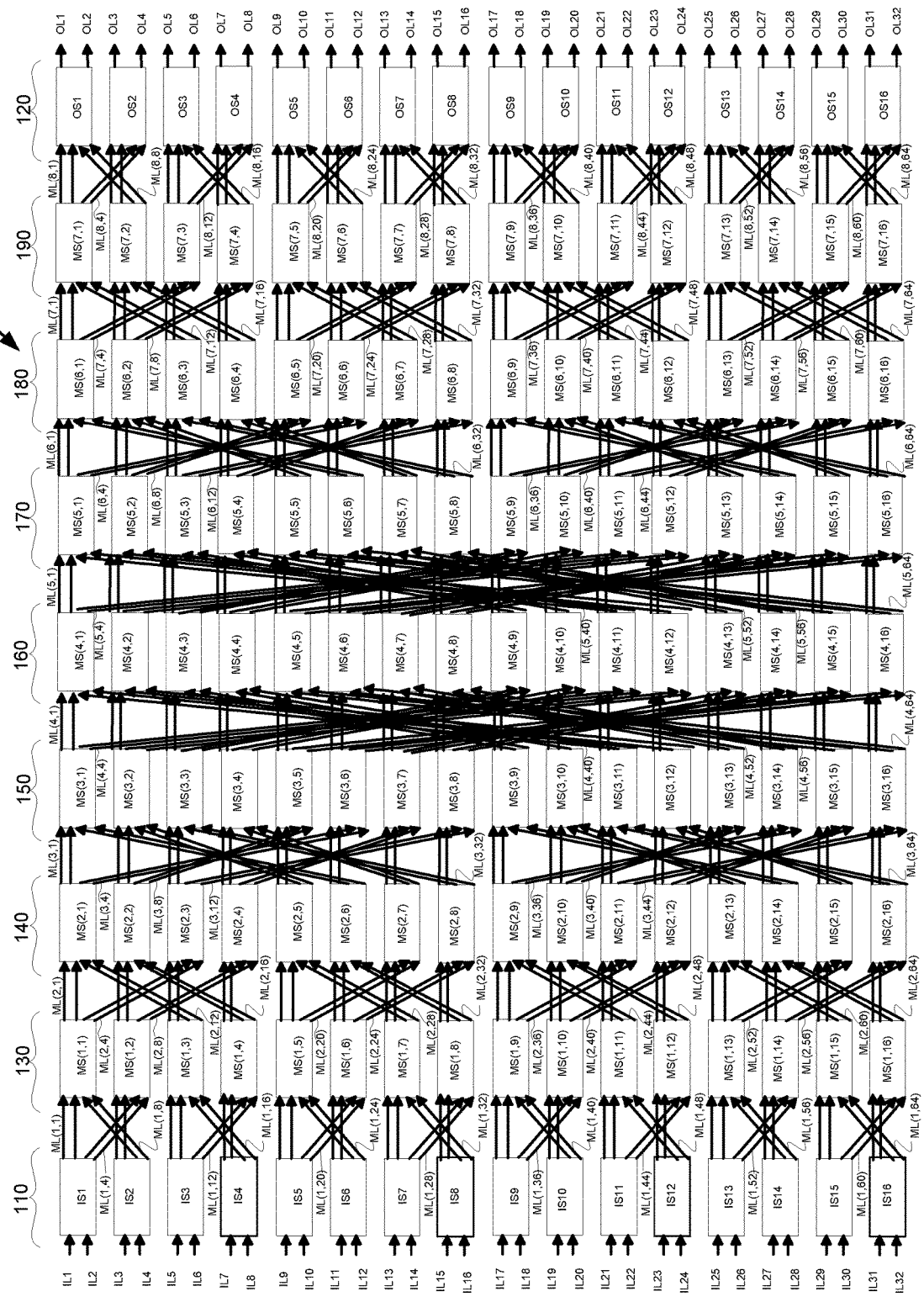
FIG. 1A is a diagram 100A of an exemplary symmetrical multi-link multi-stage network $V_{fold-mlink}(N,d,s)$ having a variation of inverse Benes connection topology of nine stages with N=32, d=2 and s=2, strictly nonblocking network for unicast connections and rearrangeably nonblocking network for arbitrary fan-out multicast connections, in accordance with the invention.

The present invention is concerned with the VLSI layouts of arbitrarily large switching networks for broadcast, unicast and multicast connections. Particularly switching networks considered in the current invention include: generalized multi-stage networks $V(N_1,N_2,d,s)$, generalized folded multi-stage networks $V_{fold}(N_1,N_2,d,s)$, generalized butterfly fat tree networks $V_{bft}(N_1,N_2,d,s)$, generalized multi-link multi-stage networks $V_{mlink}(N_1,N_2,d,s)$, generalized folded multi-link multi-stage networks $V_{fold-mlink}(N_1,N_2,d,s)$, generalized multi-link butterfly fat tree networks $V_{mlink-bft}(N_1,N_2,d,s)$, generalized hypercube networks $V_{hcube}(N_1,N_2,d,s)$, and generalized cube connected cycles networks $V_{CCC}(N_1,N_2,d,s)$ for s=1, 2, 3 or any number in general.

Efficient VLSI layout of networks on a semiconductor chip are very important and greatly influence many important design parameters such as the area taken up by the network on the chip, total number of wires, length of the wires, latency of the signals, capacitance and hence the maximum clock speed of operation. Some networks may not even be implemented practically on a chip due to the lack of efficient layouts. The different varieties of multi-stage networks described above have not been implemented previously on the semiconductor chips efficiently. For example in Field Programmable Gate Array (FPGA) designs, multi-stage networks described in the current invention have not been successfully implemented primarily due to the lack of efficient VLSI layouts. Current commercial FPGA products such as Xilinx Vertex, Altera's Stratix implement island-style architecture using mesh and segmented mesh routing interconnects using either full crossbars or sparse crossbars. These routing interconnects consume large silicon area for crosspoints, long wires, large signal propagation delay and hence consume lot of power.

The current invention discloses the VLSI layouts of numerous types of multi-stage and pyramid networks which are very efficient and exploit spacial locality in the connectivity. Moreover they can be embedded on to mesh and segmented mesh routing interconnects of current commercial FPGA products. The VLSI layouts disclosed in the current invention are applicable to including the numerous generalized multi-stage networks disclosed in the following patent applications:

1) Strictly and rearrangeably nonblocking for arbitrary fan-out multicast and unicast for generalized multi-stage networks $V(N_1,N_2,d,s)$ with numerous connection topologies and the scheduling methods are described in detail in the U.S. application Ser. No. 12/530,207 that is incorporated by reference above.

2) Strictly and rearrangeably nonblocking for arbitrary fan-out multicast and unicast for generalized butterfly fat tree networks $V_{bft}(N_1,N_2,d,s)$ with numerous connection topologies and the scheduling methods are described in detail in the U.S. application Ser. No. 12/601,273 that is incorporated by reference above.

3) Rearrangeably nonblocking for arbitrary fan-out multicast and unicast, and strictly nonblocking for unicast for generalized multi-link multi-stage networks $V_{mlink}(N_1,N_2,d,s)$ and generalized folded multi-link multi-stage networks $V_{fold-mlink}(N_1,N_2,d,s)$ with numerous connection topologies and the scheduling methods are described in detail in the U.S. application Ser. No. 12/601,274 that is incorporated by reference above.

4) Strictly and rearrangeably nonblocking for arbitrary fan-out multicast and unicast for generalized multi-link butterfly fat tree networks $V_{mlink-bft}(N_1,N_2,d,s)$ with numerous connection topologies and the scheduling methods are described in detail in the U.S. application Ser. No. 12/601,273 that is incorporated by reference above.

5) Strictly and rearrangeably nonblocking for arbitrary fan-out multicast and unicast for generalized folded multi-stage networks $V_{fold}(N_1,N_2,d,s)$ with numerous connection topologies and the scheduling methods are described in detail in the U.S. application Ser. No. 12/601,274 that is incorporated by reference above.

6) Strictly nonblocking for arbitrary fan-out multicast and unicast for generalized multi-link multi-stage networks $V_{mlink}(N_1,N_2,d,s)$ and generalized folded multi-link multi-stage networks $V_{fold-mlink}(N_1,N_2,d,s)$ with numerous connection topologies and the scheduling methods are described in detail in the U.S. application Ser. No. 12/601,274 that is incorporated by reference above.

7) VLSI layouts of numerous types of multi-stage networks are described in the U.S. application Ser. No. 12/601,275 entitled "VLSI LAYOUTS OF FULLY CONNECTED NETWORKS" that is incorporated by reference above.

In addition the layouts of the current invention are also applicable to generalized multi-stage pyramid networks $V_p(N_1,N_2,d,s)$, generalized folded multi-stage pyramid networks $V_{fold-p}(N_1,N_2,d,s)$, generalized butterfly fat pyramid networks $V_{bfp}(N_1,N_2,d,s)$, generalized multi-link multi-stage pyramid networks $V_{mlink-p}(N_1,N_2,d,s)$, generalized folded multi-link multi-stage pyramid networks $V_{fold-mlink-p}(N_1,N_2,d,s)$, generalized multi-link butterfly fat pyramid networks $V_{mlink-bfp}(N_1,N_2,d,s)$, generalized hypercube networks $V_{hcube}(N_1,N_2,d,s)$ and generalized cube connected cycles networks $V_{CCC}(N_1,N_2,d,s)$ for s=1, 2, 3 or any number in general.

Symmetric RNB Generalized Multi-Link Multi-Stage Network $V_{mlink}(N_1,N_2,d,s)$, Connection Topology: Nearest Neighbor Connectivity and with Full Bandwidth:

Referring to diagram 100A in FIG. 1A, in one embodiment, an exemplary generalized multi-link multi-stage network $V_{mlink}(N_1,N_2,d,s)$ where $N_1=N_2=32$; $d=2$; and $s=2$ with nine stages of one hundred and forty four switches for satisfying communication requests, such as setting up a telephone call or a data call, or a connection between configurable logic blocks, between an input stage 110 and output stage 120 via middle stages 130, 140, 150, 160, 170, 180 and 190 is shown where input stage 110 consists of sixteen, two by four switches IS1-IS16 and output stage 120 consists of sixteen, four by two switches OS1-OS16. And all the middle stages namely the middle stage 130 consists of sixteen, four by four switches MS(1,1)-MS(1,16), middle stage 140 consists of sixteen, four by four switches MS(2,1)-MS(2,16), middle stage 150 consists of sixteen, four by four switches MS(3,1)-MS(3,16), middle stage 160 consists of sixteen, four by four switches MS(4,1)-MS(4,16), middle stage 170 consists of sixteen, four by four switches MS(5,1)-MS(5,16), middle stage 180 consists of sixteen, four by four switches MS(6,1)-MS(6,16), and middle stage 190 consists of sixteen, four by four switches MS(7,1)-MS(7,16).

As disclosed in U.S. Provisional Patent Application Ser. No. 60/940,389 that is incorporated by reference above, such a network can be operated in rearrangeably non-blocking manner for arbitrary fan-out multicast connections and also can be operated in strictly non-blocking manner for unicast connections.

In one embodiment of this network each of the input switches IS1-IS16 and output switches OS1-OS16 are crossbar switches. The number of switches of input stage 110 and of output stage 120 can be denoted in general with the variable $$\frac{N}{d},$$

where N is the total number of inlet links or outlet links. The number of middle switches in each middle stage is denoted by $$\frac{N}{d}.$$

The size of each input switch IS1-IS16 can be denoted in general with the notation d*2d and each output switch OS1-OS16 can be denoted in general with the notation 2d*d. Likewise, the size of each switch in any of the middle stages can be denoted as 2d*2d. A switch as used herein can be either a crossbar switch, or a network of switches each of which in turn may be a crossbar switch or a network of switches. A symmetric multi-stage network can be represented with the notation $V_{mlink}(N,d,s)$, where N represents the total number of inlet links of all input switches (for example the links IL1-IL32), d represents the inlet links of each input switch or outlet links of each output switch, and s is the ratio of number of outgoing links from each input switch to the inlet links of each input switch.

Each of the $$\frac{N}{d}$$

input switches IS1-IS16 are connected to exactly d switches in middle stage 130 through two links each for a total of 2×d links (for example input switch IS1 is connected to middle switch MS(1,1) through the middle links ML(1,1), ML(1,2), and also connected to middle switch MS(1,2) through the middle links ML(1,3) and ML(1,4)). The middle links which connect switches in the same row in two successive middle stages are called hereinafter straight middle links; and the middle links which connect switches in different rows in two successive middle stages are called hereinafter cross middle links. For example, the middle links ML(1,1) and ML(1,2) connect input switch IS1 and middle switch MS(1,1), so middle links ML(1,1) and ML(1,2) are straight middle links; where as the middle links ML(1,3) and ML(1,4) connect input switch IS1 and middle switch MS(1,2), since input switch IS1 and middle switch MS(1,2) belong to two different rows in diagram 100A of FIG. 1A, middle links ML(1,3) and ML(1,4) are cross middle links.

Each of the $$\frac{N}{d}$$

middle switches MS(1,1)-MS(1,16) in the middle stage 130 are connected from exactly d input switches through two links each for a total of 2×d links (for example the middle links ML(1,1) and ML(1,2) are connected to the middle switch MS(1,1) from input switch IS1, and the middle links ML(1,7) and ML(1,8) are connected to the middle switch MS(1,1) from input switch IS2) and also are connected to exactly d switches in middle stage 140 through two links each for a total of 2×d links (for example the middle links ML(2,1) and ML(2,2) are connected from middle switch MS(1,1) to middle switch MS(2,1), and the middle links ML(2,3) and ML(2,4) are connected from middle switch MS(1,1) to middle switch MS(2,3)).

Each of the $$\frac{N}{d}$$

middle switches MS(2,1)-MS(2,16) in the middle stage 140 are connected from exactly d middle switches in middle stage 130 through two links each for a total of 2×d links (for example the middle links ML(2,1) and ML(2,2) are connected to the middle switch MS(2,1) from input switch MS(1,1), and the middle links ML(1,11) and ML(1,12) are connected to the middle switch MS(2,1) from input switch MS(1,3)) and also are connected to exactly d switches in middle stage 150 through two links each for a total of 2×d links (for example the middle links ML(3,1) and ML(3,2) are connected from middle switch MS(2,1) to middle switch MS(3,1), and the middle links ML(3,3) and ML(3,4) are connected from middle switch MS(2,1) to middle switch MS(3,6)).

Applicant notes that the topology of connections between middle switches MS(2,1)-MS(2,16) in the middle stage 140 and middle switches MS(3,1)-MS(3,16) in the middle stage 150 is not the typical inverse Benes topology but the connectivity of the generalized multi-link multi-stage network $V_{mlink}(N_1,N_2,d,s)$ 100A shown in FIG. 1A is effectively the same, or alternatively the network 100A shown in FIG. 1A is topologically equivalent to the network with inverse Benes network topology. However as will be described later in layouts of FIG. 1C-FIG. 1G, the length of the connection from a given inlet link to its destination outlet links may consist of different route resulting in different latency and different power dissipation for a given multicast or unicast assignment. As will be described later in the layouts of FIG. 1C-FIG. 1G, the connection topology of middle links between middle stages 140 and 150 is in such a way that nearest neighbor blocks are connected directly and then the rest of the blocks are connected in inverse Benes topology.

Each of the $$\frac{N}{d}$$

middle switches MS(3,1)-MS(3,16) in the middle stage 150 are connected from exactly d middle switches in middle stage 140 through two links each for a total of 2×d links (for example the middle links ML(3,1) and ML(3,2) are connected to the middle switch MS(3,1) from input switch MS(2,1), and the middle links ML(2,23) and ML(2,24) are connected to the middle switch MS(3,1) from input switch MS(2,6)) and also are connected to exactly d switches in middle stage 160 through two links each for a total of 2×d links (for example the middle links ML(4,1) and ML(4,2) are connected from middle switch MS(3,1) to middle switch MS(4,1), and the middle links ML(4,3) and ML(4,4) are connected from middle switch MS(3,1) to middle switch MS(4,11)).

Applicant notes that the topology of connections between middle switches MS(3,1)-MS(3,16) in the middle stage 150 and middle switches MS(4,1)-MS(4,16) in the middle stage 160 is not the typical inverse Benes topology but the connectivity of the generalized multi-link multi-stage network $V_{mlink}(N_1,N_2,d,s)$ 100A shown in FIG. 1A is effectively the same, or alternatively the network 100A shown in FIG. 1A is topologically equivalent to the network with inverse Benes network topology. However as will be described later in layouts of FIG. 1C-FIG. 1G, the length of the connection from a given inlet link to its destination outlet links may consist of different route resulting in different latency and different power dissipation for a given multicast or unicast assignment. As will be described later in the layouts of FIG. 1C-FIG. 1G, the connection topology of middle links between middle stages 150 and 160 is in such a way that nearest neighbor blocks are connected directly and then the rest of the blocks are connected in inverse Benes topology.

Each of the $$\frac{N}{d}$$

middle switches MS(4,1)-MS(4,16) in the middle stage 160 are connected from exactly d middle switches in middle stage 150 through two links each for a total of 2×d links (for example the middle links ML(4,1) and ML(4,2) are connected to the middle switch MS(4,1) from input switch MS(3,1), and the middle links ML(4,43) and ML(4,44) are connected to the middle switch MS(4,1) from input switch MS(3,11)) and also are connected to exactly d switches in middle stage 170 through two links each for a total of 2×d links (for example the middle links ML(5,1) and ML(5,2) are connected from middle switch MS(4,1) to middle switch MS(5,1), and the middle links ML(5,3) and ML(5,4) are connected from middle switch MS(4,1) to middle switch MS(5,11)).

Applicant notes that the topology of connections between middle switches MS(4,1)-MS(4,16) in the middle stage 160 and middle switches MS(5,1)-MS(5,16) in the middle stage 170 is not the typical inverse Benes topology but the connectivity of the generalized multi-link multi-stage network $V_{mlink}(N_1,N_2,d,s)$ 100A shown in FIG. 1A is effectively the same or alternatively the network 100A shown in FIG. 1A is topologically equivalent to the network with inverse Benes network topology. However as will be described later in layouts of FIG. 1C-FIG. 1G, the length of the connection from a given inlet link to its destination outlet links may consist of different route resulting in different latency and different power dissipation for a given multicast or unicast assignment. As will be described later in the layouts of FIG. 1C-FIG. 1G, the connection topology of middle links between middle stages 160 and 170 is in such a way that nearest neighbor blocks are connected directly and then the rest of the blocks are connected in inverse Benes topology.

Each of the $$\frac{N}{d}$$

middle switches MS(5,1)-MS(5,16) in the middle stage 170 are connected from exactly d middle switches in middle stage 160 through two links each for a total of 2×d links (for example the middle links ML(5,1) and ML(5,2) are connected to the middle switch MS(5,1) from input switch MS(4,1), and the middle links ML(5,43) and ML(5,44) are connected to the middle switch MS(5,1) from input switch MS(4,11)) and also are connected to exactly d switches in middle stage 180 through two links each for a total of 2×d links (for example the middle links ML(6,1) and ML(6,2) are connected from middle switch MS(5,1) to middle switch MS(6,1), and the middle links ML(6,3) and ML(6,4) are connected from middle switch MS(5,1) to middle switch MS(6,6)).

Applicant notes that the topology of connections between middle switches MS(5,1)-MS(5,16) in the middle stage 170 and middle switches MS(6,1)-MS(6,16) in the middle stage 180 is not the typical inverse Benes topology but the connectivity of the generalized multi-link multi-stage network $V_{mlink}(N_1,N_2,d,s)$ 100A shown in FIG. 1A is effectively the same or alternatively the network 100A shown in FIG. 1A is topologically equivalent to the network with inverse Benes network topology. However as will be described later in layouts of FIG. 1C-FIG. 1G, the length of the connection from a given inlet link to its destination outlet links may consist of different route resulting in different latency and different power dissipation for a given multicast or unicast assignment. As will be described later in the layouts of FIG. 1C-FIG. 1G, the connection topology of middle links between middle stages 170 and 180 is in such a way that nearest neighbor blocks are connected directly and then the rest of the blocks are connected in inverse Benes topology.

Each of the $$\frac{N}{d}$$

middle switches MS(6,1)-MS(6,16) in the middle stage 180 are connected from exactly d middle switches in middle stage 170 through two links each for a total of 2×d links (for example the middle links ML(6,1) and ML(6,2) are connected to the middle switch MS(6,1) from input switch MS(5,1), and the middle links ML(6,23) and ML(6,24) are connected to the middle switch MS(6,1) from input switch MS(5,6)) and also are connected to exactly d switches in middle stage 190 through two links each for a total of 2×d links (for example the middle links ML(7,1) and ML(7,2) are connected from middle switch MS(6,1) to middle switch MS(7,1), and the middle links ML(7,3) and ML(7,4) are connected from middle switch MS(6,1) to middle switch MS(7,3)).

Each of the $$\frac{N}{d}$$

middle switches MS(7,1)-MS(7,16) in the middle stage 190 are connected from exactly d middle switches in middle stage 180 through two links each for a total of 2×d links (for example the middle links ML(7,1) and ML(7,2) are connected to the middle switch MS(7,1) from input switch MS(6,1), and the middle links ML(7,11) and ML(7,12) are connected to the middle switch MS(7,1) from input switch MS(6,3)) and also are connected to exactly d switches in middle stage 120 through two links each for a total of 2×d links (for example the middle links ML(8,1) and ML(8,2) are connected from middle switch MS(7,1) to middle switch MS(8,1), and the middle links ML(8,3) and ML(8,4) are connected from middle switch MS(7,1) to middle switch OS2).

Each of the $$\frac{N}{d}$$

middle switches OS1-OS16 in the middle stage 120 are connected from exactly d middle switches in middle stage 190 through two links each for a total of 2×d links (for example the middle links ML(8,1) and ML(8,2) are connected to the output switch OS1 from input switch MS(7,1), and the middle links ML(8,7) and ML(8,8) are connected to the output switch OS1 from input switch MS(7,2)).

Finally the connection topology of the network 100A shown in FIG. 1A is logically similar to back to back inverse Benes connection topology with nearest neighbor connections between all the middle stages starting from middle stage 140 and middle stage 180.

Figure 1B:
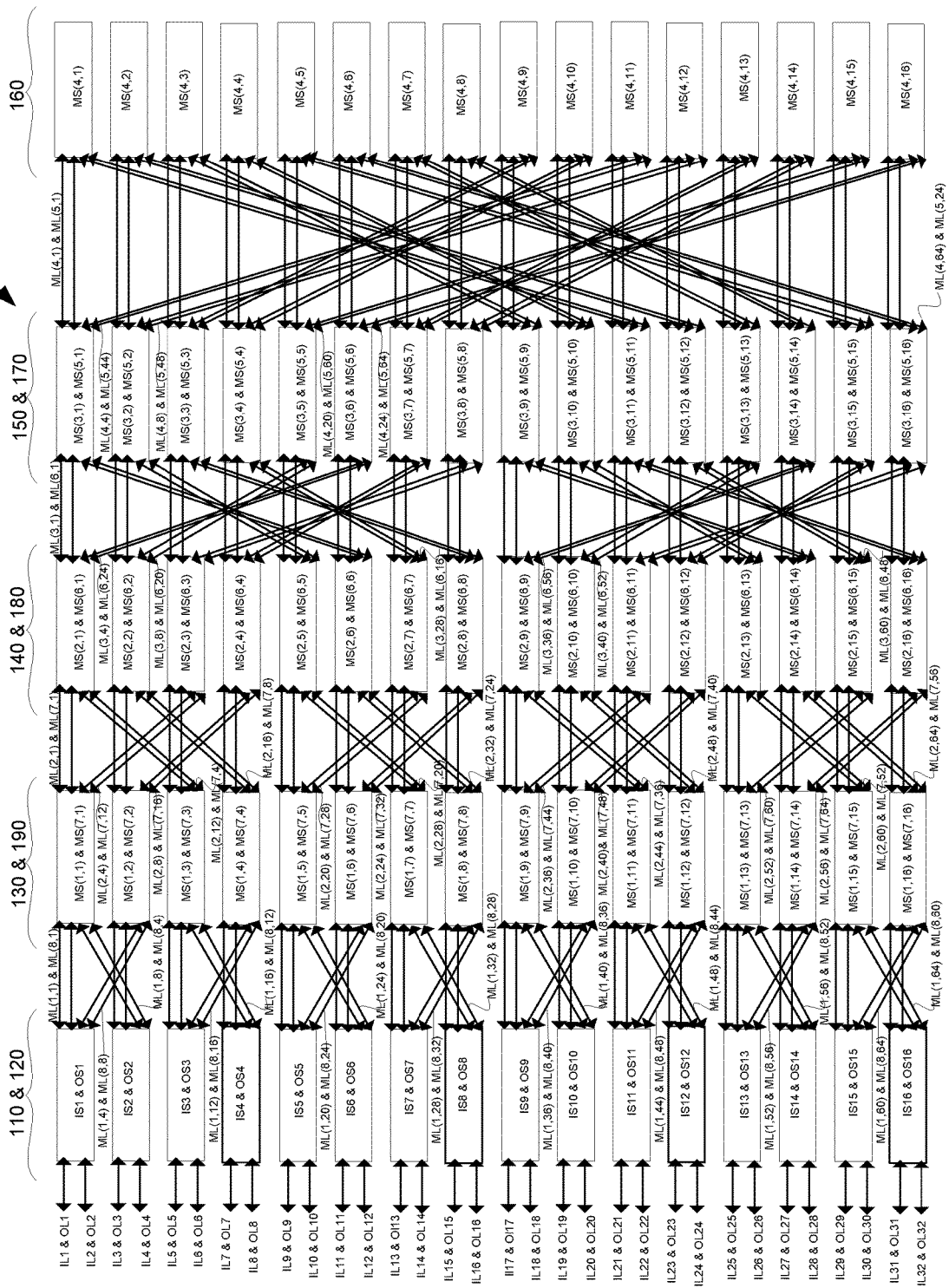
FIG. 1B is a diagram 100B of the equivalent symmetrical folded multi-link multi-stage network $V_{fold-mlink}(N,d,s)$ of the network 100A shown in FIG. 1A, having a variation of inverse Benes connection topology of five stages with N=32, d=2 and s=2, strictly nonblocking network for unicast connections and rearrangeably nonblocking network for arbitrary fan-out multicast connections, in accordance with the invention.

Referring to diagram 100B in FIG. 1B, is a folded version of the multi-link multi-stage network 100A shown in FIG. 1A. The network 100B in FIG. 1B shows input stage 110 and output stage 120 are placed together. That is input switch IS1 and output switch OS1 are placed together, input switch IS2 and output switch OS2 are placed together, and similarly input switch IS16 and output switch OS16 are placed together. All the right going links {i.e., inlet links IL1-IL32 and middle links ML(1,1)-ML(1,64)} correspond to input switches IS1-IS16, and all the left going links {i.e., middle links ML(8,1)-ML(8,64) and outlet links OL1-OL32} correspond to output switches OS1-OS16.

Middle stage 130 and middle stage 190 are placed together. That is middle switches MS(1,1) and MS(7,1) are placed together, middle switches MS(1,2) and MS(7,2) are placed together, and similarly middle switches MS(1,16) and MS(7,16) are placed together. All the right going middle links {i.e., middle links ML(1,1)-ML(1,64) and middle links ML(2,1)-ML(2,64)} correspond to middle switches MS(1,1)-MS(1,16), and all the left going middle links {i.e., middle links ML(7,1)-ML(7,64) and middle links ML(8,1) and ML(8,64)} correspond to middle switches MS(7,1)-MS(7,16).

Middle stage 140 and middle stage 180 are placed together. That is middle switches MS(2,1) and MS(6,1) are placed together, middle switches MS(2,2) and MS(6,2) are placed together, and similarly middle switches MS(2,16) and MS(6,16) are placed together. All the right going middle links {i.e., middle links ML(2,1)-ML(2,64) and middle links ML(3,1)-ML(3,64)} correspond to middle switches MS(2,1)-MS(2,16), and all the left going middle links {i.e., middle links ML(6,1)-ML(6,64) and middle links ML(7,1) and ML(7,64)} correspond to middle switches MS(6,1)-MS(6,16).

Middle stage 150 and middle stage 170 are placed together. That is middle switches MS(3,1) and MS(5,1) are placed together, middle switches MS(3,2) and MS(5,2) are placed together, and similarly middle switches MS(3,16) and MS(5,16) are placed together. All the right going middle links {i.e., middle links ML(3,1)-ML(3,64) and middle links ML(4,1)-ML(4,64)} correspond to middle switches MS(3,1)-MS(3,16), and all the left going middle links {i.e., middle links ML(5,1)-ML(5,64) and middle links ML(6,1) and ML(6,64)} correspond to middle switches MS(5,1)-MS(5,16).

Middle stage 160 is placed alone. All the right going middle links are the middle links ML(4,1)-ML(4,64) and all the left going middle links are middle links ML(5,1)-ML(5,64).

Just the same way as the connection topology of the network 100A shown in FIG. 1A, the connection topology of the network 100B shown in FIG. 1B is the folded version and logically similar to back to back inverse Benes connection topology with nearest neighbor connections between all the middle stages starting from middle stage 140 and middle stage 180.

In one embodiment, in the network 100B of FIG. 1B, the switches that are placed together are implemented as separate switches then the network 100B is the generalized folded multi-link multi-stage network $V_{fold-mlink}(N_1, N_2, d, s)$ where $N_1 = N_2 = 32$; d=2; and s=2 with nine stages as disclosed in U.S. Provisional Patent Application Ser. No. 60/940,389 that is incorporated by reference above. That is the switches that are placed together in input stage 110 and output stage 120 are implemented as a two by four switch and a four by two switch respectively. For example the input switch IS1 and output switch OS1 are placed together; so input switch IS1 is implemented as two by four switch with the inlet links IL1 and IL2 being the inputs of the input switch IS1 and middle links ML(1,1)-ML(1,4) being the outputs of the input switch IS1; and output switch OS1 is implemented as four by two switch with the middle links ML(8,1), ML(8,2), ML(8,7) and ML(8,8) being the inputs of the output switch OS1 and outlet links OL1-OL2 being the outputs of the output switch OS1. Similarly in this embodiment of network 100B all the switches that are placed together in each middle stage are implemented as separate switches.

Figure 1C:
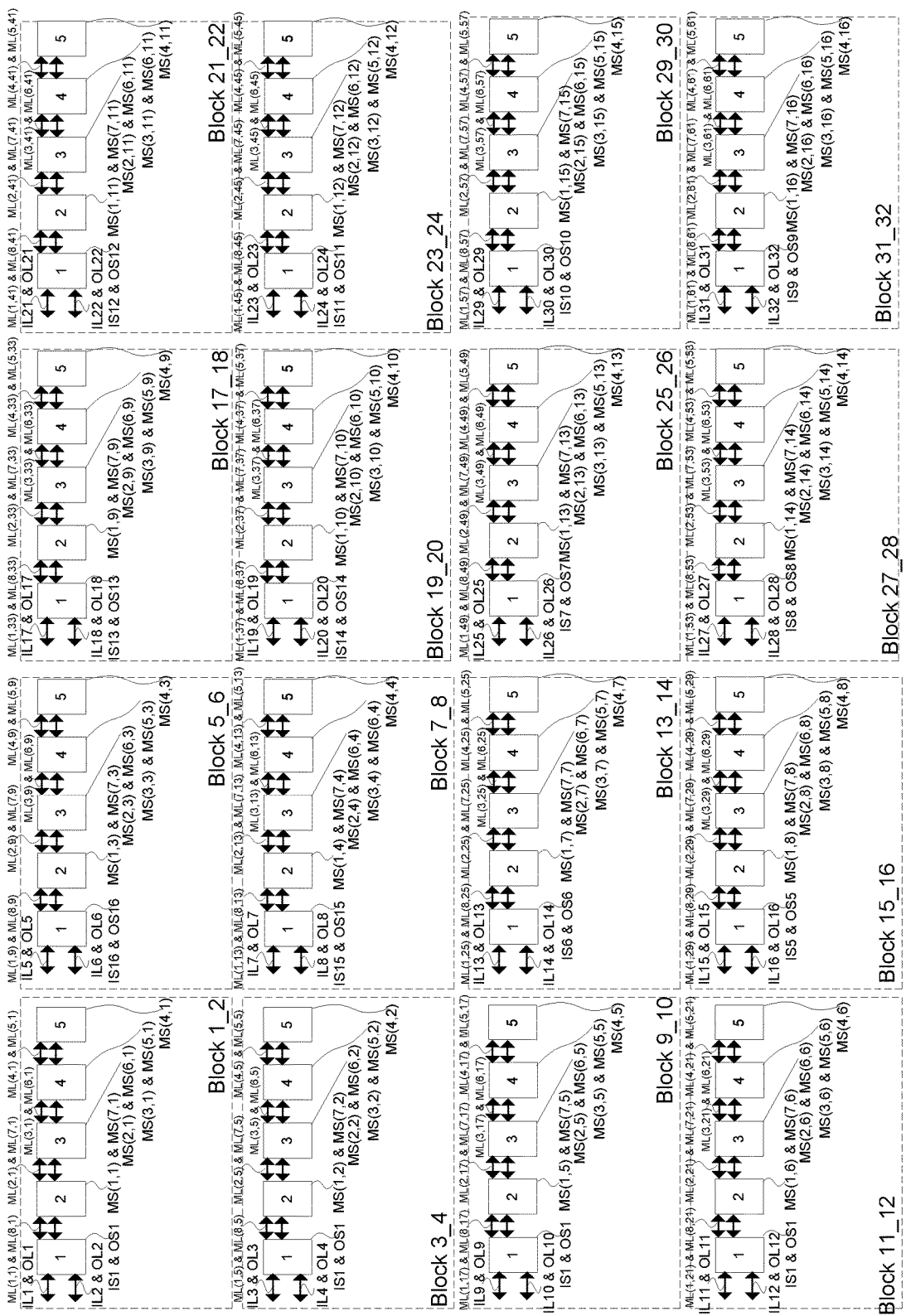
FIG. 1C is a diagram 100C layout of the network $V_{fold-mlink}(N,d,s)$ shown in FIG. 1B, in one embodiment, illustrating the connection links belonging with in each block only.

Modified-Hypercube Topology Layout Scheme:

Referring to layout 100C of FIG. 1C, in one embodiment, there are sixteen blocks namely Block 1_2, Block 3_4, Block 5_6, Block 7_8, Block 9_10, Block 11_12, Block 13_14, Block 16_16, Block 17_18, Block 19_20, Block 21_22, Block 23_24, Block 25_26, Block 27_28, Block 29_30, and Block 31_32. Each block implements all the switches in one row of the network 100B of FIG. 1B, one of the key aspects of the current invention. For example Block 1_2 implements the input switch IS1, output Switch OS1, middle switch MS(1,1), middle switch MS(7,1), middle switch MS(2,1), middle switch MS(6,1), middle switch MS(3,1), middle switch MS(5,1), and middle switch MS(4,1). For the simplification of illustration, Input switch IS1 and output switch OS1 together are denoted as switch 1; Middle switch MS(1,1) and middle switch MS(7,1) together are denoted by switch 2; Middle switch MS(2,1) and middle switch MS(6,1) together are denoted by switch 3; Middle switch MS(3,1) and middle switch MS(5,1) together are denoted by switch 4; Middle switch MS(4,1) is denoted by switch 5.

All the straight middle links are illustrated in layout 100C of FIG. 1C. For example in Block 1_2, inlet links IL1-IL2, outlet links OL1-OL2, middle link ML(1,1), middle link ML(1,2), middle link ML(8,1), middle link ML(8,2), middle link ML(2,1), middle link ML(2,2), middle link ML(7,1), middle link ML(7,2), middle link ML(3,1), middle link ML(3,2), middle link ML(6,1), middle link ML(6,2), middle link ML(4,1), middle link ML(4,2), middle link ML(5,1) and middle link ML(5,2) are illustrated in layout 100C of FIG. 1C.

Even though it is not illustrated in layout 100C of FIG. 1C, in each block, in addition to the switches there may be Configurable Logic Blocks (CLB) or any arbitrary digital circuit depending on the applications in different embodiments. There are four quadrants in the layout 100C of FIG. 1C namely top-left, bottom-left, top-right and bottom-right quadrants. Top-left quadrant implements Block 1_2, Block 3_4, Block 5_6, and Block 7_8. Bottom-left quadrant implements Block 9_10, Block 11_12, Block 13_14, and Block 15_16. Top-right quadrant implements Block 17_18, Block 19_20, Block 21_22, and Block 23_24. Bottom-right quadrant implements Block 25_26, Block 27_28, Block 29_30, and Block 31_32. There are two halves in layout 100C of FIG. 1C namely left-half and right-half. Left-half consists of top-left and bottom-left quadrants. Right-half consists of top-right and bottom-right quadrants.

Recursively in each quadrant there are four sub-quadrants. For example in top-left quadrant there are four sub-quadrants namely top-left sub-quadrant, bottom-left sub-quadrant, top-right sub-quadrant and bottom-right sub-quadrant. Top-left sub-quadrant of top-left quadrant implements Block 1_2. Bottom-left sub-quadrant of top-left quadrant implements Block 3_4. Top-right sub-quadrant of top-left quadrant implements Block 5_6. Finally bottom-right sub-quadrant of top-left quadrant implements Block 7_8. Similarly there are two sub-halves in each quadrant. For example in top-left quadrant there are two sub-halves namely left-sub-half and right-sub-half. Left-sub-half of top-left quadrant implements Block 1_2 and Block 3_4. Right-sub-half of top-left quadrant implements Block 5_6 and Block 7_8. Finally applicant notes that in each quadrant or half the blocks are arranged as a general binary hypercube. Recursively in larger multi-stage network $V_{fold-mlink}(N_1,N_2,d,s)$ where $N_1=N_2>32$, the layout in this embodiment in accordance with the current invention, will be such that the super-quadrants will also be arranged in d-ary hypercube manner. (In the embodiment of the layout 100C of FIG. 1C, it is binary hypercube manner since d=2, in the network $V_{fold-mlink}(N_1,N_2,d,s)$ 100B of FIG. 1B).

Figure 1D:
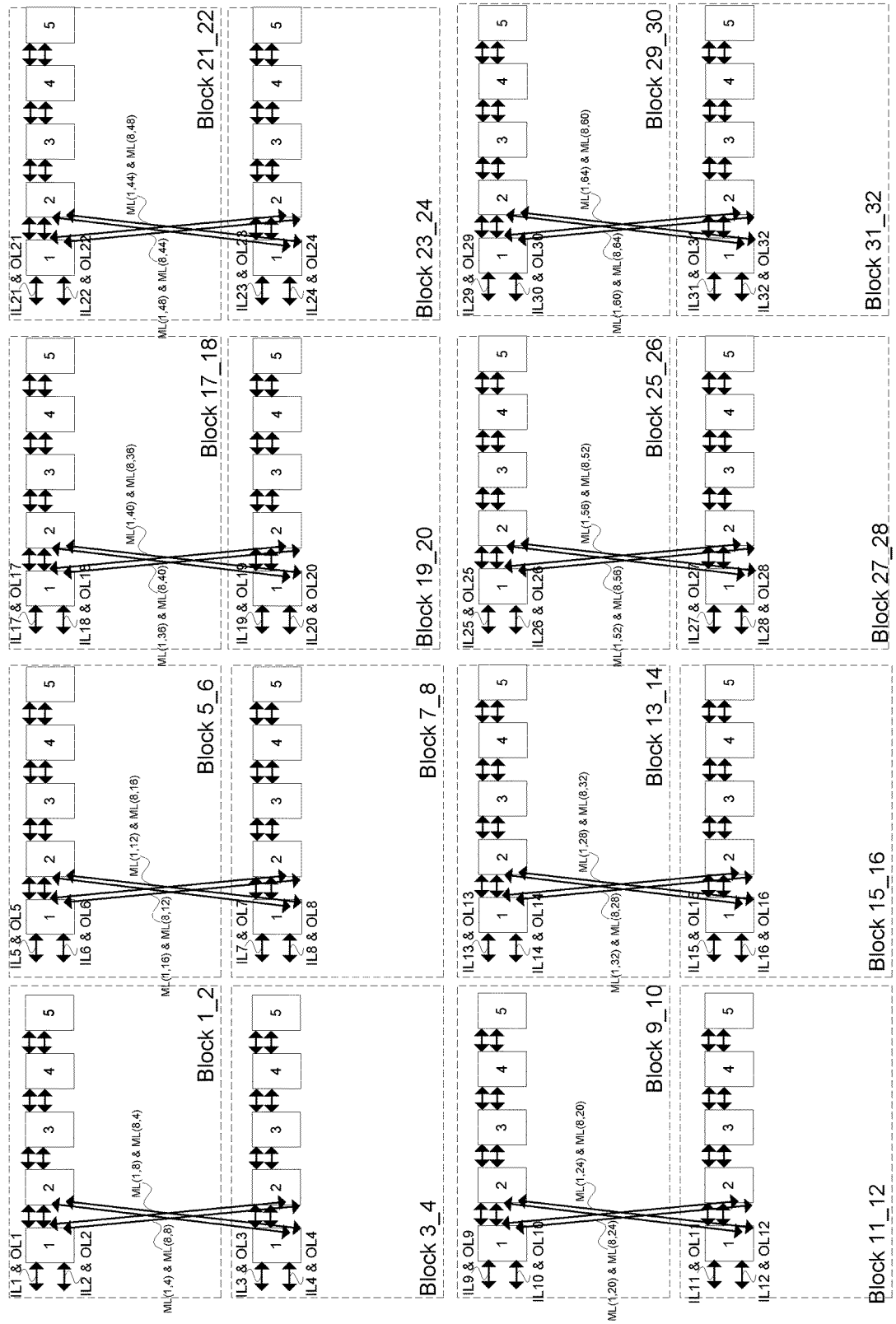
FIG. 1D is a diagram 100D layout of the network $V_{fold-mlink}(N,d,s)$ shown in FIG. 1B, in one embodiment, illustrating the connection links ML(1,*i*) for i=[1, 64] and ML(8,*i*) for i=[1,64].

Layout 100D of FIG. 1D illustrates the inter-block links between switches 1 and 2 of each block. For example middle links ML(1,3), ML(1,4), ML(8,7), and ML(8,8) are connected between switch 1 of Block 1_2 and switch 2 of Block 3_4. Similarly middle links ML(1,7), ML(1,8), ML(8,3), and ML(8,4) are connected between switch 2 of Block 1_2 and switch 1 of Block 3_4. Applicant notes that the inter-block links illustrated in layout 100D of FIG. 1D can be implemented as vertical tracks in one embodiment. Also in one embodiment inter-block links are implemented as two different tracks (for example middle links ML(1,4) and ML(8,8) are implemented as two different tracks); or in an alternative embodiment inter-block links are implemented as a time division multiplexed single track (for example middle links ML(1,4) and ML(8,8) are implemented as a time division multiplexed single track).

The bandwidth provided between two physically adjacent blocks in the same column or same row, when a switch in the first block is connected to a switch in the second block through the corresponding inter-block links and also a second switch in the second block is connected to a second switch in the first block through the corresponding inter-block links, is hereinafter called 2's bandwidth or 2's BW. The bandwidth offered between two diagonal blocks is also 2's BW when the corresponding row and columns provide 2's BW. For example the bandwidth provided between Block 1_2 and Block 3_4 of layout 100D of FIG. 1D is 2's BW because inter-block links between switch 1 of Block 1_2 and switch 2 of Block 3_4 are connected and also inter-block links between switch 2 of Block 1_2 and switch 1 of Block 3_4 are connected.

In general the bandwidth offered within a quadrant of the layout formed by two nearest neighboring blocks on each of the four sides is 2's BW. For example in layout 100C of FIG. 1C the bandwidth offered in top-left quadrant is 2's BW. Similarly the bandwidth offered within each of the other three quadrants bottom-left, top-right and bottom-right quadrants is 2' BW. Alternatively the bandwidth offered with in a square of blocks with the sides of the square consisting of two neighboring blocks is 2's BW. This definition can be generalized so that the bandwidth offered within a square of blocks with the sides consisting of "x" number of blocks, when $x=2^y$ where y is an integer, is hereinafter x's BW. Hence the bandwidth offered between four neighboring quadrants is 4's BW. For example the bandwidth offered between top-left quadrant, bottom-left quadrant, top-right quadrant and bottom-right quadrant is 4's BW as will be described later. It must be noted that the 4's BW is the bandwidth offered between the four quadrants in a square of four quadrants and it is not the bandwidth offered with in each quadrant.

Figure 1E:
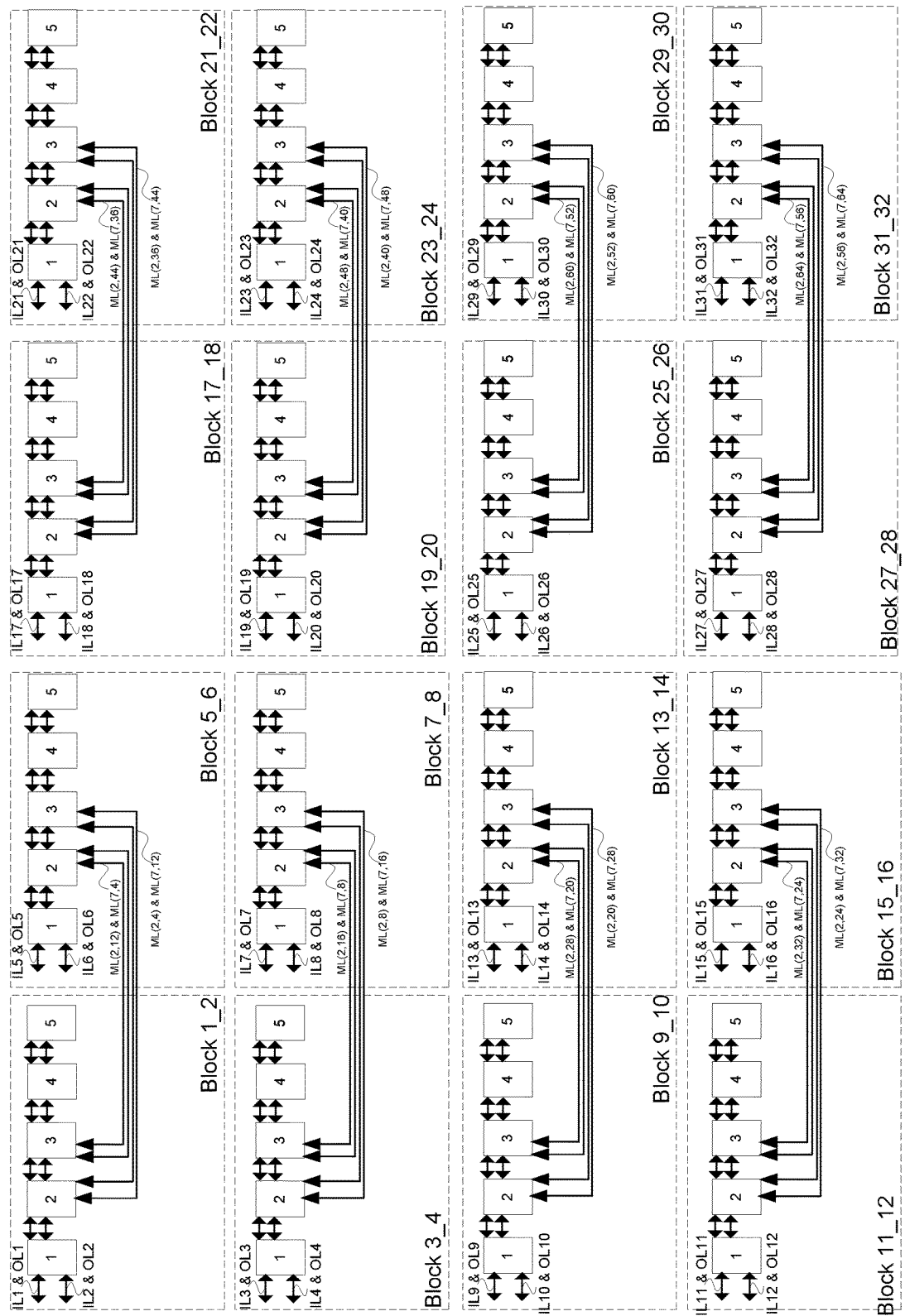
FIG. 1E is a diagram 100E layout of the network $V_{fold-mlink}(N,d,s)$ shown in FIG. 1B, in one embodiment, illustrating the connection links ML(2,*i*) for i=[1, 64] and ML(7,*i*) for i=[1, 64].

Layout 100E of FIG. 1E illustrates the inter-block links between switches 2 and 3 of each block. For example middle links ML(2,3), ML(2,4), ML(7,11), and ML(7,12) are connected between switch 2 of Block 1_2 and switch 3 of Block 5_6. Similarly middle links ML(2,11), ML(2,12), ML(7,3), and ML(7,4) are connected between switch 3 of Block 1_2 and switch 2 of Block 5_6. Applicant notes that the inter-block links illustrated in layout 100E of FIG. 1E can be implemented as horizontal tracks in one embodiment. Also in one embodiment inter-block links are implemented as two different tracks (for example middle links ML(2,12) and ML(7,4) are implemented as two different tracks); or in an alternative embodiment inter-block links are implemented as a time division multiplexed single track (for example middle links ML(2,12) and ML(7,4) are implemented as a time division multiplexed single track).

The bandwidth provided between Block 1_2 and Block 5_6 of layout 100E of FIG. 1E is 2's BW because inter-block links between switch 2 of Block 1_2 and switch 3 of Block 5_6 are connected and also inter-block links between switch 3 of Block 1_2 and switch 2 of Block 5_6 are connected. Similarly the bandwidth provided between Block 1_2 and Block 7_8 is also 2's BW since corresponding rows (formed by Block 1_2 and Block 5_6; and by Block 3_4 and Block 7_8) and columns (formed by Block 1_2 and Block 3_4; and by Block 5_6 and Block 7_8) offer 2's BW. Similarly the bandwidth offered between Block 3_4 and Block 5_6 is 2's BW.

Figure 1F:
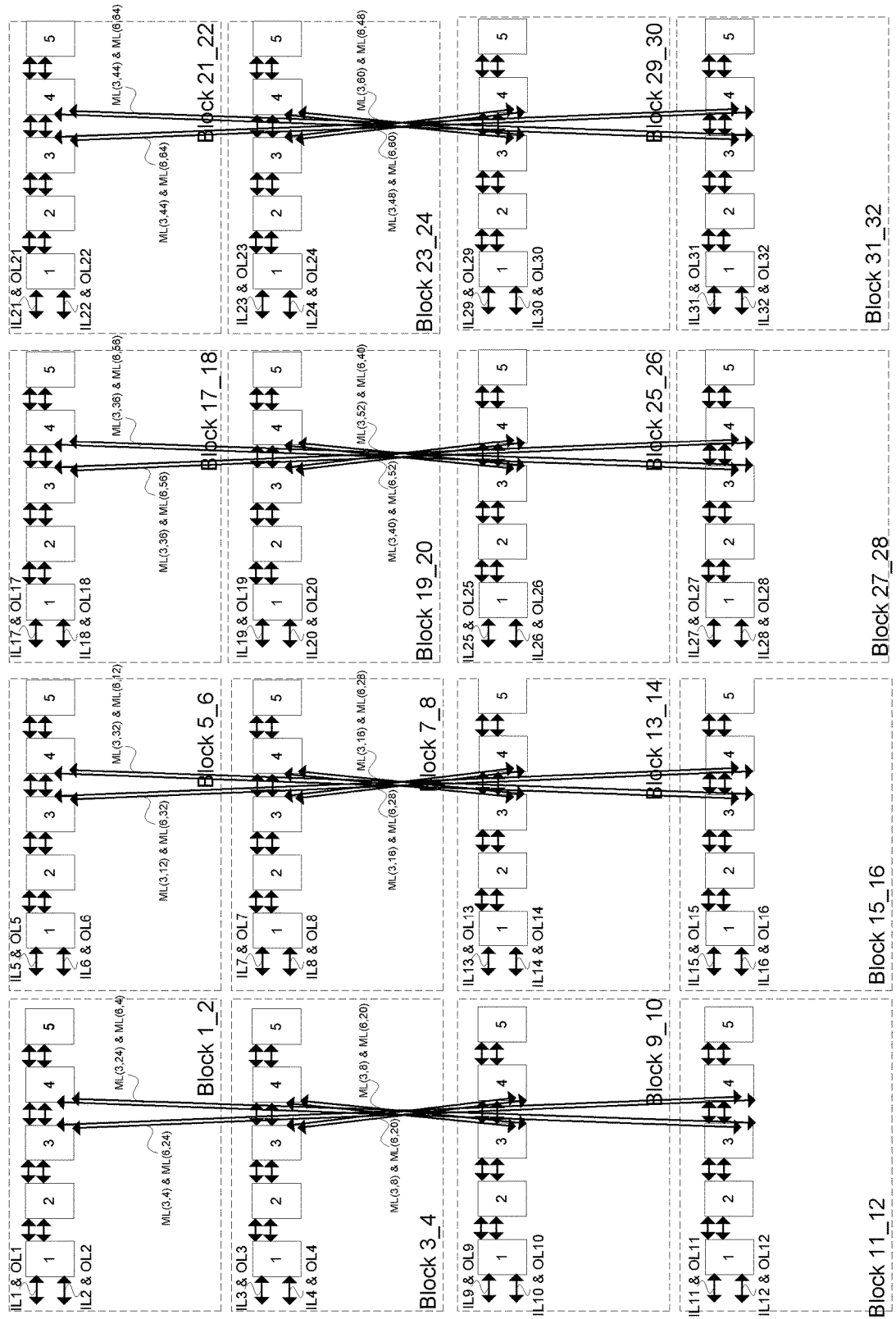
FIG. 1F is a diagram 100F layout of the network $V_{fold-mlink}(N,d,s)$ shown in FIG. 1B, in one embodiment, illustrating the connection links ML(3,*i*) for i=[1, 64] and ML(6,*i*) for i=[1,64].

Layout 100F of FIG. 1F illustrates the inter-block links between switches 3 and 4 of each block. For example middle links ML(3,3), ML(3,4), ML(6,23), and ML(6,24) are connected between switch 3 of Block 1_2 and switch 4 of Block 11_12. Similarly middle links ML(3,23), ML(3,24), ML(6, 3), and ML(6,4) are connected between switch 4 of Block 1_2 and switch 3 of Block 11_12. Applicant notes that the inter-block links illustrated in layout 100F of FIG. 1F can be implemented as vertical tracks in one embodiment. Also in one embodiment inter-block links are implemented as two different tracks (for example middle links ML(3,4) and ML(6,24) are implemented as two different tracks); or in an alternative embodiment inter-block links are implemented as a time division multiplexed single track (for example middle links ML(3,4) and ML(6,24) are implemented as a time division multiplexed single track).

Applicant notes that the topology of inter-block links between switches 3 and 4 of each block of layout 100F of FIG. 1F is not the typical inverse Benes Network topology. In layout 100F first the switches 3 and 4 of nearest neighbor blocks are connected and then the rest of the blocks are connected in inverse Benes Network topology. For example since Block 3_4 and Block 9_10 are nearest neighbors in the leftmost column of layout 100F the corresponding links from switches 3 and 4 are connected together first. Then the remaining blocks in each column are connected in inverse Benes topology. For example in layout 100F since the remaining block in the leftmost column of top-left quadrant is Block 1_2 and the remaining block in the leftmost column of bottom-left quadrant is Block 11_12 the inter-block links between their corresponding switches 3 and 4 are connected together. Similarly in all the columns, the inter-block links between switches 3 and 4 are connected.

The bandwidth offered in layout 100F of FIG. 1F is 4's BW, since the bandwidth offered with in a square of blocks with the sides of the square consisting of four neighboring blocks is 4's BW. It must be noted that the bandwidth offered between top-left quadrant and bottom-left quadrant is 4's BW. That is inter-block links of a switch in each one of the blocks in top-left quadrant are connected to a switch in any one of the blocks in bottom-left quadrant and vice versa. Similarly the bandwidth offered between top-right quadrant and bottom-right quadrant is 4's BW. For example the bandwidth provided between Block 1_2 and Block 11_12 of layout 100F of FIG. 1F is 4's BW because inter-block links between switch 3 of Block 1_2 and switch 4 of Block 11_12 are connected and also inter-block links between switch 4 of Block 1_2 and switch 3 of Block 11_12 are connected. Similarly the bandwidth provided between Block 3_4 and Block 9_10 of layout 100F of FIG. 1F is 4's BW, even though they are physically nearest neighbors. It must be noted that the 4's BW is the bandwidth offered between the four quadrants in a square of four quadrants and it is not the bandwidth offered with in each quadrant.

Figure 1G:
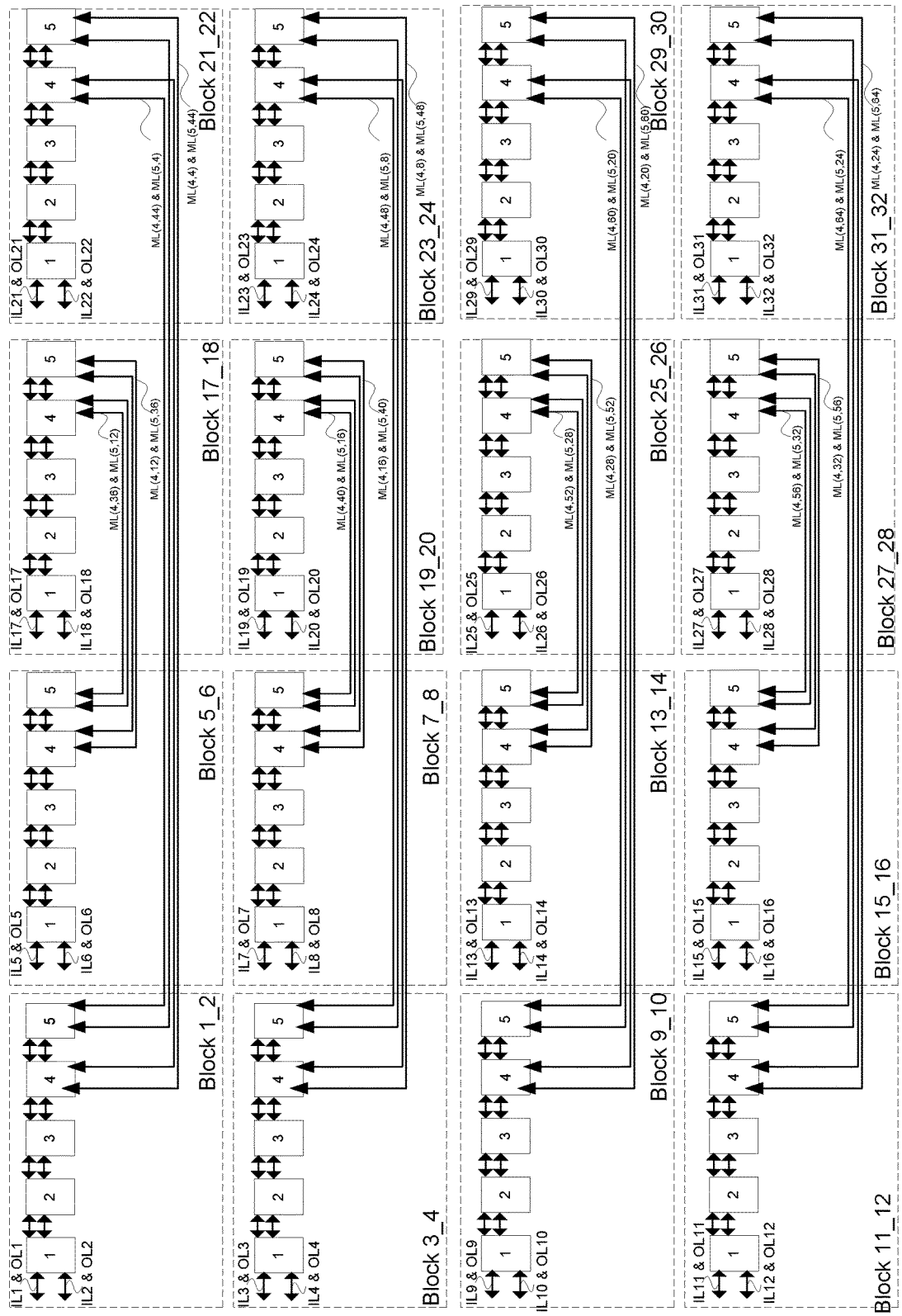
FIG. 1G is a diagram 100G layout of the network $V_{fold-mlink}(N,d,s)$ shown in FIG. 1B, in one embodiment, illustrating the connection links ML(4,*i*) for i=[1, 64] and ML(5,*i*) for i=[1,64].

Layout 100G of FIG. 1G illustrates the inter-block links between switches 4 and 5 of each block. For example middle links ML(4,3), ML(4,4), ML(5,43), and ML(5,44) are connected between switch 4 of Block 1_2 and switch 5 of Block 21_22. Similarly middle links ML(4,43), ML(4,44), ML(5, 3), and ML(5,4) are connected between switch 5 of Block 1_2 and switch 4 of Block 21_22. Applicant notes that the inter-block links illustrated in layout 100G of FIG. 1G can be implemented as horizontal tracks in one embodiment. Also in one embodiment inter-block links are implemented as two different tracks (for example middle links ML(4,4) and ML(5,44) are implemented as two different tracks); or in an alternative embodiment inter-block links are implemented as a time division multiplexed single track (for example middle links ML(4,4) and ML(5,44) are implemented as a time division multiplexed single track).

Applicant notes that the topology of inter-block links between switches 4 and 5 of each block of layout 100G of FIG. 1G is not the typical inverse Benes Network topology. In layout 100G first the switches 4 and 5 of nearest neighbor blocks are connected and then the rest of the blocks are connected in inverse Benes Network topology. For example since Block 5_6 and Block 17_18 are nearest neighbors in the topmost row of layout 100G the corresponding links from switches 4 and 5 are connected together first. Then the remaining blocks in each row are connected in inverse Benes topology. For example in layout 100G since the remaining block in the topmost row of top-left quadrant is Block 1_2 and the remaining block in the topmost row of top-right quadrant is Block 21_22 the inter-block links between their corresponding switches 4 and 5 are connected together. Similarly in all the rows, the inter-block links between switches 4 and 5 are connected.

The bandwidth offered in layout 100G of FIG. 1G is 4's BW, since the bandwidth offered with in a square of blocks with the sides of the square consisting of four neighboring blocks is 4's BW. It must be noted that the bandwidth offered between top-left quadrant and top-right quadrant is 4's BW. That is inter-block links of a switch in each one of the blocks in top-left quadrant are connected to a switch in any one of the blocks in top-right quadrant and vice versa. Similarly the bandwidth offered between bottom-left quadrant and bottom-right quadrant is 4's BW. For example the bandwidth provided between Block 1_2 and Block 21_22 of layout 100G of FIG. 1G is 4's BW because inter-block links between switch 4 of Block 1_2 and switch 5 of Block 21_22 are connected and also inter-block links between switch 5 of Block 1_2 and switch 4 of Block 21_22 are connected. Similarly the bandwidth provided between Block 5_6 and Block 17_18 of layout 100G of FIG. 1G is 4's BW, even though they are physically nearest neighbors. Just the same way 2's BW is provided between two diagonal blocks, the bandwidth offered between two diagonal quadrants is also 4's BW that is when the corresponding row and columns provide 4's BW.

The complete layout for the network 100B of FIG. 1B is given by combining the links in layout diagrams of 100C, 100D, 100E, 100F, and 100G. Applicant notes that in the layout 100C of FIG. 1C, the inter-block links between switch 1 and switch 2 of corresponding blocks are vertical tracks as shown in layout 100D of FIG. 1D; the inter-block links between switch 2 and switch 3 of corresponding blocks are horizontal tracks as shown in layout 100E of FIG. 1E; the inter-block links between switch 3 and switch 4 of corresponding blocks are vertical tracks as shown in layout 100F of FIG. 1F; and finally the inter-block links between switch 4 and switch 5 of corresponding blocks are horizontal tracks as shown in layout 100G of FIG. 1G. The pattern is alternate vertical tracks and horizontal tracks. It continues recursively for larger networks of N>32 as will be illustrated later.

Some of the key aspects of the current invention are discussed. 1) All the switches in one row of the multi-stage network 100B are implemented in a single block. 2) The blocks are placed in such a way that all the inter-block links are either horizontal tracks or vertical tracks; 3) Since all the inter-block links are either horizontal or vertical tracks, all the inter-block links can be mapped on to island-style architectures in current commercial FPGA's; 4) The length of the wires in a given stage are not equal, for example the inter-block links between switches 3 and 4 of the nearest neighbor blocks Block 3_4 and Block 9_10 are smaller in length than the inter-block links between switches 3 and 4 of the blocks Block 1_2 and Block 11_12.

In accordance with the current invention, the layout 100C in FIG. 1C can be recursively extended for any arbitrarily large generalized folded multi-link multi-stage network $V_{fold\ mlink}(N_1,N_2,d,s)$ the sub-quadrants, quadrants, and super-quadrants are arranged in d-ary hypercube manner and also the inter-blocks are accordingly connected in d-ary hypercube topology. Even though all the embodiments in the current invention are illustrated for $N_1=N_2$, the embodiments can be extended for $N_1 \neq N_2$.

Figure 1H:
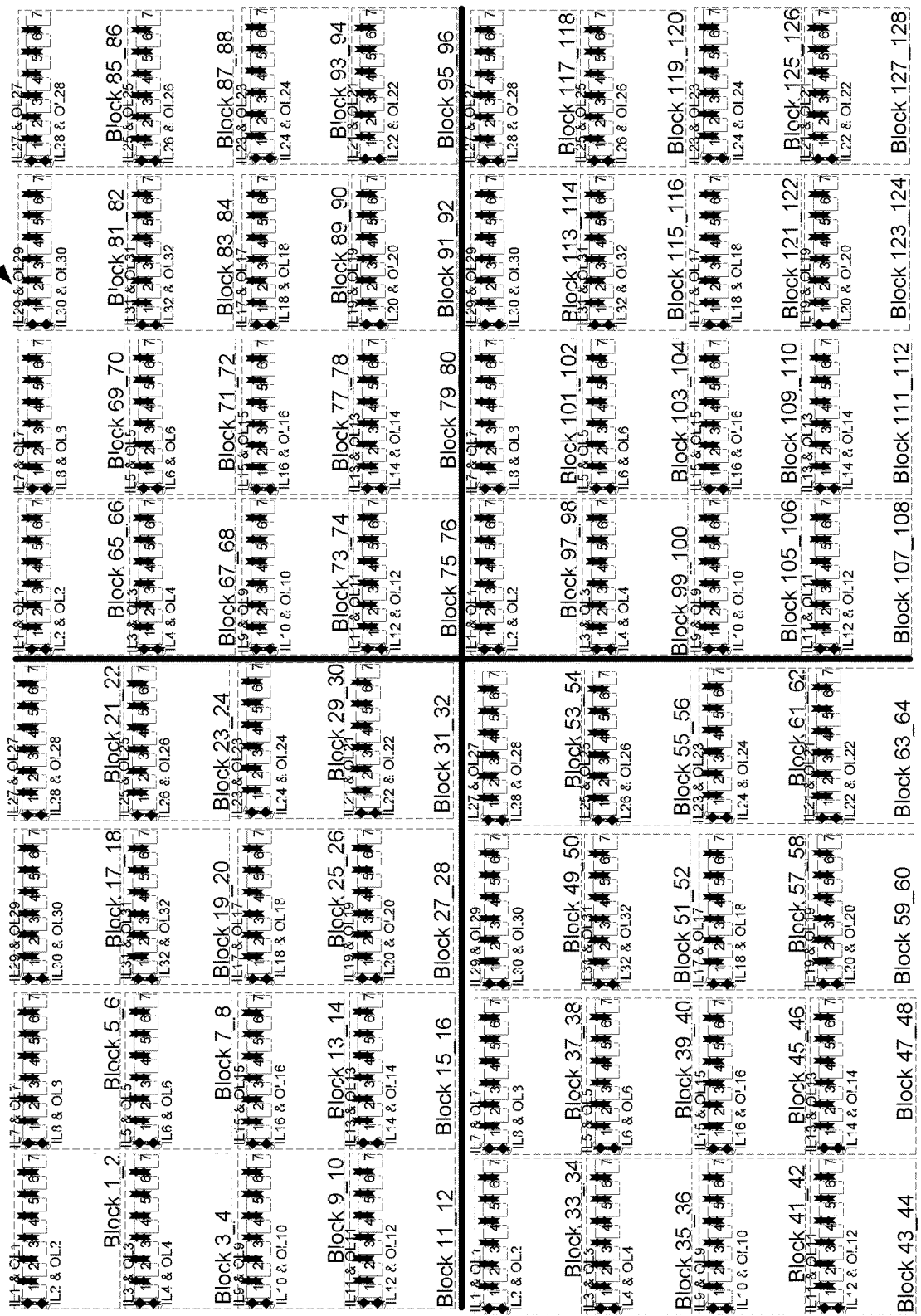
FIG. 1H is a diagram 100H layout of a network $V_{fold-mlink}(N,d,s)$ where N=128, d=2, and s=2, in one embodiment, illustrating the connection links belonging with in each block only.

Referring to layout 100H of FIG. 1H, illustrates the extension of layout 100C for the network $V_{fold-mlink}(N_1,N_2,d,s)$ where $N_1=N_2=128$; d=2; and s=2. There are four super-quadrants in layout 100H namely top-left super-quadrant, bottom-left super-quadrant, top-right super-quadrant, bottom-right super-quadrant. Total number of blocks in the layout 100H is sixty four. Top-left super-quadrant implements the blocks from block 1_2 to block 31_32. Each block in all the super-quadrants has two more switches namely switch 6 and switch 7 in addition to the switches [1-5] illustrated in layout 100C of FIG. 1C. The inter-block link connection topology is the exactly the same between the switches 1 and 2; switches 2 and 3; switches 3 and 4; switches 4 and 5 as it is shown in the layouts of FIG. 1D, FIG. 1E, FIG. 1F, and FIG. 1G respectively.

Bottom-left super-quadrant implements the blocks from block 33_34 to block 63_64. Top-right super-quadrant implements the blocks from block 65_66 to block 95_96. And bottom-right super-quadrant implements the blocks from block 97_98 to block 127_128. In all these three super-quadrants also, the inter-block link connection topology is exactly the same between the switches 1 and 2; switches 2 and 3; switches 3 and 4; switches 4 and 5 as that of the top-left super-quadrant.

Recursively in accordance with the current invention, the inter-block links connecting the switch 5 and switch 6 will be vertical tracks between the corresponding switches of top-left super-quadrant and bottom-left super-quadrant. And similarly the inter-block links connecting the switch 5 and switch 6 will be vertical tracks between the corresponding switches of top-right super-quadrant and bottom-right super-quadrant. The inter-block links connecting the switch 6 and switch 7 will be horizontal tracks between the corresponding switches of top-left super-quadrant and top-right super-quadrant. And similarly the inter-block links connecting the switch 6 and switch 7 will be horizontal tracks between the corresponding switches of bottom-left super-quadrant and bottom-right super-quadrant.

Just as described for layout 100F of FIG. 1F, Applicant notes that the connection topology of inter-block links between switches 5 and 6 of each block of layout 100H of FIG. 1H is not the typical inverse Benes Network topology. In layout 100H first the switches 5 and 6 of nearest neighbor blocks are connected and then the rest of the blocks are connected in inverse Benes Network topology. For example since Block 11_12 and Block 33_34 are nearest neighbors in the leftmost column of layout 100H the corresponding inter-block links from switches 5 and 6 are connected together first. Then the remaining blocks in the leftmost column are connected in inverse Benes topology. For example in layout 100H since the remaining blocks in the leftmost column of top-left super-quadrant are Block 1_2, Block 3_4, and Block 9_10 and the remaining blocks in the leftmost column of bottom-left super-quadrant are Block 35_36, Block 41_42 and Block 43_44 the inter-block links between their corresponding switches 5 and 6 are connected together. In one embodiment the inter-block links of switches 5 and 6 corresponding to Block 1_2 and Block 35-36 are connected together; the inter-block links of switches 5 and 6 corresponding to Block 3_4 and Block 41_42 are connected together; and the inter-block links of switches 5 and 6 corresponding to Block 9_10 and Block 43_44 are connected together. (Similarly in another embodiment any one of the three blocks in the leftmost column of top-left super-quadrant can be connected with any one of the three blocks in the leftmost column of bottom-left super-quadrant of course as long as each block in leftmost column of top-left super-quadrant is connected to only one block in leftmost column of bottom-left super-quadrant and vice versa). Similarly in all the columns, the inter-block links between switches 5 and 6 are connected.

The bandwidth offered between top super-quadrants and bottom super-quadrants in layout 100H of FIG. 1H is 8's BW, since the bandwidth offered with in a square of blocks with the sides of the square consisting of eight neighboring blocks is 8's BW. It must be noted that the bandwidth offered between top-left super-quadrant and bottom-left super-quadrant is 8's BW. That is inter-block links of a switch in each one of the blocks in top-left super-quadrant are connected to a switch in any one of the blocks in bottom-left super-quadrant and vice versa. Similarly the bandwidth offered between top-right super-quadrant and bottom-right super-quadrant is 8's BW. For example in one embodiment the bandwidth provided between Block 1_2 and Block 35_36 of layout 100H of FIG. 1H is 8's BW because inter-block links between switch 5 of Block 1_2 and switch 6 of Block 35_36 are connected and also inter-block links between switch 5 of Block 1_2 and switch 6 of Block 35_36 are connected. Similarly the bandwidth provided between any one of the blocks in top-left super-quadrant and any one of the bottom-left super-quadrant of layout 100H of FIG. 1H is 8's BW. It must be noted that the 8's BW is the bandwidth offered between the four super-quadrants in a square of four super-quadrants and it is neither the bandwidth offered between the four quadrants in one of the super-quadrants or with in each quadrant.

Just as described for layout 100G of FIG. 1G, Applicant notes that the connection topology of inter-block links between switches 6 and 7 of each block of layout 100H of FIG. 1H is not the typical inverse Benes Network topology. In layout 100H first the switches 6 and 7 of nearest neighbor blocks are connected and then the rest of the blocks are connected in inverse Benes Network topology. For example since Block 21_22 and Block 65_66 are nearest neighbors in the topmost row of layout 100H the corresponding inter-block links from switches 6 and 7 are connected together first. Then the remaining blocks in the topmost row are connected in inverse Benes topology. For example in layout 100H since the remaining blocks in the topmost row of top-left super-quadrant are Block 1_2, Block 5_6, and Block 17_18 and the remaining blocks in the topmost row of top-right super-quadrant are Block 69_70, Block 81_82 and Block 85_86 the inter-block links between their corresponding switches 6 and 7 are connected together. In one embodiment the inter-block links of switches 6 and 7 corresponding to Block 1_2 and Block 69-70 are connected together; the inter-block links of switches 6 and 7 corresponding to Block 5_6 and Block 81-82 are connected together; and the inter-block links of switches 6 and 7 corresponding to Block 17_18 and Block 85-86 are connected together. (Similarly in another embodiment any one of the three blocks in the topmost row of top-left super-quadrant can be connected with any one of the three blocks in the topmost row of top-right super-quadrant of course as long as each block in topmost row of top-right super-quadrant is connected to only one block in topmost row of top-right super-quadrant and vice versa). Similarly in all the rows, the inter-block links between switches 6 and 7 are connected.

The bandwidth offered between left super-quadrants and right super-quadrants in layout 100H of FIG. 1H is 8's BW, since the bandwidth offered with in a square of blocks with the sides of the square consisting of eight neighboring blocks is 8's BW. It must be noted that the bandwidth offered between top-left super-quadrant and top-right super-quadrant is 8's BW. That is inter-block links of a switch in each one of the blocks in top-left super-quadrant are connected to a switch in any one of the blocks in top-right super-quadrant and vice versa. Similarly the bandwidth offered between bottom-left super-quadrant and bottom-right super-quadrant is 8's BW. For example in one embodiment the bandwidth provided between Block 1_2 and Block 69_70 of layout 100H of FIG. 1H is 8's BW because inter-block links between switch 6 of Block 1_2 and switch 7 of Block 69_70 are connected and also inter-block links between switch 6 of Block 1_2 and switch 7 of Block 69_70 are connected. Similarly the bandwidth provided between any one of the blocks in top-left super-quadrant and any one of the blocks in top-right super-quadrant of layout 100H of FIG. 1H is 8's BW. Just the same way 2's BW is provided between two diagonal blocks, the bandwidth offered between two diagonal super-quadrants is 8's BW that is when the corresponding row and columns provide 8's BW.

Figure 1I:
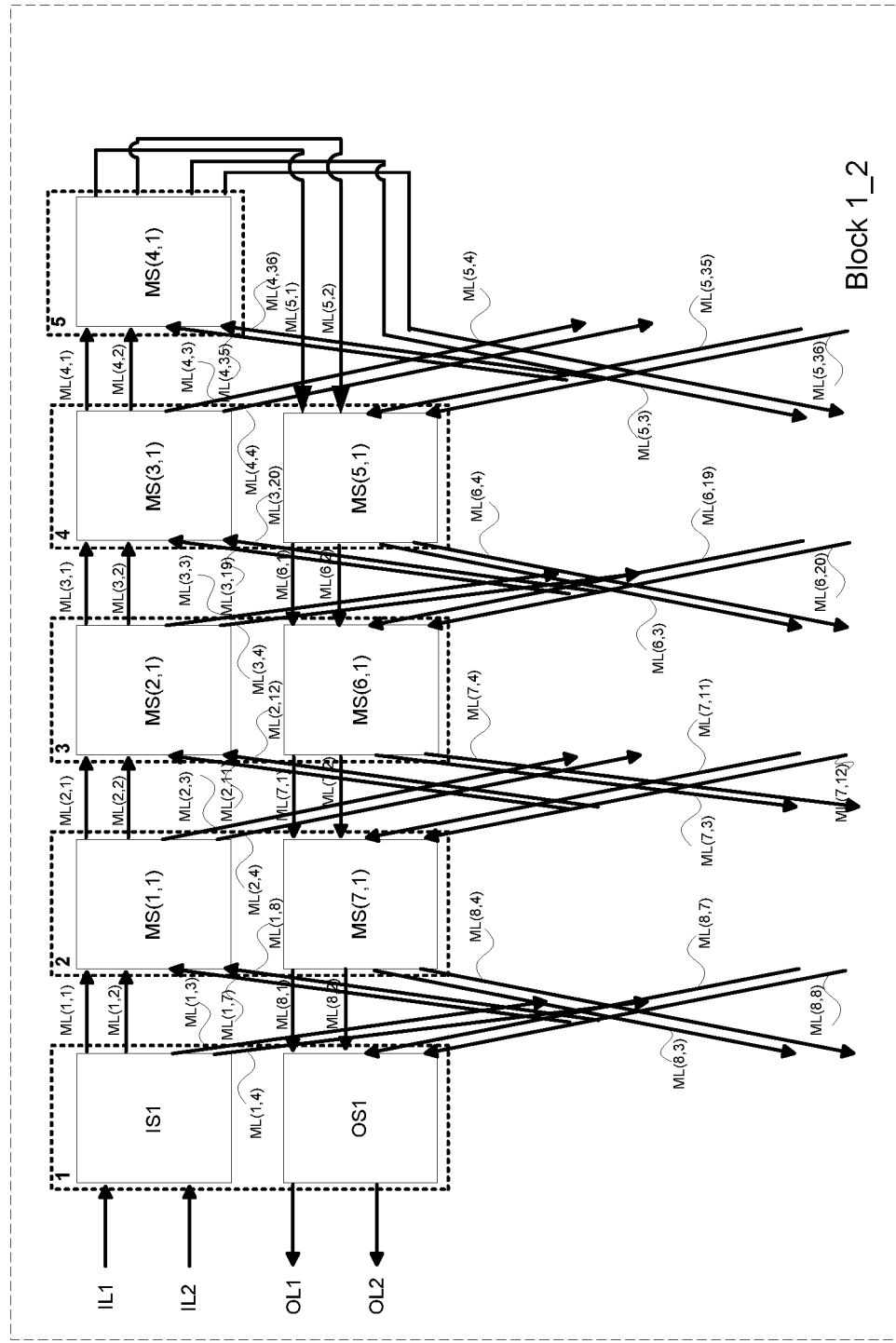
FIG. 1I is a diagram 100I detailed connections of BLOCK 1_2 in the network layout 100C in one embodiment, illustrating the connection links going in and coming out when the layout 100C is implementing $V_{mlink}(N,d,s)$ or $V_{fold-mlink}(N,d,s)$.

Referring to diagram 100I of FIG. 1I illustrates a high-level implementation of Block 1_2 (Each of the other blocks have similar implementation) of the layout 100C of FIG. 1C which represents a generalized folded multi-link multi-stage network $V_{fold-mlink}(N_1,N_2,d,s)$ where $N_1=N_2=32$; $d=2$; and $s=2$. Block 1_2 in 100I illustrates both the intra-block and inter-block links connected to Block 1_2. The layout diagram 100I corresponds to the embodiment where the switches that are placed together are implemented as separate switches in the network 100B of FIG. 1B. As noted before then the network 100B is the generalized folded multi-link multi-stage network $V_{fold-mlink}(N_1,N_2,d,s)$ where $N_1=N_2=32$; $d=2$; and $s=2$ with nine stages as disclosed in U.S. Provisional Patent Application Ser. No. 60/940,389 that is incorporated by reference above.

That is the switches that are placed together in Block 1_2 as shown in FIG. 1I are namely input switch IS1 and output switch OS1 belonging to switch 1, illustrated by dotted lines, (as noted before switch 1 is for illustration purposes only, in practice the switches implemented are input switch IS1 and output switch OS1); middle switch MS(1,1) and middle switch MS(7,1) belonging to switch 2; middle switch MS(2,1) and middle switch MS(6,1) belonging to switch 3; middle switch MS(3,1) and middle switch MS(5,1) belonging to switch 4; And middle switch MS(4,1) belonging to switch 5.

Input switch IS1 is implemented as two by four switch with the inlet links IL1 and IL2 being the inputs of the input switch IS1 and middle links ML(1,1)-ML(1,4) being the outputs of the input switch IS1; and output switch OS1 is implemented as four by two switch with the middle links ML(8,1), ML(8,2), ML(8,7), and ML(8,8) being the inputs of the output switch OS1 and outlet links OL1-OL2 being the outputs of the output switch OS1.

Middle switch MS(1,1) is implemented as four by four switch with the middle links ML(1,1), ML(1,2), ML(1,7) and ML(1,8) being the inputs and middle links ML(2,1)-ML(2,4) being the outputs; and middle switch MS(7,1) is implemented as four by four switch with the middle links ML(7,1), ML(7,2), ML(7,11) and ML(7,12) being the inputs and middle links ML(8,1)-ML(8,4) being the outputs. Similarly all the other middle switches are also implemented as four by four switches as illustrated in 100I of FIG. 1I.

Generalized Multi-Link Butterfly Fat Tree Network Embodiment:

In another embodiment in the network 100B of FIG. 1B, the switches that are placed together are implemented as combined switch then the network 100B is the generalized multi-link butterfly fat tree network $V_{mlink-bft}(N_1,N_2,d,s)$ where $N_1=N_2=32$; $d=2$; and $s=2$ with five stages as disclosed in U.S. Provisional Patent Application Ser. No. 60/940,390 that is incorporated by reference above. That is the switches that are placed together in input stage 110 and output stage 120 are implemented as a six by six switch. For example the input switch IS1 and output switch OS1 are placed together; so input switch IS1 and output OS1 are implemented as a six by six switch with the inlet links IL1, IL2, ML(8,1), ML(8,2), ML(8,7) and ML(8,8) being the inputs of the combined switch (denoted as IS1&OS1) and middle links ML(1,1), ML(1,2), ML(1,3), ML(1,4), OL1 and OL2 being the outputs of the combined switch IS1&OS1. Similarly in this embodiment of network 100B all the switches that are placed together are implemented as a combined switch.

Layout diagrams 100C in FIG. 1C, 100D in FIG. 1D, 100E in FIG. 1E, 100F in FIG. 1G are also applicable to generalized multi-link butterfly fat tree network $V_{mlink-bft}(N_1,N_2,d,s)$ where $N_1=N_2=32$; $d=2$; and $s=2$ with five stages. The layout 100C in FIG. 1C can be recursively extended for any arbitrarily large generalized multi-link butterfly fat tree network $V_{mlink-bft}(N_1,N_2,d,s)$. Accordingly layout 100H of FIG. 1H is also applicable to generalized multi-link butterfly fat tree network $V_{mlink-bft}(N_1,N_2,d,s)$.

Figure 1J:
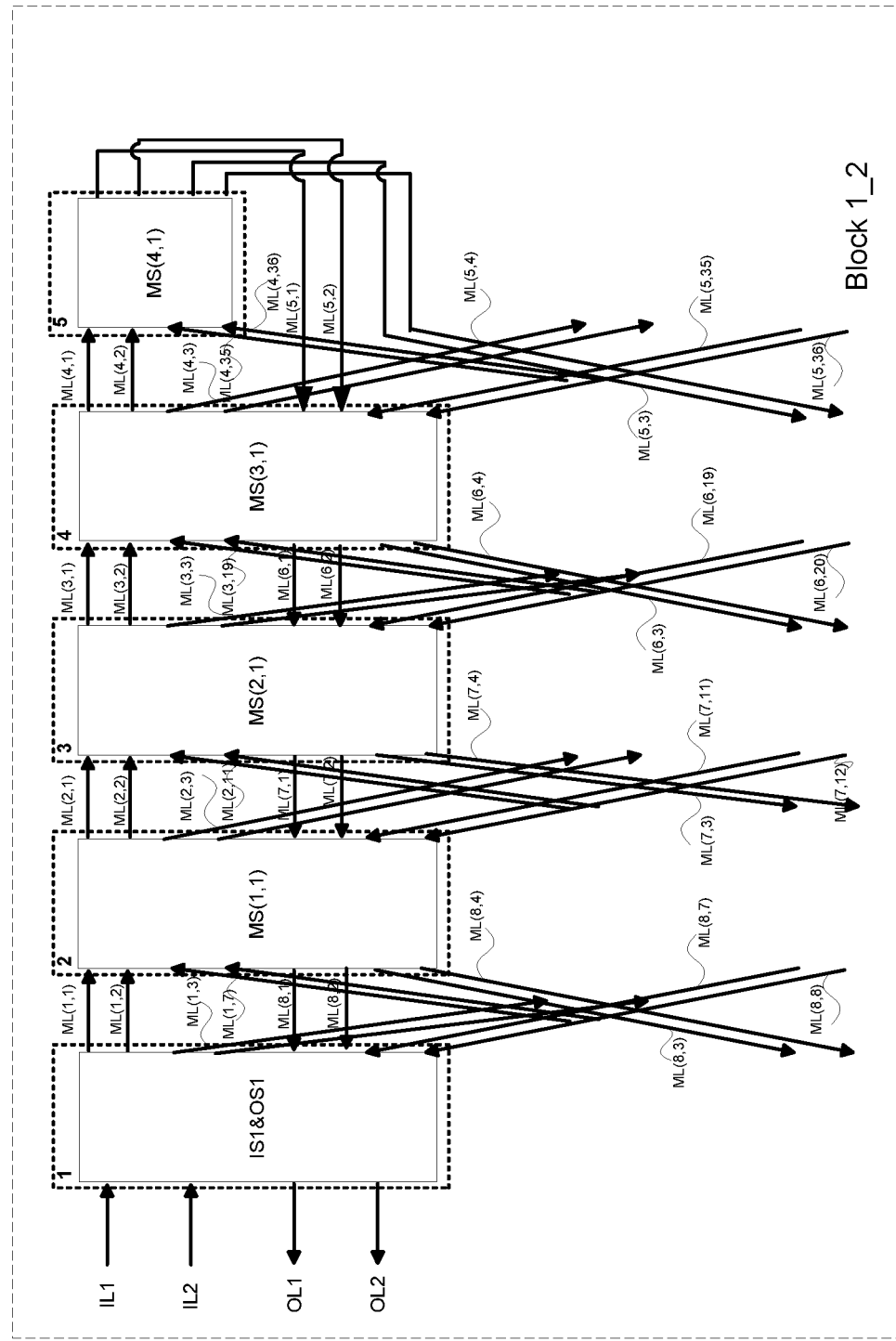
FIG. 1J is a diagram 100J detailed connections of BLOCK 1_2 in the network layout 100C in one embodiment, illustrating the connection links going in and coming out when the layout 100C is implementing $V_{mlink-bft}(N,d,s)$.

Referring to diagram 100J of FIG. 1J illustrates a high-level implementation of Block 1_2 (Each of the other blocks have similar implementation) of the layout 100C of FIG. 1C which represents a generalized multi-link butterfly fat tree network $V_{mlink-bft}(N_1,N_2,d,s)$ where $N_1=N_2=32$; $d=2$; and $s=2$. Block 1_2 in 100J illustrates both the intra-block and inter-block links. The layout diagram 100J corresponds to the embodiment where the switches that are placed together are implemented as combined switch in the network 100B of FIG. 1B. As noted before then the network 100B is the generalized multi-link butterfly fat tree network $V_{mlink-bft}(N_1,N_2,d,s)$ where $N_1=N_2=32$; $d=2$; and $s=2$ with five stages as disclosed in U.S. Provisional Patent Application Ser. No. 60/940,390 that is incorporated by reference above.

That is the switches that are placed together in Block 1_2 as shown in FIG. 1J are namely the combined input and output switch IS1&OS1 belonging to switch 1, illustrated by dotted lines, (as noted before switch 1 is for illustration purposes only, in practice the switch implemented is combined input and output switch IS1&OS1); middle switch MS(1,1) belonging to switch 2; middle switch MS(2,1) belonging to switch 3; middle switch MS(3,1) belonging to switch 4; And middle switch MS(4,1) belonging to switch 5.

Combined input and output switch IS1&OS1 is implemented as six by six switch with the inlet links IL1, IL2 and ML(8,1), ML(8,2), ML(8,7), and ML(8,8) being the inputs and middle links ML(1,1)-ML(1,4), and outlet links OL1-OL2 being the outputs.

Middle switch MS(1,1) is implemented as eight by eight switch with the middle links ML(1,1), ML(1,2), ML(1,7), ML(1,8), ML(7,1), ML(7,2), ML(7,11) and ML(7,12) being the inputs and middle links ML(2,1)-ML(2,4) and middle links ML(8,1)-ML(8,4) being the outputs. Similarly all the other middle switches are also implemented as eight by eight switches as illustrated in 100J of FIG. 1J.

In another embodiment, middle switch MS(1,1) (or the middle switches in any of the middle stage excepting the root middle stage) of Block 1_2 of $V_{mlink-bft}(N_1,N_2,d,s)$ can be implemented as a four by eight switch and a four by four switch to save cross points. This is because the left going middle links of these middle switches are never setup to the right going middle links. For example, in middle switch MS(1,1) of Block 1_2 as shown FIG. 1J, the left going middle links namely ML(7,1), ML(7,2), ML(7,11), and ML(7,12) are never switched to the right going middle links ML(2,1), ML(2,2), ML(2,3), and ML(2,4). And hence to implement MS(1,1) two switches namely: 1) a four by eight switch with the middle links ML(1,1), ML(1,2), ML(1,7), and ML(1,8) as inputs and the middle links ML(2,1), ML(2,2), ML(2,3), ML(2,4), ML(8,1), ML(8,2), ML(8,3), and ML(8,4) as outputs and 2) a four by four switch with the middle links ML(7,1), ML(7,2), ML(7,11), and ML(7,12) as inputs and the middle links ML(8,1), ML(8,2), ML(8,3), and ML(8,4) as outputs are sufficient without loosing any connectivity of the embodiment of MS(1,1) being implemented as an eight by eight switch as described before.)

Generalized Multi-Stage Network Embodiment:

In one embodiment, in the network 100B of FIG. 1B, the switches that are placed together are implemented as two separate switches in input stage 110 and output stage 120; and as four separate switches in all the middle stages, then the network 100B is the generalized folded multi-stage network $V_{fold}(N_1,N_2,d,s)$ where $N_1=N_2=32$; d=2; and s=2 with nine stages as disclosed in U.S. Provisional Patent Application Ser. No. 60/940,391 that is incorporated by reference above. That is the switches that are placed together in input stage 110 and output stage 120 are implemented as a two by four switch and a four by two switch respectively. For example the switch input switch IS1 and output switch OS1 are placed together; so input switch IS1 is implemented as two by four switch with the inlet links IL1 and IL2 being the inputs and middle links ML(1,1)-ML(1,4) being the outputs; and output switch OS1 is implemented as four by two switch with the middle links ML(8,1), ML(8,2), ML(8,7) and ML(8,8) being the inputs and outlet links OL1-OL2 being the outputs.

The switches, corresponding to the middle stages that are placed together are implemented as four two by two switches. For example middle switches MS(1,1), MS(1,17), MS(7,1), and MS(7,17) are placed together; so middle switch MS(1,1) is implemented as two by two switch with middle links ML(1,1) and ML(1,7) being the inputs and middle links ML(2,1) and ML(2,3) being the outputs; middle switch MS(1,17) is implemented as two by two switch with the middle links ML(1,2) and ML(1,8) being the inputs and middle links ML(2,2) and ML(2,4) being the outputs; middle switch MS(7,1) is implemented as two by two switch with middle links ML(7,1) and ML(7,11) being the inputs and middle links ML(8,1) and ML(8,3) being the outputs; And middle switch MS(7,17) is implemented as two by two switch with the middle links ML(7,2) and ML(7,12) being the inputs and middle links ML(8,2) and ML(8,4) being the outputs; Similarly in this embodiment of network 100B all the switches that are placed together are implemented as separate switches.

Layout diagrams 100C in FIG. 1C, 100D in FIG. 1D, 100E in FIG. 1E, 100F in FIG. 1G are also applicable to generalized folded multi-stage network $V_{fold}(N_1,N_2,d,s)$ where $N_1=N_2=32$; d=2; and s=2 with nine stages. The layout 100C in FIG. 1C can be recursively extended for any arbitrarily large generalized folded multi-stage network $V_{fold}(N_1,N_2,d,s)$. Accordingly layout 100H of FIG. 1H is also applicable to generalized folded multi-stage network $V_{fold}(N_1,N_2,d,s)$.

Figure 1K:
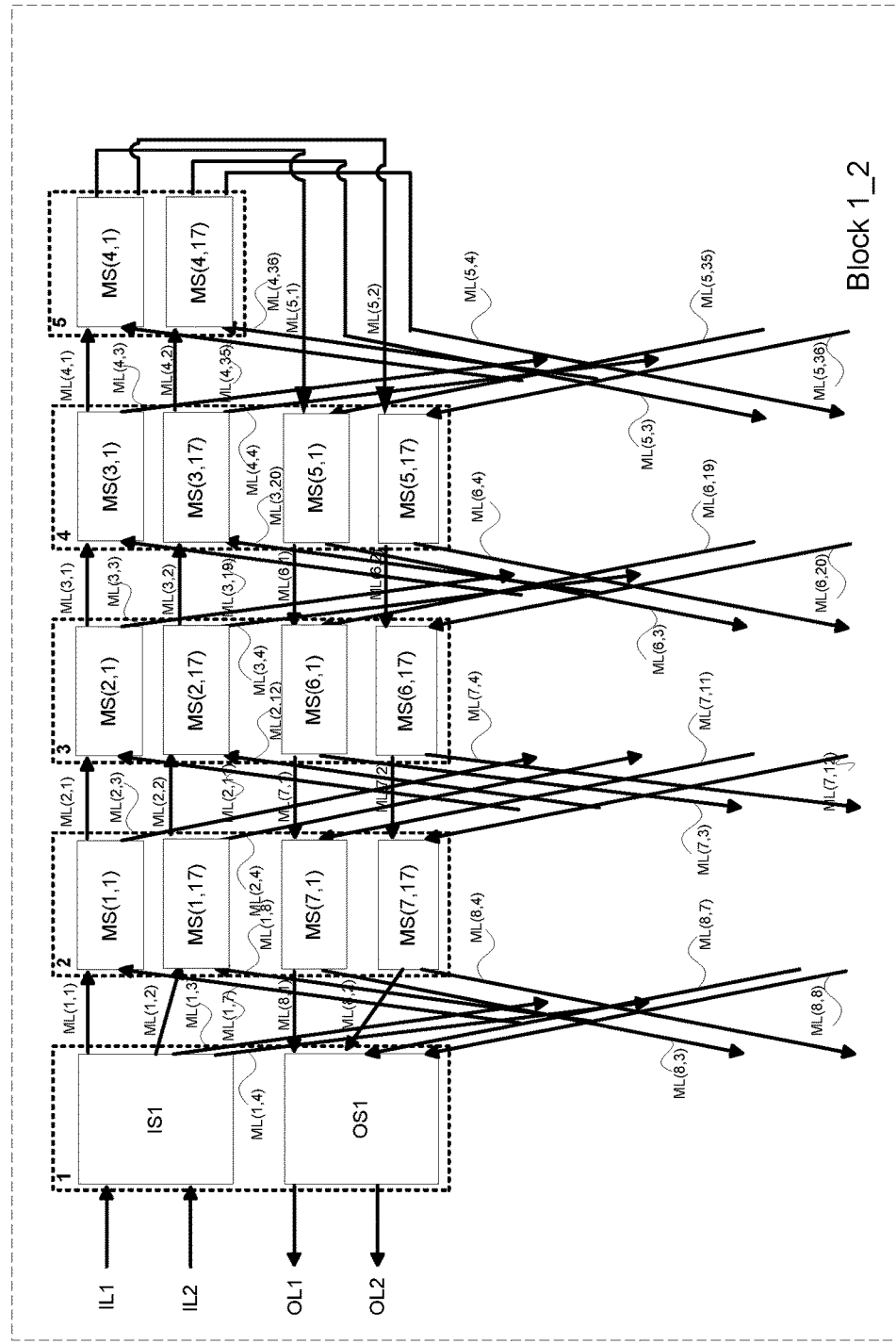
FIG. 1K is a diagram 100K detailed connections of BLOCK 1_2 in the network layout 100C in one embodiment, illustrating the connection links going in and coming out when the layout 100C is implementing $V(N,d,s)$ or $V_{fold}(N,d,s)$.

Referring to diagram 100K of FIG. 1K illustrates a high-level implementation of Block 1_2 (Each of the other blocks have similar implementation) of the layout 100C of FIG. 1C which represents a generalized folded multi-stage network $V_{fold}(N_1,N_2,d,s)$ where $N_1=N_2=32$; d=2; and s=2. Block 1_2 in 100K illustrates both the intra-block and inter-block links. The layout diagram 100K corresponds to the embodiment where the switches that are placed together are implemented as separate switches in the network 100B of FIG. 1B. As noted before then the network 100B is the generalized folded multi-stage network $V_{fold}(N_1,N_2,d,s)$ where $N_1=N_2=32$; d=2; and s=2 with nine stages as disclosed in U.S. Provisional Patent Application Ser. No. 60/940,391 that is incorporated by reference above.

That is the switches that are placed together in Block 1_2 as shown in FIG. 1K are namely the input switch IS1 and output switch OS1 belonging to switch 1, illustrated by dotted lines, (as noted before switch 1 is for illustration purposes only, in practice the switches implemented are input switch IS1 and output switch OS1); middle switches MS(1,1), MS(1,17), MS(7,1) and MS(7,17) belonging to switch 2; middle switches MS(2,1), MS(2,17), MS(6,1) and MS(6,17) belonging to switch 3; middle switches MS(3,1), MS(3,17), MS(5,1) and MS(5,17) belonging to switch 4; And middle switches MS(4,1), and MS(4,17) belonging to switch 5.

Input switch IS1 and output switch OS1 are placed together; so input switch IS1 is implemented as two by four switch with the inlet links IL1 and IL2 being the inputs and middle links ML(1,1)-ML(1,4) being the outputs; and output switch OS1 is implemented as four by two switch with the middle links ML(8,1), ML(8,2), ML(8,7) and ML(8,8) being the inputs and outlet links OL1-OL2 being the outputs.

Middle switches MS(1,1), MS(1,17), MS(7,1), and MS(7,17) are placed together; so middle switch MS(1,1) is implemented as two by two switch with middle links ML(1,1) and ML(1,7) being the inputs and middle links ML(2,1) and ML(2,3) being the outputs; middle switch MS(1,17) is implemented as two by two switch with the middle links ML(1,2) and ML(1,8) being the inputs and middle links ML(2,2) and ML(2,4) being the outputs; middle switch MS(7,1) is implemented as two by two switch with middle links ML(7,1) and ML(7,11) being the inputs and middle links ML(8,1) and ML(8,3) being the outputs; And middle switch MS(7,17) is implemented as two by two switch with the middle links ML(7,2) and ML(7,12) being the inputs and middle links ML(8,2) and ML(8,4) being the outputs. Similarly all the other middle switches are also implemented as two by two switches as illustrated in 100K of FIG. 1K.

Generalized Multi-Stage Network Embodiment with S=1:

In one embodiment, in the network 100B of FIG. 1B (where it is implemented with s=1), the switches that are placed together are implemented as two separate switches in input stage 110 and output stage 120; and as two separate switches in all the middle stages, then the network 100B is the generalized folded multi-stage network $V_{fold}(N_1,N_2,d,s)$ where $N_1=N_2=32$; d=2; and s=1 with nine stages as disclosed in U.S. Provisional Patent Application Ser. No. 60/940,391 that is incorporated by reference above. That is the switches that are placed together in input stage 110 and output stage 120 are implemented as two, two by two switches. For example the switch input switch IS1 and output switch OS1 are placed together; so input switch IS1 is implemented as two by two switch with the inlet links IL1 and IL2 being the inputs and middle links ML(1,1)-ML(1,2) being the outputs; and output switch OS1 is implemented as two by two switch with the middle links ML(8,1) and ML(8,3) being the inputs and outlet links OL1-OL2 being the outputs.

The switches, corresponding to the middle stages that are placed together are implemented as two, two by two switches. For example middle switches MS(1,1) and MS(7,1) are placed together; so middle switch MS(1,1) is implemented as two by two switch with middle links ML(1,1) and ML(1,3) being the inputs and middle links ML(2,1) and ML(2,2) being the outputs; middle switch MS(7,1) is implemented as two by two switch with middle links ML(7,1) and ML(7,5) being the inputs and middle links ML(8,1) and ML(8,2) being the outputs; Similarly in this embodiment of network 100B all the switches that are placed together are implemented as two separate switches.

Layout diagrams 100C in FIG. 1C, 100D in FIG. 1D, 100E in FIG. 1E, 100F in FIG. 1G are also applicable to generalized folded multi-stage network $V_{fold}(N_1,N_2,d,s)$ where $N_1=N_2=32$; d=2; and s=1 with nine stages. The layout 100C in FIG. 1C can be recursively extended for any arbitrarily large generalized folded multi-stage network $V_{fold}(N_1,N_2,d,s)$. Accordingly layout 100H of FIG. 1H is also applicable to generalized folded multi-stage network $V_{fold}(N_1,N_2,d,s)$.

Referring to diagram 100K1 of FIG. 1K1 illustrates a high-level implementation of Block 1_2 (Each of the other blocks have similar implementation) for the layout 100C of FIG. 1C when s=1 which represents a generalized folded multi-stage network $V_{fold}(N_1,N_2,d,s)$ where $N_1=N_2=32$; d=2; and s=1 (All the double links are replaced by single links when s=1). Block 1_2 in 100K1 illustrates both the intra-block and inter-block links. The layout diagram 100K1 corresponds to the embodiment where the switches that are placed together are implemented as separate switches in the network 100B of FIG. 1B when s=1. As noted before then the network 100B is the generalized folded multi-stage network $V_{fold}(N_1,N_2,d,s)$ where $N_1=N_2=32$; d=2; and s=1 with nine stages as disclosed in U.S. Provisional Patent Application Ser. No. 60/940,391 that is incorporated by reference above.

That is the switches that are placed together in Block 1_2 as shown in FIG. 1K1 are namely the input switch IS1 and output switch OS1 belonging to switch 1, illustrated by dotted lines, (as noted before switch 1 is for illustration purposes only, in practice the switches implemented are input switch IS1 and output switch OS1); middle switches MS(1,1) and MS(7,1) belonging to switch 2; middle switches MS(2,1) and MS(6,1) belonging to switch 3; middle switches MS(3,1) and MS(5,1) belonging to switch 4; And middle switch MS(4,1) belonging to switch 5.

Input switch IS1 and output switch OS1 are placed together; so input switch IS1 is implemented as two by two switch with the inlet links IL1 and IL2 being the inputs and middle links ML(1,1)-ML(1,2) being the outputs; and output switch OS1 is implemented as two by two switch with the middle links ML(8,1) and ML(8,3) being the inputs and outlet links OL1-OL2 being the outputs.

Middle switches MS(1,1) and MS(7,1) are placed together; so middle switch MS(1,1) is implemented as two by two switch with middle links ML(1,1) and ML(1,3) being the inputs and middle links ML(2,1) and ML(2,2) being the outputs; And middle switch MS(7,1) is implemented as two by two switch with middle links ML(7,1) and ML(7,5) being the inputs and middle links ML(8,1) and ML(8,2) being the outputs. Similarly all the other middle switches are also implemented as two by two switches as illustrated in 100K1 of FIG. 1K1.

Generalized Butterfly Fat Tree Network Embodiment:

In another embodiment in the network 100B of FIG. 1B, the switches that are placed together are implemented as two combined switches then the network 100B is the generalized butterfly fat tree network $V_{bft}(N_1,N_2,d,s)$ where $N_1=N_2=32$; d=2; and s=2 with five stages as disclosed in U.S. Provisional Patent Application Ser. No. 60/940,387 that is incorporated by reference above. That is the switches that are placed together in input stage 110 and output stage 120 are implemented as a six by six switch. For example the input switch IS1 and output switch OS1 are placed together; so input output switch IS1&OS1 are implemented as a six by six switch with the inlet links IL1, IL2, ML(8,1), ML(8,2), ML(8,7) and ML(8,8) being the inputs of the combined switch (denoted as IS1&OS1) and middle links ML(1,1), ML(1,2), ML(1,3), ML(1,4), OL1 and OL2 being the outputs of the combined switch IS1&OS1.

The switches, corresponding to the middle stages that are placed together are implemented as two four by four switches. For example middle switches MS(1,1) and MS(1,17) are placed together; so middle switch MS(1,1) is implemented as four by four switch with middle links ML(1,1), ML(1,7), ML(7,1) and ML(7,11) being the inputs and middle links ML(2,1), ML(2,3), ML(8,1) and ML(8,3) being the outputs; middle switch MS(1,17) is implemented as four by four switch with the middle links ML(1,2), ML(1,8), ML(7,2) and ML(7,12) being the inputs and middle links ML(2,2), ML(2,4), ML(8,2) and ML(8,4) being the outputs. Similarly in this embodiment of network 100B all the switches that are placed together are implemented as a two combined switches.

Layout diagrams 100C in FIG. 1C, 100D in FIG. 1D, 100E in FIG. 1E, 100F in FIG. 1G are also applicable to generalized butterfly fat tree network $V_{bft}(N_1,N_2,d,s)$ where $N_1=N_2=32$; d=2; and s=2 with five stages. The layout 100C in FIG. 1C can be recursively extended for any arbitrarily large generalized butterfly fat tree network $V_{bft}(N_1,N_2,d,s)$. Accordingly layout 100H of FIG. 1H is also applicable to generalized butterfly fat tree network $V_{bft}(N_1,N_2,d,s)$.

Figure 1L:
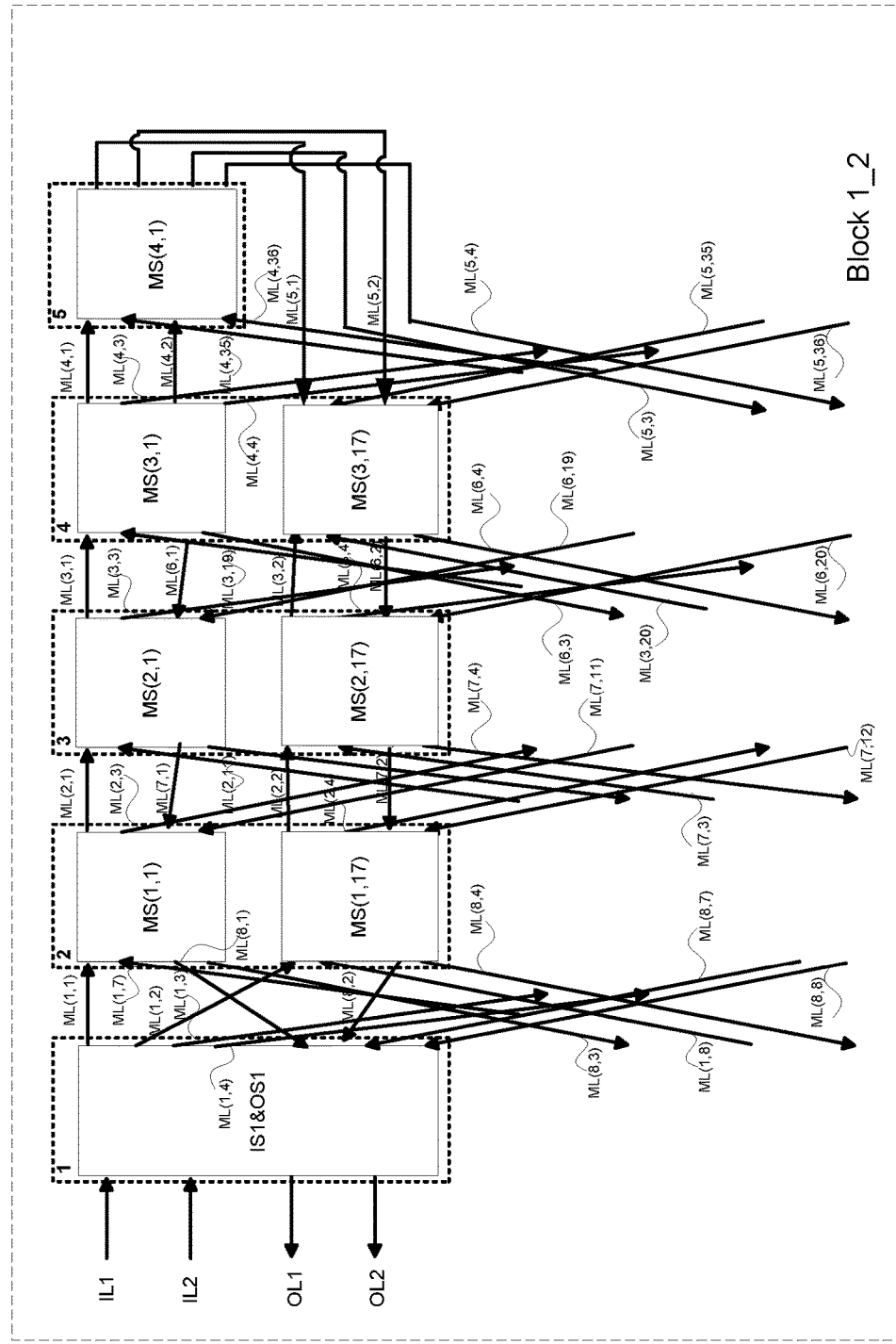
FIG. 1L is a diagram 100L detailed connections of BLOCK 1_2 in the network layout 100C in one embodiment, illustrating the connection links going in and coming out when the layout 100C is implementing $V_{bft}(N,d,s)$.

Referring to diagram 100L of FIG. 1L illustrates a high-level implementation of Block 1_2 (Each of the other blocks have similar implementation) of the layout 100C of FIG. 1C which represents a generalized butterfly fat tree network $V_{bft}(N_1,N_2,d,s)$ where $N_1=N_2=32$; d=2; and s=2. Block 1_2 in 100L illustrates both the intra-block and inter-block links. The layout diagram 100L corresponds to the embodiment where the switches that are placed together are implemented as two combined switches in the network 100B of FIG. 1B. As noted before then the network 100B is the generalized butterfly fat tree network $V_{bft}(N_1,N_2,d,s)$ where $N_1=N_2=32$;

d=2; and s=2 with five stages as disclosed in U.S. Provisional Patent Application Ser. No. 60/940,387 that is incorporated by reference above.

That is the switches that are placed together in Block 1_2 as shown in FIG. 1L are namely the combined input and output switch IS1&OS1 belonging to switch 1, illustrated by dotted lines, (as noted before switch 1 is for illustration purposes only, in practice the switch implemented is combined input and output switch IS1&OS1); middle switch MS(1,1) and MS(1,17) belonging to switch 2; middle switch MS(2,1) and MS(2,17) belonging to switch 3; middle switch MS(3,1) and MS(3,17) belonging to switch 4; And middle switch MS(4,1) belonging to switch 5.

Combined input and output switch IS1&OS1 is implemented as six by six switch with the inlet links IL1, IL2, ML(8,1), ML(8,2), ML(8,7) and ML(8,8) being the inputs and middle links ML(1,1)-ML(1,4) and outlet links OL1-OL2 being the outputs.

Middle switch MS(1,1) is implemented as four by four switch with middle links ML(1,1), ML(1,7), ML(7,1) and ML(7,11) being the inputs and middle links ML(2,1), ML(2,3), ML(8,1) and ML(8,3) being the outputs; And middle switch MS(1,17) is implemented as four by four switch with the middle links ML(1,2), ML(1,8), ML(7,2) and ML(7,12) being the inputs and middle links ML(2,2), ML(2,4), ML(8,2) and ML(8,4) being the outputs. Similarly all the other middle switches are also implemented as two four by four switches as illustrated in 100L of FIG. 1L.

In another embodiment, middle switch MS(1,1) (or the middle switches in any of the middle stage excepting the root middle stage) of Block 1_2 of $V_{mlink-bft}(N_1,N_2,d,s)$ can be implemented as a two by four switch and a two by two switch to save cross points. This is because the left going middle links of these middle switches are never setup to the right going middle links. For example, in middle switch MS(1,1) of Block 1_2 as shown FIG. 1L, the left going middle links namely ML(7,1) and ML(7,11) are never switched to the right going middle links ML(2,1) and ML(2,3). And hence to implement MS(1,1) two switches namely: 1) a two by four switch with the middle links ML(1,1) and ML(1,7) as inputs and the middle links ML(2,1), ML(2,3), ML(8,1), and ML(8,3) as outputs and 2) a two by two switch with the middle links ML(7,1) and ML(7,11) as inputs and the middle links ML(8,1) and ML(8,3) as outputs are sufficient without loosing any connectivity of the embodiment of MS(1,1) being implemented as an eight by eight switch as described before.)

Generalized Butterfly Fat Tree Network Embodiment with S=1:

In one embodiment, in the network 100B of FIG. 1B (where it is implemented with s=1), the switches that are placed together are implemented as a combined switch in input stage 110 and output stage 120; and as a combined switch in all the middle stages, then the network 100B is the generalized butterfly fat tree network $V_{bft}(N_1,N_2,d,s)$ where $N_1=N_2=32$; d=2; and s=1 with five stages as disclosed in U.S. Provisional Patent Application Ser. No. 60/940,387 that is incorporated by reference above. That is the switches that are placed together in input stage 110 and output stage 120 are implemented as a four by four switch. For example the switch input switch IS1 and output switch OS1 are placed together; so input and output switch IS1&OS1 is implemented as four by four switch with the inlet links IL1, IL2, ML(8,1) and ML(8,3) being the inputs and middle links ML(1,1)-ML(1,2) and outlet links OL1-OL2 being the outputs The switches, corresponding to the middle stages that are placed together are implemented as a four by four switch. For example middle switches MS(1,1) is implemented as four by four switch with middle links ML(1,1), ML(1,3), ML(7,1) and ML(7,5) being the inputs and middle links ML(2,1), ML(2,2), ML(8,1) and ML(8,2) being the outputs.

Layout diagrams 100C in FIG. 1C, 100D in FIG. 1D, 100E in FIG. 1E, 100F in FIG. 1G are also applicable to generalized butterfly fat tree network $V_{bft}(N_1,N_2,d,s)$ where $N_1=N_2=32$; d=2; and s=1 with five stages. The layout 100C in FIG. 1C can be recursively extended for any arbitrarily large generalized butterfly fat tree network $V_{bft}(N_1,N_2,d,s)$. Accordingly layout 100H of FIG. 1H is also applicable to generalized butterfly fat tree network $V_{bft}(N_1,N_2,d,s)$.

Referring to diagram 100L1 of FIG. 1L1 illustrates a high-level implementation of Block 1_2 (Each of the other blocks have similar implementation) for the layout 100C of FIG. 1C when s=1 which represents a generalized butterfly fat tree network $V_{bft}(N_1,N_2,d,s)$ where $N_1=N_2=32$; d=2; and s=1 (All the double links are replaced by single links when s=1). Block 1_2 in 100K1 illustrates both the intra-block and inter-block links. The layout diagram 100L1 corresponds to the embodiment where the switches that are placed together are implemented as a combined switch in the network 100B of FIG. 1B when s=1. As noted before then the network 100B is the generalized butterfly fat tree network $V_{bft}(N_1,N_2,d,s)$ where $N_1=N_2=32$; d=2; and s=1 with nine stages as disclosed in U.S. Provisional Patent Application Ser. No. 60/940,387 that is incorporated by reference above.

That is the switches that are placed together in Block 1_2 as shown in FIG. 1L1 are namely the input and output switch IS1&OS1 belonging to switch 1, illustrated by dotted lines, (as noted before switch 1 is for illustration purposes only, in practice the switches implemented are input switch IS1 and output switch OS1); middle switch MS(1,1) belonging to switch 2; middle switch MS(2,1) belonging to switch 3; middle switch MS(3,1) belonging to switch 4; And middle switch MS(4,1) belonging to switch 5.

Input and output switch IS1&OS1 are placed together; so input and output switch IS1&OS1 is implemented as four by four switch with the inlet links IL1, IL2, ML(8,1) and ML(8,3) being the inputs and middle links ML(1,1)-ML(1,2) and outlet links OL1-OL2 being the outputs.

Middle switch MS(1,1) is implemented as four by four switch with middle links ML(1,1), ML(1,3), ML(7,1) and ML(7,5) being the inputs and middle links ML(2,1), ML(2,2), ML(8,1) and ML(8,2) being the outputs. Similarly all the other middle switches are also implemented as four by four switches as illustrated in 100L1 of FIG. 1L1.

In another embodiment, middle switch MS(1,1) (or the middle switches in any of the middle stage excepting the root middle stage) of Block 1_2 of $V_{mlink-bft}(N_1,N_2,d,s)$ can be implemented as a two by four switch and a two by two switch to save cross points. This is because the left going middle links of these middle switches are never setup to the right going middle links. For example, in middle switch MS(1,1) of Block 1_2 as shown FIG. 1L1, the left going middle links namely ML(7,1) and ML(7,5) are never switched to the right going middle links ML(2,1) and ML(2,2). And hence to implement MS(1,1) two switches namely: 1) a two by four switch with the middle links ML(1,1) and ML(1,3) as inputs and the middle links ML(2,1), ML(2,2), ML(8,1), and ML(8,2) as outputs and 2) a two by two switch with the middle links ML(7,1) and ML(7,5) as inputs and the middle links ML(8,1) and ML(8,2) as outputs are sufficient without loosing any connectivity of the embodiment of MS(1,1) being implemented as an eight by eight switch as described before.)

Figure 2A:
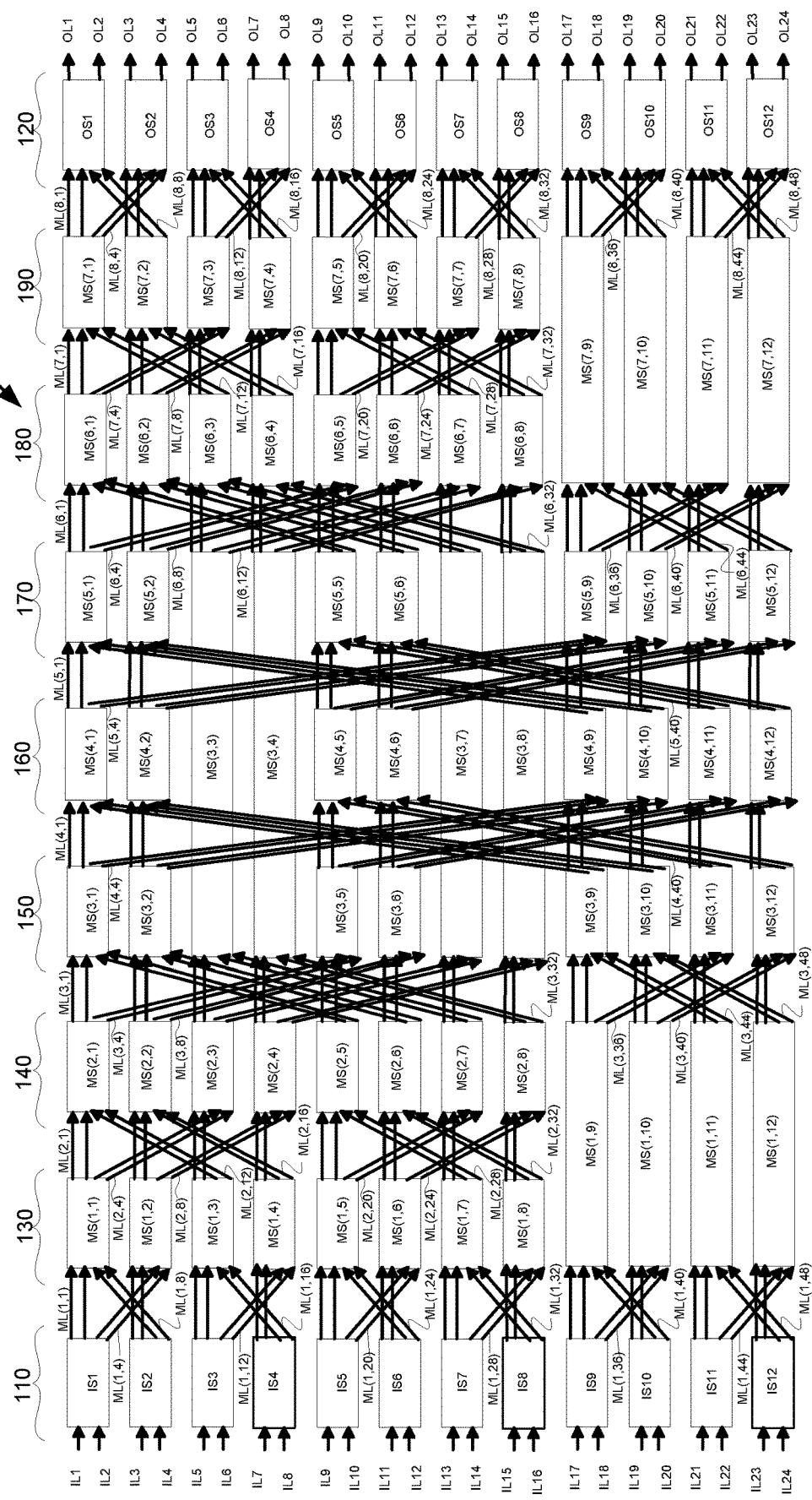
FIG. 2A is a diagram 200A of an exemplary symmetrical multi-link multi-stage network $V_{fold-mlink}(N,d,s)$ having inverse Benes connection topology of nine stages with N=24, d=2 and s=2, strictly nonblocking network for unicast connections and rearrangeably nonblocking network for arbitrary fan-out multicast connections, in accordance with the invention.

Symmetric RNB Generalized Multi-Link Multi-Stage Network $V_{mlink}(N_1,N_2,d,s)$, Connection Topology with $N_1 \ne 2^x$ & $N_2 \ne 2^y$ where x and y are Integers:

Referring to diagram 200A in FIG. 2A, in one embodiment, an exemplary generalized multi-link multi-stage network $V_{mlink}(N_1,N_2,d,s)$ where $N_1=N_2=24$ and $2^4<N=24<2^5$; d=2; and s=2 with nine stages of ninety two switches for satisfying communication requests, such as setting up a telephone call or a data call, or a connection between configurable logic blocks, between an input stage 110 and output stage 120 via middle stages 130, 140, 150, 160, 170, 180 and 190 is shown where input stage 110 consists of twelve, two by four switches IS1-IS12 and output stage 120 consists of twelve, four by two switches OS1-OS12. And the middle stages namely the middle stage 130 consists of twelve, four by four switches MS(1,1)-MS(1,12), middle stage 140 consists of eight, four by four switches MS(2,1)-MS(2,8), middle stage 180 consists of eight, four by four switches MS(6,1)-MS(6,8), and middle stage 190 consists of twelve, four by four switches MS(7,1)-MS(7,12); middle stage 150 consists of twelve, four by four switches MS(3,1)-MS(3,12), middle stage 160 consists of eight, four by four switches MS(4,1)-MS(4,2), MS(4,5)-MS(4,6), MS(4,9)-MS(4,12), middle stage 170 consists of eight, four by four switches MS(5,1)-MS(5,2), MS(5,5)-MS(5,6), MS(5,9)-MS(5,12).

Such a generalized multi-link multi-stage network $V_{mlink}(N_1,N_2,d,s)$ where $N_1 \ne 2^x$ & $N_2 \ne 2^y$ where x and y are integers, can be operated in rearrangeably non-blocking manner for arbitrary fan-out multicast connections and also can be operated in strictly non-blocking manner for unicast connections, just the same way as when $N_1=2^x$ & $N_2=2^y$ where x and y are integers, as disclosed in U.S. Provisional Patent Application Ser. No. 60/940,389 that is incorporated by reference above.

In one embodiment of this network each of the input switches IS1-IS12 and output switches OS1-OS12 are crossbar switches. The number of switches of input stage 110 and of output stage 120 can be denoted in general with the variable $$\frac{N}{d},$$

where N is the total number of inlet links or outlet links. The number of middle switches in each middle stage is denoted by a maximum of $$\frac{N}{d}.$$

The size of each input switch IS1-IS12 can be denoted in general with the notation d*2d and each output switch OS1-OS12 can be denoted in general with the notation 2d*d. Likewise, the size of each switch in any of the middle stages can be denoted as 2d*2d. A switch as used herein can be either a crossbar switch, or a network of switches each of which in turn may be a crossbar switch or a network of switches. A symmetric multi-stage network can be represented with the notation $V_{mlink}(N,d,s)$, where N represents the total number of inlet links of all input switches (for example the links IL1-IL32), d represents the inlet links of each input switch or outlet links of each output switch, and s is the ratio of number of outgoing links from each input switch to the inlet links of each input switch.

Each of the $$\frac{N}{d}$$

input switches IS1-IS12 are connected to exactly d switches in middle stage 130 through two links each for a total of 2×d links (for example input switch IS1 is connected to middle switch MS(1,1) through the middle links ML(1,1), ML(1,2), and also connected to middle switch MS(1,2) through the middle links ML(1,3) and ML(1,4)). Just the same way as defined before, the middle links which connect switches in the same row in two successive middle stages are called hereinafter straight middle links; and the middle links which connect switches in different rows in two successive middle stages are called hereinafter cross middle links. For example, the middle links ML(1,1) and ML(1,2) connect input switch IS1 and middle switch MS(1,1), so middle links ML(1,1) and ML(1,2) are straight middle links; where as the middle links ML(1,3) and ML(1,4) connect input switch IS1 and middle switch MS(1,2), since input switch IS1 and middle switch MS(1,2) belong to two different rows in diagram 100A of FIG. 1A, middle links ML(1,3) and ML(1,4) are cross middle links.

Each of the $$\frac{N}{d}$$

middle switches MS(1,1)-MS(1,12) in the middle stage 130 are connected from exactly d input switches through two links each for a total of 2×d links (for example the middle links ML(1,1) and ML(1,2) are connected to the middle switch MS(1,1) from input switch IS1, and the middle links ML(1,7) and ML(1,8) are connected to the middle switch MS(1,1) from input switch IS2). Each of the middle switches MS(1,1)-MS(1,8) are connected to exactly d switches in middle stage 140 through two links each for a total of 2×d links (for example the middle links ML(2,1) and ML(2,2) are connected from middle switch MS(1,1) to middle switch MS(2,1), and the middle links ML(2,3) and ML(2,4) are connected from middle switch MS(1,1) to middle switch MS(2,3)); and each of the middle switches MS(1,9)-MS(1,12) are connected to exactly d switches in middle stage 150 through two links each for a total of 2×d links (for example the middle links ML(3,33) and ML(3,34) are connected from middle switch MS(1,9) to middle switch MS(3,9), and the middle links ML(3,35) and ML(3,36) are connected from middle switch MS(1,9) to middle switch MS(3,11)).

Each of the middle switches MS(2,1)-MS(2,8) in the middle stage 140 are connected from exactly d middle switches in middle stage 130 through two links each for a total of 2×d links (for example the middle links ML(2,1) and ML(2,2) are connected to the middle switch MS(2,1) from input switch MS(1,1), and the middle links ML(1,11) and ML(1,12) are connected to the middle switch MS(2,1) from input switch MS(1,3)) and also are connected to exactly d switches in middle stage 150 through two links each for a total of 2×d links (for example the middle links ML(3,1) and ML(3,2) are connected from middle switch MS(2,1) to middle switch MS(3,1), and the middle links ML(3,3) and ML(3,4) are connected from middle switch MS(2,1) to middle switch MS(3,5)).

Each of the $$\frac{N}{d}$$

middle switches MS(3,1)-MS(3,12) in the middle stage 150 are connected from exactly d middle switches in middle stage 140 through two links each for a total of 2×d links (for example the middle links ML(3,1) and ML(3,2) are connected to the middle switch MS(3,1) from input switch MS(2,1), and the middle links ML(2,19) and ML(2,20) are connected to the middle switch MS(3,1) from input switch MS(2,5)). Each of the middle switches MS(3,1)-MS(3,2), MS(3,5)-MS(3,6) and MS(3,9)-MS(3,12) are connected to exactly d switches in middle stage 160 through two links each for a total of 2×d links (for example the middle links ML(4,1) and ML(4,2) are connected from middle switch MS(3,1) to middle switch MS(4,1), and the middle links ML(4,3) and ML(4,4) are connected from middle switch MS(3,1) to middle switch MS(4,9)); and each of the middle switches MS(3,3)-MS(3,4) and MS(3,7)-MS(3,8) are connected to exactly d switches in middle stage 180 through two links each for a total of 2×d links (for example the middle links ML(6,9) and ML(6,10) are connected from middle switch MS(3,3) to middle switch MS(6,3), and the middle links ML(6,11) and ML(6,12) are connected from middle switch MS(3,3) to middle switch MS(6,7)).

Each of the middle switches MS(4,1)-MS(4,2), MS(4,5)-MS(4,6) and MS(4,9)-MS(4,12) in the middle stage 160 are connected from exactly d middle switches in middle stage 150 through two links each for a total of 2×d links (for example the middle links ML(4,1) and ML(4,2) are connected to the middle switch MS(4,1) from input switch MS(3,1), and the middle links ML(4,35) and ML(4,36) are connected to the middle switch MS(4,1) from input switch MS(3,9)) and also are connected to exactly d switches in middle stage 170 through two links each for a total of 2×d links (for example the middle links ML(5,1) and ML(5,2) are connected from middle switch MS(4,1) to middle switch MS(5,1), and the middle links ML(5,3) and ML(5,4) are connected from middle switch MS(4,1) to middle switch MS(5,9)).

Each of the middle switches MS(5,1)-MS(5,2), MS(5,5)-MS(5,6) and MS(5,9)-MS(5,12) in the middle stage 170 are connected from exactly d middle switches in middle stage 160 through two links each for a total of 2×d links (for example the middle links ML(5,1) and ML(5,2) are connected to the middle switch MS(5,1) from input switch MS(4,1), and the middle links ML(5,35) and ML(5,36) are connected to the middle switch MS(5,1) from input switch MS(4,9)). Each of the middle switches MS(5,1)-MS(5,2), MS(5,5)-MS(5,6) are connected to exactly d switches in middle stage 180 through two links each for a total of 2×d links (for example the middle links ML(6,1) and ML(6,2) are connected from middle switch MS(5,1) to middle switch MS(6,1), and the middle links ML(6,3) and ML(6,4) are connected from middle switch MS(5,1) to middle switch MS(6,5)); and Each of the middle switches MS(5,9)-MS(5,12) are connected to exactly d switches in middle stage 190 through two links each for a total of 2×d links (for example the middle links ML(6,33) and ML(6,34) are connected from middle switch MS(5,9) to middle switch MS(7,9), and the middle links ML(6,35) and ML(6,36) are connected from middle switch MS(5,9) to middle switch MS(7,11)).

Each of the $$\frac{N}{d}$$

middle switches MS(6,1)-MS(6,8) in the middle stage 180 are connected from exactly d middle switches in middle stage 170 through two links each for a total of 2×d links (for example the middle links ML(6,1) and ML(6,2) are connected to the middle switch MS(6,1) from input switch MS(5,1), and the middle links ML(6,19) and ML(6,20) are connected to the middle switch MS(6,1) from input switch MS(5,5)) and also are connected to exactly d switches in middle stage 190 through two links each for a total of 2×d links (for example the middle links ML(7,1) and ML(7,2) are connected from middle switch MS(6,1) to middle switch MS(7,1), and the middle links ML(7,3) and ML(7,4) are connected from middle switch MS(6,1) to middle switch MS(7,3)).

Each of the $$\frac{N}{d}$$

middle switches MS(7,1)-MS(7,12) in the middle stage 190 are connected from exactly d middle switches in middle stage 180 through two links each for a total of 2×d links (for example the middle links ML(7,1) and ML(7,2) are connected to the middle switch MS(7,1) from input switch MS(6,1), and the middle links ML(7,11) and ML(7,12) are connected to the middle switch MS(7,1) from input switch MS(6,3)) and also are connected to exactly d switches in middle stage 120 through two links each for a total of 2×d links (for example the middle links ML(8,1) and ML(8,2) are connected from middle switch MS(7,1) to middle switch MS(8,1), and the middle links ML(8,3) and ML(8,4) are connected from middle switch MS(7,1) to middle switch OS2).

Each of the $$\frac{N}{d}$$

middle switches OS1-OS12 in the middle stage 120 are connected from exactly d middle switches in middle stage 190 through two links each for a total of 2×d links (for example the middle links ML(8,1) and ML(8,2) are connected to the output switch OS1 from input switch MS(7,1), and the middle links ML(8,7) and ML(8,8) are connected to the output switch OS1 from input switch MS(7,2)).

Figure 2B:
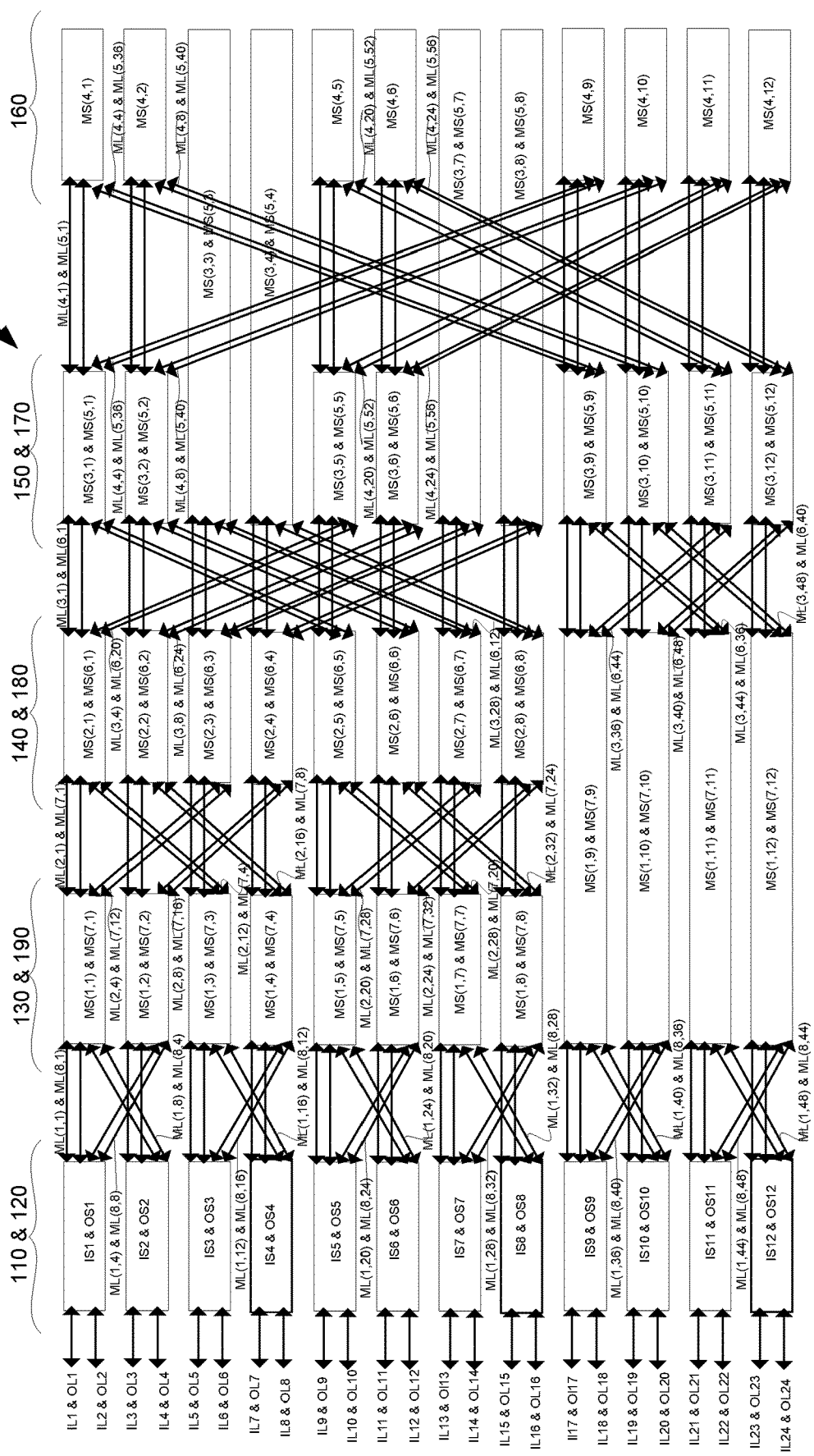
FIG. 2B is a diagram 200B of the equivalent symmetrical folded multi-link multi-stage network $V_{fold-mlink}(N,d,s)$ of the network 200A shown in FIG. 2A, having inverse Benes connection topology of five stages with N=24, d=2 and s=2, strictly nonblocking network for unicast connections and rearrangeably nonblocking network for arbitrary fan-out multicast connections, in accordance with the invention.

Referring to diagram 200B in FIG. 2B, is a folded version of the multi-link multi-stage network 200A shown in FIG. 2A. The network 200B in FIG. 2B shows input stage 110 and output stage 120 are placed together. That is input switch IS1 and output switch OS1 are placed together, input switch IS2 and output switch OS2 are placed together, and similarly input switch IS12 and output switch OS12 are placed together. All the right going links {i.e., inlet links IL1-IL24 and middle links ML(1,1)-ML(1,48)} correspond to input switches IS1-IS12, and all the left going links {i.e., middle links ML(8,1)-ML(8,48) and outlet links OL1-OL24} correspond to output switches OS1-OS12.

Middle stage 130 and middle stage 190 are placed together. That is middle switches MS(1,1) and MS(7,1) are placed together, middle switches MS(1,2) and MS(7,2) are placed together, and similarly middle switches MS(1,12) and MS(7,12) are placed together. All the right going middle links {i.e., middle links ML(1,1)-ML(1,48) and middle links ML(2,1)-ML(2,32) and the middle links ML(3,33)-ML(3, 48)} correspond to middle switches MS(1,1)-MS(1,12), and all the left going middle links {i.e., middle links ML(7,1)-ML(7,32) and middle links ML(6,33)-ML(6,48) and middle links ML(8,1) and ML(8,48)} correspond to middle switches MS(7,1)-MS(7,12).

Middle stage 140 and middle stage 180 are placed together. That is middle switches MS(2,1) and MS(6,1) are placed together, middle switches MS(2,2) and MS(6,2) are placed together, and similarly middle switches MS(2,8) and MS(6,8) are placed together. All the right going middle links {i.e., middle links ML(2,1)-ML(2,48) and middle links ML(3,1)-ML(3,48)} correspond to middle switches MS(2, 1)-MS(2,8), and all the left going middle links {i.e., middle links ML(6,1)-ML(6,48) and middle links ML(7,1) and ML(7,48)} correspond to middle switches MS(6,1)-MS(6, 8).

Middle stage 150 and middle stage 170 are placed together. That is middle switches MS(3,1) and MS(5,1) are placed together, middle switches MS(3,2) and MS(5,2) are placed together, and similarly middle switches MS(3,12) and MS(5,12) are placed together. All the right going middle links {i.e., middle links ML(3,1)-ML(3,48) and middle links ML(4,1)-ML(4,48} correspond to middle switches MS(3, 1)-MS(3,12), and all the left going middle links {i.e., middle links ML(5,1)-ML(5,48 and middle links ML(6,1) and ML(6,48} correspond to middle switches MS(5,1)-MS(5, 12).

Middle stage 160 is placed alone. All the right going middle links are the middle links ML(4,1)-ML(4,8), ML(4, 17)-ML(4,24) and ML(4,33)-ML(4,48) and all the left going middle links are middle links ML(5,1)-ML(5,8), ML(5,17)-ML(5,24) and ML(5,33)-ML(5,48).

In one embodiment, in the network 200B of FIG. 2B, the switches that are placed together are implemented as separate switches then the network 200B is the generalized folded multi-link multi-stage network $V_{fold-mlink}(N_1,N_2,d,s)$ where $N_1=N_2=24$; $d=2$; and $s=2$ with nine stages as disclosed in U.S. Provisional Patent Application Ser. No. 60/940,389 that is incorporated by reference above. That is the switches that are placed together in input stage 110 and output stage 120 are implemented as a two by four switch and a four by two switch. For example the input switch IS1 and output switch OS1 are placed together; so input switch IS1 is implemented as two by four switch with the inlet links IL1 and IL2 being the inputs of the input switch IS1 and middle links ML(1,1)-ML(1,4) being the outputs of the input switch IS1; and output switch OS1 is implemented as four by two switch with the middle links ML(8,1), ML(8,2), ML(8,7) and ML(8,8) being the inputs of the output switch OS1 and outlet links OL1-OL2 being the outputs of the output switch OS1. Similarly in this embodiment of network 200B all the switches that are placed together in each middle stage are implemented as separate switches.

Figure 2C:
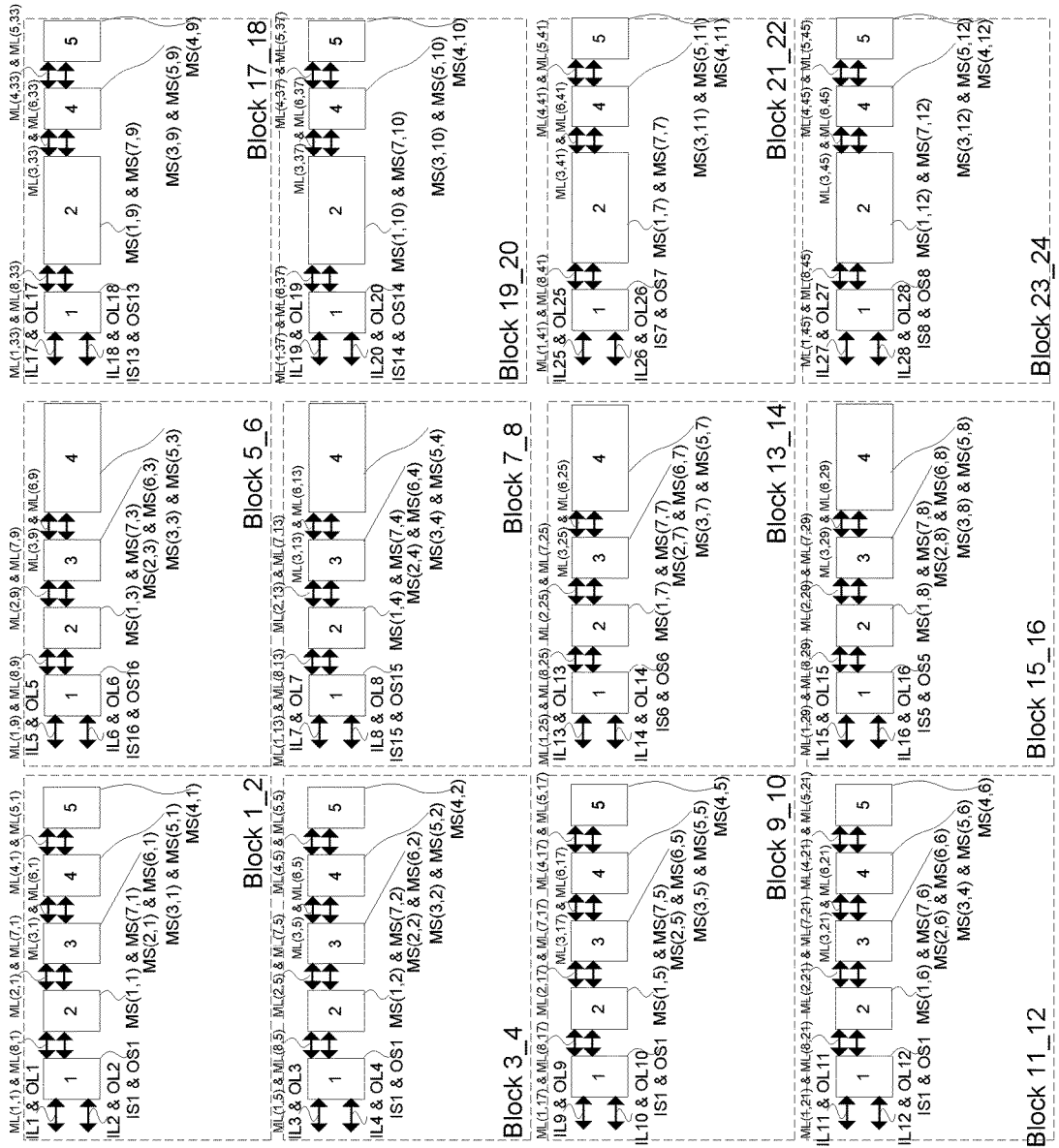
FIG. 2C is a diagram 200C layout of the network $V_{fold-mlink}(N,d,s)$ shown in FIG. 2B, in one embodiment, illustrating the connection links belonging with in each block only.

Modified-Hypercube Topology Layout Schemes:

Referring to layout 200C of FIG. 2C, in one embodiment, there are twelve blocks namely Block 1_2, Block 3_4, Block 5_6, Block 7_8, Block 9_10, Block 11_12, Block 13_14, Block 16_16, Block 17_18, Block 19_20, Block 21_22, and Block 23_24. Each block implements all the switches in one row of the network 200B of FIG. 2B, one of the key aspects of the current invention. For example Block 1_2 implements the input switch IS1, output Switch OS1, middle switch MS(1,1), middle switch MS(7,1), middle switch MS(2,1), middle switch MS(6,1), middle switch MS(3,1), middle switch MS(5,1), and middle switch MS(4,1). For the simplification of illustration, Input switch IS1 and output switch OS1 together are denoted as switch 1; Middle switch MS(1, 1) and middle switch MS(7,1) together are denoted by switch 2; Middle switch MS(2,1) and middle switch MS(6, 1) together are denoted by switch 3; Middle switch MS(3,1) and middle switch MS(5,1) together are denoted by switch 4; Middle switch MS(4,1) is denoted by switch 5.

All the straight middle links are illustrated in layout 200C of FIG. 2C. For example in Block 1_2, inlet links IL1-IL2, outlet links OL1-OL2, middle link ML(1,1), middle link ML(1,2), middle link ML(8,1), middle link ML(8,2), middle link ML(2,1), middle link ML(2,2), middle link ML(7,1), middle link ML(7,2), middle link ML(3,1), middle link ML(3,2), middle link ML(6,1), middle link ML(6,2), middle link ML(4,1), middle link ML(4,2), middle link ML(5,1) and middle link ML(5,2) are illustrated in layout 200C of FIG. 2C.

Even though it is not illustrated in layout 200C of FIG. 2C, in each block, in addition to the switches there may be Configurable Logic Blocks (CLB) or any arbitrary digital circuit depending on the applications in different embodiments. There are a maximum of four quadrants in the layout 200C of FIG. 2C namely top-left, bottom-left, top-right and bottom-right quadrants. In each quadrant there are a maximum of four blocks. Top-left quadrant implements Block 1_2, Block 3_4, Block 5_6, and Block 7_8. Bottom-left quadrant implements Block 9_10, Block 11_12, Block 13_14, and Block 15_16. Top-right quadrant implements Block 17_18, Block 19_20. Bottom-right quadrant implements Block 21_22, and Block 23_24. There are two halves in layout 200C of FIG. 2C namely left-half and right-half. Left-half consists of top-left and bottom-left quadrants. Right-half consists of top-right and bottom-right quadrants.

Recursively in each quadrant there are a maximum of four sub-quadrants. For example in top-left quadrant there are four sub-quadrants namely top-left sub-quadrant, bottom-left sub-quadrant, top-right sub-quadrant and bottom-right sub-quadrant. Top-left sub-quadrant of top-left quadrant implements Block 1_2. Bottom-left sub-quadrant of top-left quadrant implements Block 3_4. Top-right sub-quadrant of top-left quadrant implements Block 5_6. Finally bottom-right sub-quadrant of top-left quadrant implements Block 7_8. Similarly there are a maximum of two sub-halves in each quadrant. For example in top-left quadrant there are two sub-halves namely left-sub-half and right-sub-half. Left-sub-half of top-left quadrant implements Block 1_2 and Block 3_4. Right-sub-half of top-left quadrant implements Block 5_6 and Block 7_8. Finally applicant notes that in each quadrant or half the blocks are arranged close to binary hypercube.

Figure 2D:
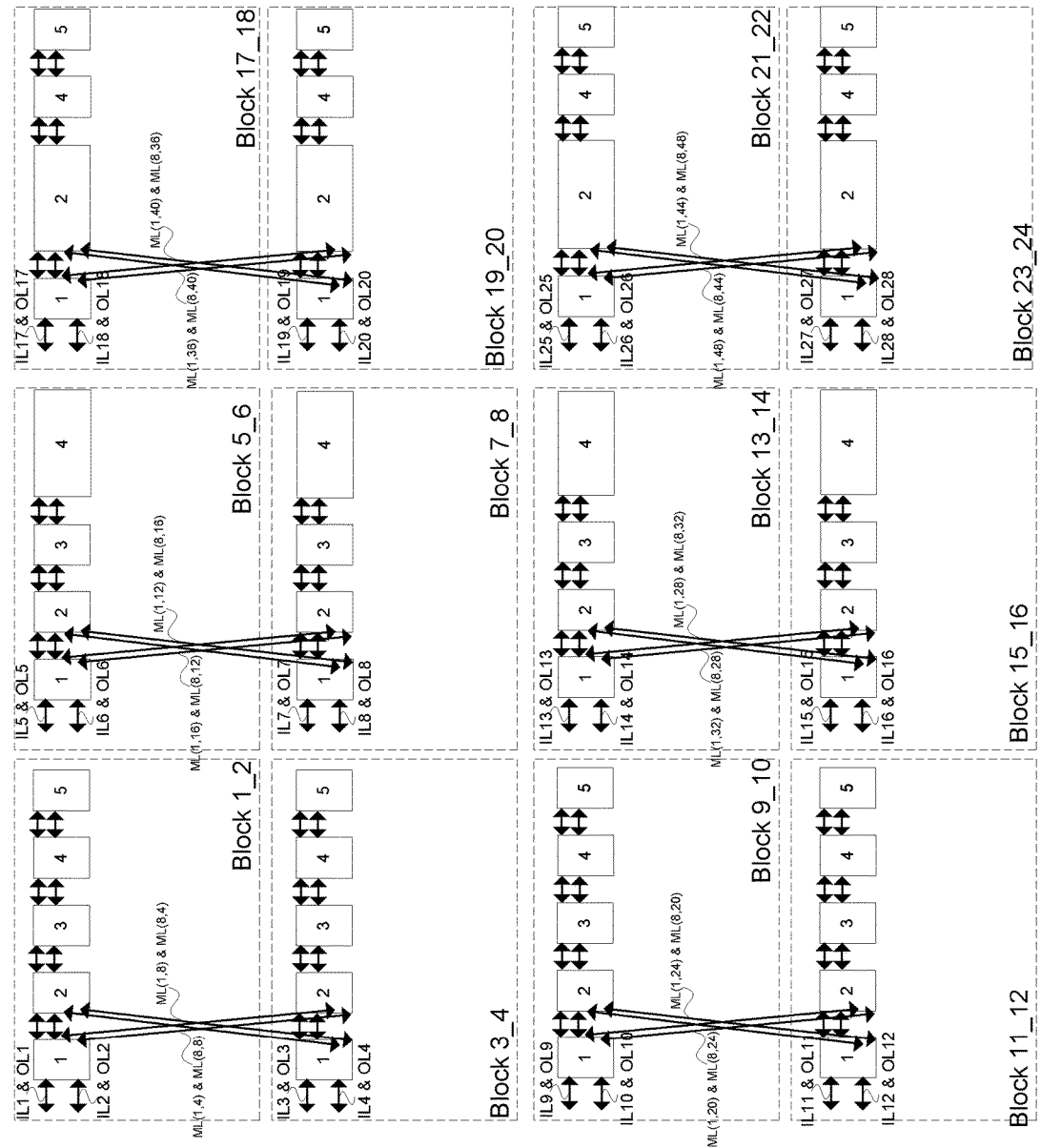
FIG. 2D is a diagram 200D layout of the network $V_{fold-mlink}(N,d,s)$ shown in FIG. 2B, in one embodiment, illustrating the connection links $ML(1,i)$ for i=[1, 48] and $ML(8,i)$ for i=[1,48].

Layout 200D of FIG. 2D illustrates the inter-block links between switches 1 and 2 of each block. For example middle links ML(1,3), ML(1,4), ML(8,7), and ML(8,8) are connected between switch 1 of Block 1_2 and switch 2 of Block 3_4. Similarly middle links ML(1,7), ML(1,8), ML(8,3), and ML(8,4) are connected between switch 2 of Block 1_2 and switch 1 of Block 3_4. Applicant notes that the inter-block links illustrated in layout 200D of FIG. 2D can be implemented as vertical tracks in one embodiment. Also in one embodiment inter-block links are implemented as two different tracks (for example middle links ML(1,4) and ML(8,8) are implemented as two different tracks); or in an alternative embodiment inter-block links are implemented as a time division multiplexed single track (for example middle links ML(1,4) and ML(8,8) are implemented as a time division multiplexed single track). As described before, the inter-link bandwidth provided between two physically adjacent blocks in the same column is hereinafter called 2's bandwidth or 2's BW. For example the inter-block links between switches 1 and 2 as illustrated in layout 200D of FIG. 2D is 2's BW.

Figure 2E:
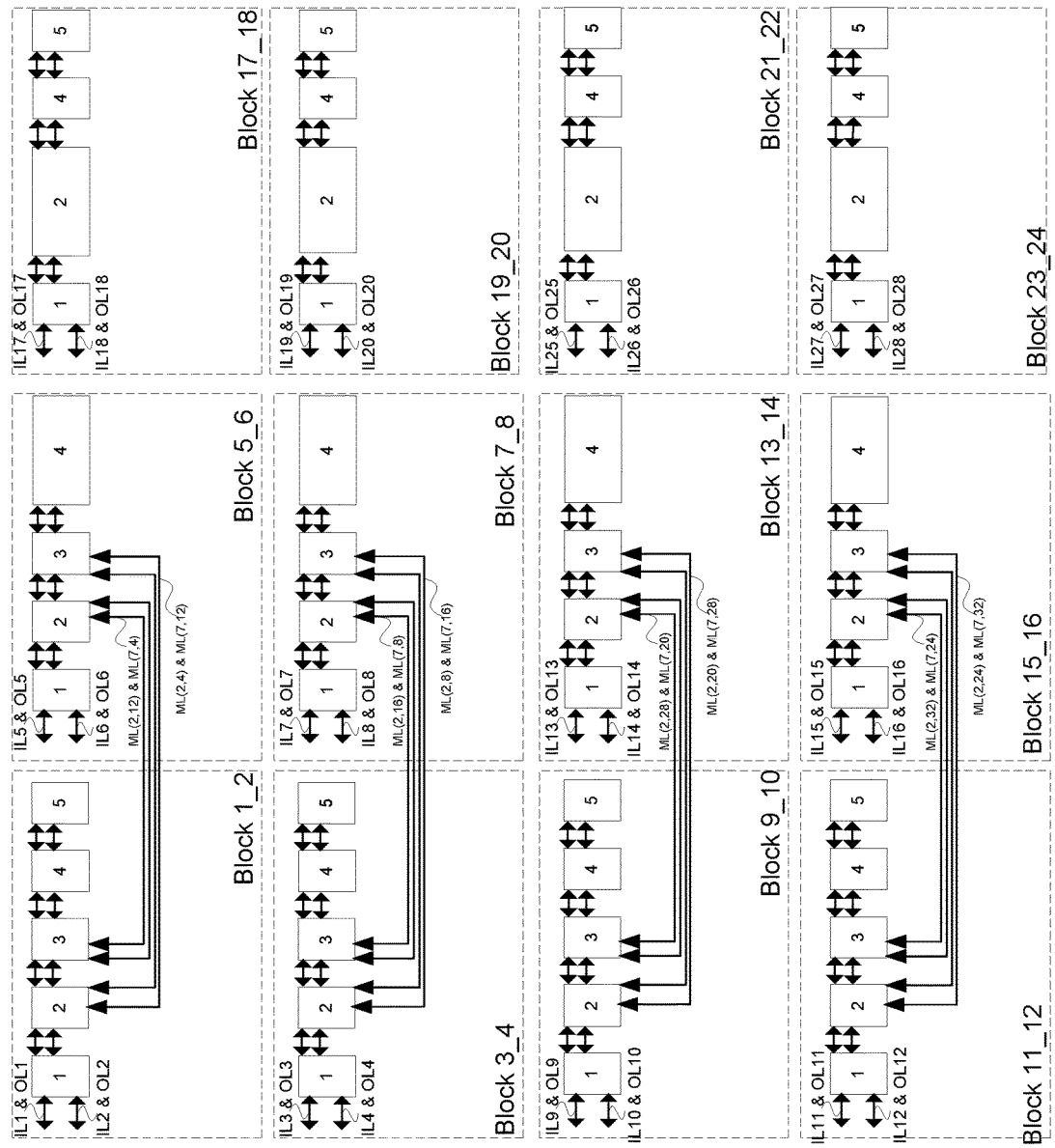
FIG. 2E is a diagram 200E layout of the network $V_{fold-mlink}(N,d,s)$ shown in FIG. 2B, in one embodiment, illustrating the connection links $ML(2,i)$ for i=[1, 32] and $ML(7,i)$ for i=[1,32].

Layout 200E of FIG. 2E illustrates the inter-block links between switches 2 and 3 of each block. For example middle links ML(2,3), ML(2,4), ML(7,11), and ML(7,12) are connected between switch 2 of Block 1_2 and switch 3 of Block 5_6. Similarly middle links ML(2,11), ML(2,12), ML(7,3), and ML(7,4) are connected between switch 3 of Block 1_2 and switch 2 of Block 5_6. It muse be noted that if there are an odd number of blocks in the rows of blocks then one of the blocks do not need inter-block links between switches 2 and 3, and also one of the switches for example switch 3 does not need to be implemented. For example in layout 200E there are three blocks in the topmost row namely Block 1_2, Block 5_6 and Block 17_18. In layout 200E there is no need to have inter-block links between switches 2 and 3 of Block 17_18 and hence there is no need to implement switch 3. Similarly in Block 19_20, Block 21_22 and Block 23_24 there is no need to provide inter-block links between switches 2 and 3 in those blocks. Also switch 3 is not implemented in those blocks.

Applicant notes that the inter-block links illustrated in layout 200E of FIG. 2E can be implemented as horizontal tracks in one embodiment. Also in one embodiment inter-block links are implemented as two different tracks (for example middle links ML(2,12) and ML(7,4) are implemented as two different tracks); or in an alternative embodiment inter-block links are implemented as a time division multiplexed single track (for example middle links ML(2,12) and ML(7,4) are implemented as a time division multiplexed single track).

In general the bandwidth offered within a quadrant or a partial quadrant of the layout formed by two nearest neighboring blocks is 2's BW. For example in layout 200C of FIG. 2C the bandwidth offered in top-right quadrant is 2's BW. Similarly the bandwidth offered within each of the other three quadrants top-left, bottom-left and bottom-right quadrants is 2' BW. Alternatively the bandwidth offered with in a square or a partial square of blocks with the sides of the square consisting of two neighboring blocks is 2's BW. This definition can be generalized so that the bandwidth offered within a square of blocks with the sides consisting of "x" number of blocks, where $2_{y-1} \leq x \leq 2^y$ where "y" is an integer, is hereinafter x's BW.

Figure 2F:
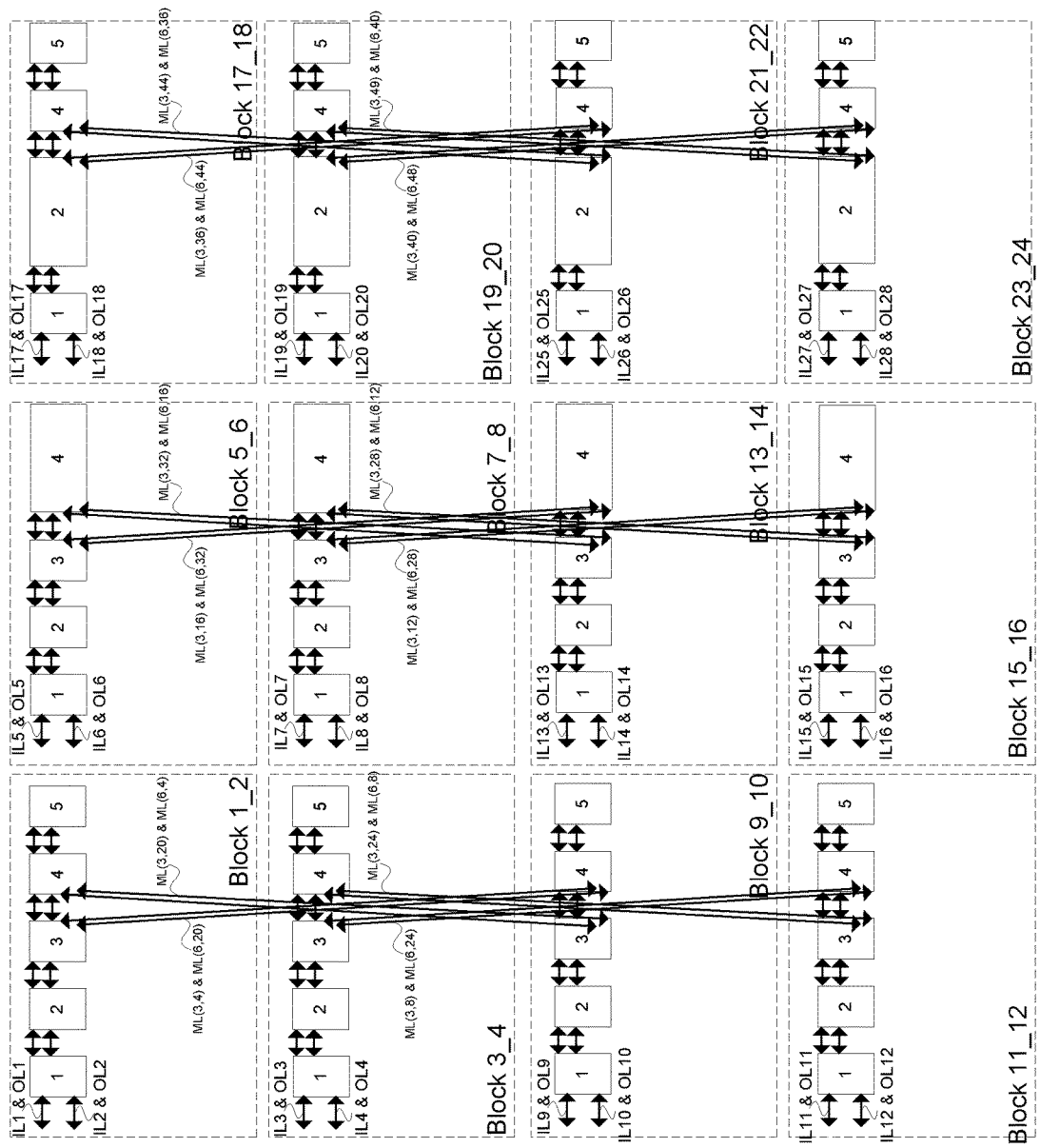
FIG. 2F is a diagram 200F layout of the network $V_{fold-mlink}(N,d,s)$ shown in FIG. 2B, in one embodiment, illustrating the connection links $ML(3,i)$ for i=[1, 64] and $ML(6,i)$ for i=[1,64].

Layout 200F of FIG. 2F illustrates the inter-block links between switches 3 and 4 of each block excepting that among the Block 17_18, Block 19_20, Block 21_22, and Block 23_24 the inter-block links are between the switches 2 and 4. For example middle links ML(3,3), ML(3,4), ML(6,19), and ML(6,20) are connected between switch 3 of Block 1_2 and switch 4 of Block 3_4. Similarly middle links ML(3,19), ML(3,20), ML(6,3), and ML(6,4) are connected between switch 4 of Block 1_2 and switch 3 of Block 3_4. Applicant notes that the inter-block links illustrated in layout 200F of FIG. 2F can be implemented as vertical tracks in one embodiment. Also in one embodiment inter-block links are implemented as two different tracks (for example middle links ML(3,4) and ML(6,20) are implemented as two different tracks); or in an alternative embodiment inter-block links are implemented as a time division multiplexed single track (for example middle links ML(3,4) and ML(6,20) are implemented as a time division multiplexed single track). For example the inter-block links between switches 3 and 4 as illustrated in layout 200F of FIG. 2F is 4's BW.

Layout 200G of FIG. 2G illustrates the inter-block links between switches 4 and 5 of each block. For example middle links ML(4,3), ML(4,4), ML(5,35), and ML(5,36) are connected between switch 4 of Block 1_2 and switch 5 of Block 3_4. Similarly middle links ML(4,35), ML(4,36), ML(5,3), and ML(5,4) are connected between switch 5 of Block 1_2 and switch 4 of Block 3_4. It muse be noted that if the number of blocks in the rows of blocks is not a perfect multiple of four, then some of the blocks do not need inter-block links between switches 4 and 5, and also one of the switches for example switch 5 does not need to be implemented. For example in layout 200G there are three blocks in the topmost row namely Block 1_2, Block 5_6 and Block 17_18. In layout 200E there is no need to have inter-block links between switches 4 and 5 of Block 5_6 and hence there is no need to implement switch 5. Similarly in Block 7_8, Block 13_14 and Block 15_16 there is no need to provide inter-block links between switches 4 and 5 in those blocks. Also switch 5 is not implemented in those blocks.

Applicant notes that the inter-block links illustrated in layout 200G of FIG. 2G can be implemented as horizontal tracks in one embodiment. Also in one embodiment inter-block links are implemented as two different tracks (for example middle links ML(4,4) and ML(5,36) are implemented as two different tracks); or in an alternative embodiment inter-block links are implemented as a time division multiplexed single track (for example middle links ML(4,4) and ML(5,36) are implemented as a time division multiplexed single track). The bandwidth offered between top-left quadrant, bottom-left quadrant, top-right partial quadrant and bottom-right partial quadrant is 4's BW in layout 200G of FIG. 2G.

The complete layout for the network 200B of FIG. 2B is given by combining the links in layout diagrams of 200C, 200D, 200E, 200F, and 200G. Applicant notes that in the layout 200C of FIG. 2C, the inter-block links between switch 1 and switch 2 of corresponding blocks are vertical tracks as shown in layout 200D of FIG. 2D; the inter-block links between switch 2 and switch 3 of corresponding blocks are horizontal tracks as shown in layout 200E of FIG. 2E; the inter-block links between switch 3 and switch 4 of corresponding blocks are vertical tracks as shown in layout 200F of FIG. 2F; and finally the inter-block links between switch 4 and switch 5 of corresponding blocks are horizontal tracks as shown in layout 200G of FIG. 2G. The pattern is alternate vertical tracks and horizontal tracks.

Some of the key aspects of the current invention are discussed. 1) All the switches in one row of the multi-stage network 200B are implemented in a single block. 2) The blocks are placed in such a way that all the inter-block links are either horizontal tracks or vertical tracks; 3) Since all the inter-block links are either horizontal or vertical tracks, all the inter-block links can be mapped on to island-style architectures in current commercial FPGAs; 4) The length of the longest wire is about half of the width (or length) of the complete layout (For example middle link ML(4,4) is about half the width of the complete layout).

In accordance with the current invention, the layout 200C in FIG. 2C can be recursively extended for any arbitrarily large generalized folded multi-link multi-stage network $V_{fold\text{-}mlink}(N_1,N_2,d,s)$ the sub-quadrants, quadrants, and super-quadrants are arranged in d-ary hypercube manner and also the inter-blocks are accordingly connected in d-ary hypercube topology. Even though all the embodiments in the current invention are illustrated for $N_1=N_2$ when $N_1=N_1 \neq 2^x$ where x is an integer, the embodiments can be extended for $N_1 \neq 2^x$ & $N_2 \neq 2^y$ where x and y are integers.

Just the same as was illustrated in diagram 100I of FIG. 1I for a high-level implementation of Block 1_2 (Each of the other blocks have similar implementation) of the layout 100C of FIG. 1C which represents a generalized folded multi-link multi-stage network $V_{fold\text{-}mlink}(N_1,N_2,d,s)$ where $N_1=N_2=32$; d=2; and s=2, a high-level implementation of Block 1_2 of the layout 200C of FIG. 2C which represents a generalized folded multi-link multi-stage network $V_{fold\text{-}mlink}(N_1,N_2,d,s)$ where $N_1=N_2=24$; d=2; and s=2 is similar.

Just the same as was illustrated in diagram 100J of FIG. 1J for a high-level implementation of Block 1_2 (Each of the other blocks have similar implementation) of the layout 100C of FIG. 1C which represents a generalized multi-link butterfly fat tree network $V_{mlink\text{-}bft}(N_1,N_2,d,s)$ where $N_1=N_2=32$; d=2; and s=2, a high-level implementation of Block 1_2 of the layout 200C of FIG. 2C which represents a generalized multi-link butterfly fat tree network $V_{mlink\text{-}bft}(N_1,N_2,d,s)$ where $N_1=N_2=24$; d=2; and s=2 is similar.

Just the same as was illustrated in diagram 100K of FIG. 1K for a high-level implementation of Block 1_2 (Each of the other blocks have similar implementation) of the layout 100C of FIG. 1C which represents a generalized folded multi-stage network $V_{fold}(N_1,N_2,d,s)$ where $N_1=N_2=32$; d=2; and s=2, a high-level implementation of Block 1_2 of the layout 200C of FIG. 2C which represents a generalized folded multi-stage network $V_{fold}(N_1,N_2,d,s)$ where $N_1=N_2=24$; d=2; and s=2 is similar.

Just the same as was illustrated in diagram 100K1 of FIG. 1K1 for a high-level implementation of Block 1_2 (Each of the other blocks have similar implementation) of the layout 100C of FIG. 1C which represents a generalized folded multi-stage network $V_{fold}(N_1,N_2,d,s)$ where $N_1=N_2=32$; d=2; and s=1, a high-level implementation of Block 1_2 of the layout 200C of FIG. 2C which represents a generalized folded multi-stage network $V_{fold}(N_1,N_2,d,s)$ where $N_1=N_2=24$; d=2; and s=1 is similar.

Just the same as was illustrated in diagram 100L of FIG. 1L for a high-level implementation of Block 1_2 (Each of the other blocks have similar implementation) of the layout 100C of FIG. 1C which represents a generalized butterfly fat tree network $V_{bft}(N_1,N_2,d,s)$ where $N_1=N_2=32$; d=2; and s=2, a high-level implementation of Block 1_2 of the layout 200C of FIG. 2C which represents a generalized butterfly fat tree network $V_{bft}(N_1,N_2,d,s)$ where $N_1=N_2=24$; d=2; and s=2 is similar.

Just the same as was illustrated in diagram 100L1 of FIG. 1L1 for a high-level implementation of Block 1_2 (Each of the other blocks have similar implementation) of the layout 100C of FIG. 1C which represents a generalized butterfly fat tree network $V_{bft}(N_1,N_2,d,s)$ where $N_1=N_2=32$; d=2; and s=1, a high-level implementation of Block 1_2 of the layout 200C of FIG. 2C which represents a generalized butterfly fat tree network $V_{bft}(N_1,N_2,d,s)$ where $N_1=N_2=24$; d=2; and s=1 is similar.

Figure 3C:
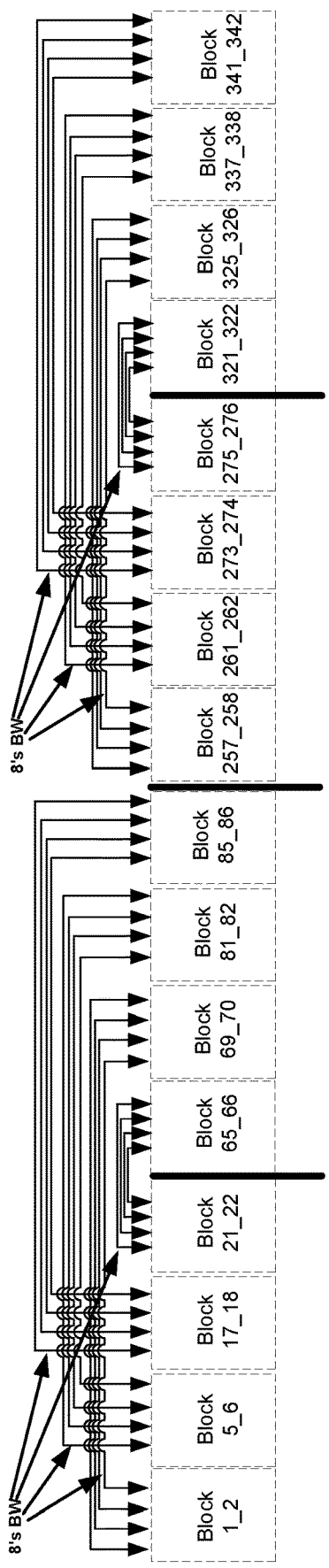
FIG. 3C is a diagram 300C layout of the topmost row of the network $V_{fold-mlink}(N,d,s)$ with N=512, d=2 and s=2, in one embodiment, illustrating the provisioning of 8's BW with nearest neighbor connectivity first.

Modified-Hypercube Topology with Nearest Neighbor Connectivity First and the Remaining with Equal Length Wires, in Every Stage:

Referring to layout 300A of FIG. 3A, 300B of FIG. 3B and 300C of FIG. 3C illustrate the topmost row of the extension of layout 100H for the network $V_{fold\text{-}mlink}(N_1,N_2,d,s)$ where $N_1=N_2=512$; d=2; and s=2. In one embodiment of the complete layout, not shown in FIGS. 3A-3C, there are four super-super-quadrants namely top-left super-super-quadrant, bottom-left super-super-quadrant, top-right super-super-quadrant, and bottom-right super-super-quadrant. Total number of blocks in the complete layout is two hundred and fifty six. Top-left super-super-quadrant implements the blocks from block 1_2 to block 127_128. Bottom-left super-super-quadrant implements the blocks from block 129_130 to block 255_256. Top-right super-super-quadrant implements the blocks from block 257_258 to block 319_320. Bottom-right super-super-quadrant implements the blocks from block 383_384 to block 511_512. Each block in all the super-super-quadrants has two more switches namely switch 8 and switch 9 in addition to the switches [1-7] described in layout 100H of FIG. 1H.

The embodiment of layout 300A of FIG. 3A illustrates the 2's BW provided in the top-most row of the complete layout namely between block 1_2 and block 5_6; between block 17_18 and block 21_22; between block 65_66 and block 69_90; between block 81_82 and block 85_86; between block 257_258 and block 261_262; between block 273_274 and block 275_276; between block 321_322 and block 325_326; and between block 337_338 and block 341_342. In one embodiment, the 2's BW provided between the respective blocks is through the inter-block links between corresponding switch 2 and switch 3 of the respective blocks.

The embodiment of layout 300B of FIG. 3B illustrates the 4's BW provided in the top-most row of the complete layout namely between block 1_2 and block 21_22; between block 5_6 and block 17_18; between block 65_66 and block 85_86; between block 69_70 and block 81_82; between block 257_258 and block 275_276; between block 261_262 and block 273_274; between block 321_322 and block 341_342; and between block 325_326 and block 337_338. In one embodiment, the 4's BW provided between the respective blocks is through the inter-block links between corresponding switch 4 and switch 5 of the respective blocks. In layout 300B, nearest neighbor blocks are connected together to provide 4's BW (for example the 4's BW provided between block 5_6 and block 17_18) and then the rest of the blocks are connected to provide the 4's BW (for example the 4's BW provided between block 1_2 and block 21_22).

The embodiment of layout 300C of FIG. 3C illustrates the 8's BW provided in the top-most row of the complete layout namely between block 1_2 and block 69_70; between block 5_6 and block 81_82; between block 17_18 and block 85_86; between block 21_22 and block 65_66; between block 257_258 and block 325_326; between block 261_262 and block 337_338; between block 273_274 and block 341_342; and between block 275_276 and block 321_322. In one embodiment, the 8's BW provided between the respective blocks is through the inter-block links between corresponding switch 6 and switch 7 of the respective blocks. In layout 300C, nearest neighbor blocks are connected together to provide 8's BW (for example the 8's BW provided between block 21_22 and block 65_66) and then the rest of the blocks are connected to provide the 8's BW (for example the 8's BW provided between block 1_2 and block 69_70).

Figure 3D:
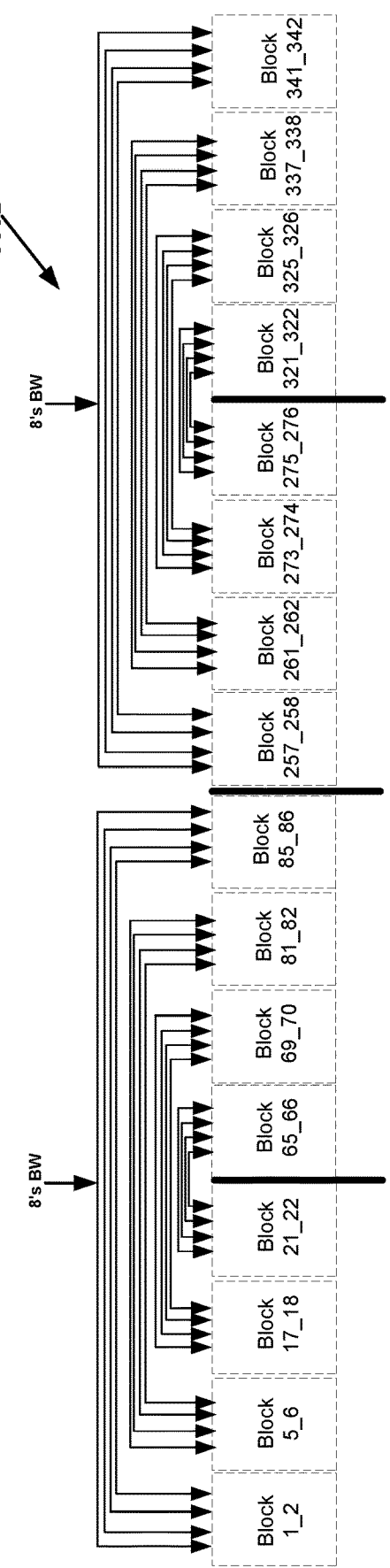
FIG. 3D is a diagram 300D layout of the topmost row of the network $V_{fold-mlink}(N,d,s)$ with N=512, d=2 and s=2, in one embodiment, illustrating the provisioning of 8's BW with nearest neighbor connectivity recursively.

Modified-Hypercube Topology with Recursive Nearest Neighbor Connectivity, in Every Stage:

In another embodiment of the extension of layout 100H for the network $V_{fold\text{-}mlink}(N_1,N_2,d,s)$ where $N_1=N_2=512$; d=2; and s=2, the 2's BW and 4's BW are provided exactly the same as illustrated in FIG. 3A and FIG. 3B respectively; However 8's BW is offered as illustrated in layout 300D of FIG. 3D. The 8's BW is provided in the top-most row of the complete layout namely between block 21_22 and block 65_66; between block 17_18 and block 69_70; between block 5_6 and block 81_82; between block 1_2 and block 85_86; between block 275_276 and block 321_322; between block 273_274 and block 325_326; between block 261_262 and block 337_338; and between block 257_258 and block 341_342. In one embodiment, the 8's BW provided between the respective blocks is through the inter-block links between corresponding switch 6 and switch 7 of the respective blocks.

In layout 300D, nearest neighbor blocks are connected together to provide 8's BW recursively. Specifically first the 8's BW is provided between block 21_22 and block 65_66. Then the 8's BW is provided between the nearest neighbor blocks in the remaining blocks, i.e., between block 17_18 and block 69_70. Then the 8's BW is provided between the nearest neighbor blocks in the remaining blocks, i.e., between block 5_6 and block 81_82. Finally the 8's BW is provided between the nearest neighbor blocks in the remaining blocks, i.e., between block 1_2 and block 85_86. In the same manner, the 8's BW is provided in the remaining blocks between block 257_258 up to block 341_342.

Figure 4C:
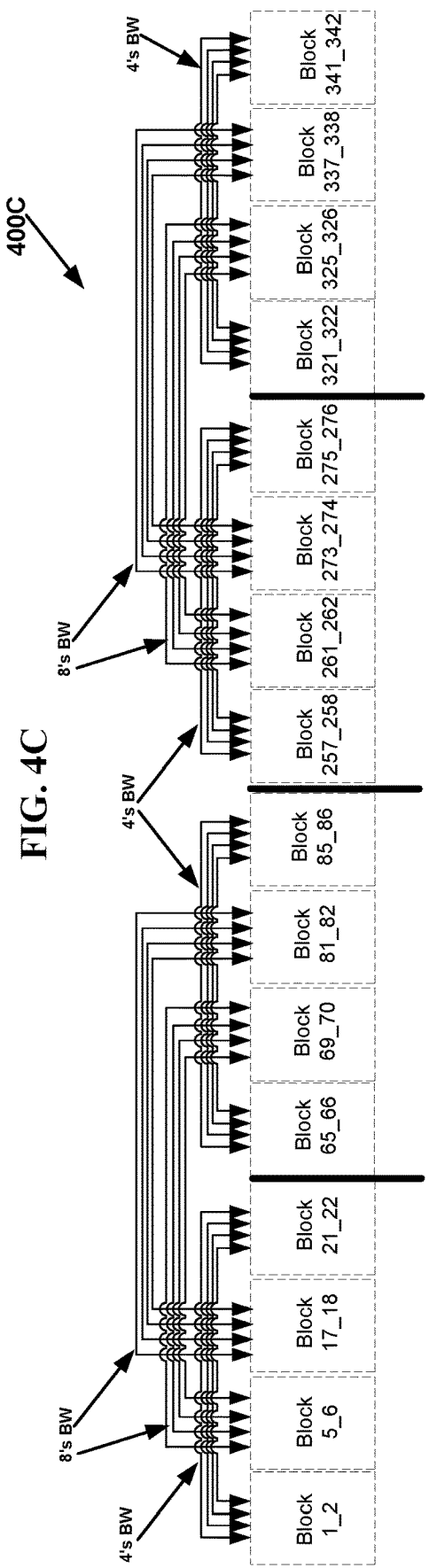
FIG. 4C is a diagram 400C layout of the topmost row of the network $V_{fold-mlink}(N,d,s)$ with N=512, d=2 and s=2, in one embodiment, illustrating the third stage, by provisioning 4's and 8's BW.

Modified-Hypercube Topology with the Second Stage Implementing Nearest Neighbor Connectivity:

Referring to layout 400A of FIG. 4A, 400B of FIG. 4B and 400C of FIG. 4C illustrate the topmost row of the extension of layout 100H for the network $V_{fold-mlink}(N_1,N_2,d,s)$ where $N_1=N_2=512$; d=2; and s=2. In another embodiment of the complete layout, not shown in FIGS. 4A-4C, there are four super-super-quadrants namely top-left super-super-quadrant, bottom-left super-super-quadrant, top-right super-super-quadrant, and bottom-right super-super-quadrant. Total number of blocks in the complete layout is two hundred fifty six. Top-left super-super-quadrant implements the blocks from block 1_2 to block 127_128. Bottom-left super-super-quadrant implements the blocks from block 129_130 to block 255_256. Top-right super-super-quadrant implements the blocks from block 257_258 to block 319_320. Bottom-right super-super-quadrant implements the blocks from block 383_384 to block 511_512. Each block in all the super-super-quadrants has two more switches namely switch 8 and switch 9 in addition to the switches [1-7] described in layout 100H of FIG. 1H.

In the embodiment of Layout 400A of FIG. 4A illustrates the 2's BW provided in the top-most row of the complete layout namely between block 1_2 and block 5_6; between block 17_18 and block 21_22; between block 65_66 and block 69_90; between block 81_82 and block 85_86; between block 257_258 and block 261_262; between block 273_274 and block 275_276; between block 321_322 and block 325_326; and between block 337_338 and block 341_342. In one embodiment, the 2's BW provided between the respective blocks is through the inter-block links between corresponding switch 2 and switch 3 of the respective blocks. Applicant notes that in layout 400A of FIG. 4A the first stage provides 2's BW between the blocks in the top-most row of the complete layout.

In the embodiment of Layout 400B of FIG. 4B illustrates the nearest neighbor connectivity between blocks of the top-most row of the complete layout to provide 4's BW, 8's BW, and 16's BW namely between block 5_6 and block 17_18 the bandwidth provided is 4's BW; between block 21_22 and block 65_66 the bandwidth provided is 8's BW; between block 69_70 and block 81_82 the bandwidth provided is 4's BW; between block 85_86 and block 257_258 the bandwidth provided is 16's BW; between block 261_262 and block 273_274 the bandwidth provided is 4's BW; between block 275_276 and block 321_322 the bandwidth provided is 8's BW; between block 325_326 and block 337_338 the bandwidth provided is 4's BW; and between block 1_2 and block 341_342 no bandwidth is provided. (Even though it is not illustrated, in another embodiment 16's BW can be provided between block 1_2 and block 342_342). In one embodiment, the BW provided between the respective blocks is through the inter-block links between corresponding switch 4 and switch 5 of the respective blocks. Applicant notes that in layout 400B of FIG. 4B the second stage provides the remaining nearest neighbor connectivity (i.e., after the first stage connectivity in layout 400A of FIG. 4A as illustrated provides nearest neighbor connectivity with 100% 2's BW) namely 50% of 4's BW, 25% of 8's BW and 12.5% of 16's BW, between the blocks in the top-most row of the complete layout.

The embodiment of layout 400C of FIG. 4C illustrates the 4's BW and 8's BW provided in the top-most row of the complete layout namely between block 1_2 and block 21_22 the bandwidth provided is 4's BW; between block 5_6 and block 69_70 the bandwidth provided is 8's BW; between block 17_18 and block 81_82 the bandwidth provided is 8's BW; between block 65_66 and block 85_86 the bandwidth provided is 4's BW; between block 257_258 and block 275_276 the bandwidth provided is 4's BW; between block 261_262 and block 325_326 the bandwidth provided is 8's BW; between block 273_274 and block 341_342 the bandwidth provided is 4's BW; between block 275_276 and block 337_338 the bandwidth provided is 8's BW; and between block 321_322 and block 341_342 the bandwidth provided is 4's BW. In one embodiment, the 4's BW and 8's BW provided between the respective blocks is through the inter-block links between corresponding switch 6 and switch 7 of the respective blocks. Applicant notes that in layout 400C of FIG. 4C the third stage provides 50% of 4's BW and 50% of 8's BW between the blocks in the top-most row of the complete layout.

The same process is repeated in the fourth stage by providing namely 25% of 8's BW and 87.5% of 16's BW is provided. This connectivity topology can be similarly extended to the network $V_{fold-mlink}(N_1,N_2,d,s)$ where $N_1=N_2>512$; d=2; and s=2.

Figure 5:
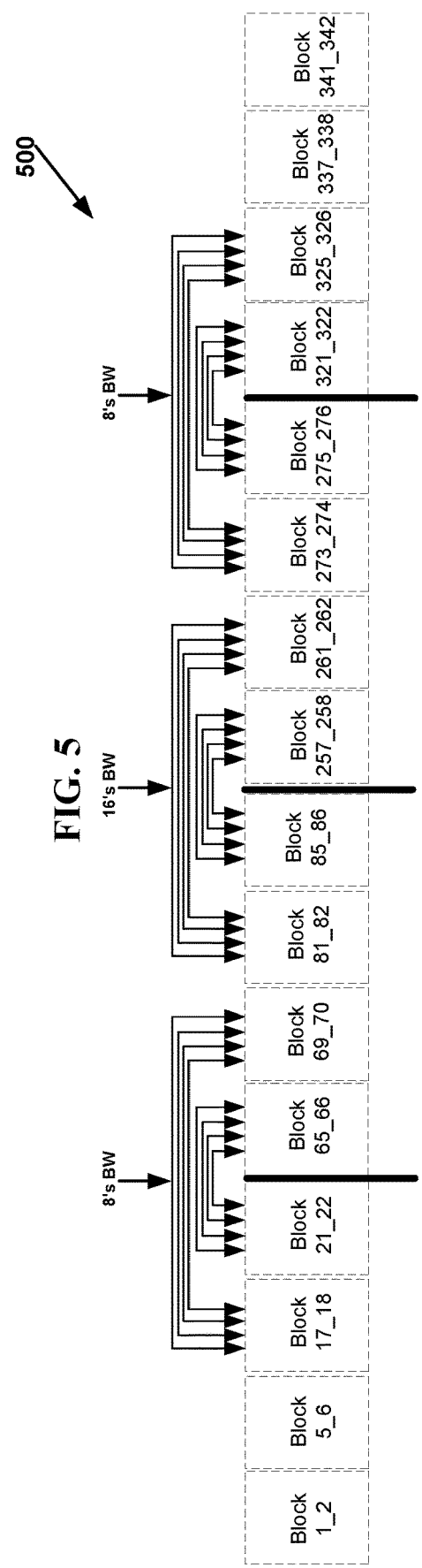
FIG. 5 is a diagram 500 layout of the topmost row of the network $V_{fold-mlink}(N,d,s)$ with N=512, d=2 and s=2, in one embodiment, illustrating the provisioning of 8's BW and 16's BW in Partial & Tapered Connectivity (Bandwidth) in a stage.

Modified-Hypercube Topology with Partial & Tapered Connectivity (Bandwidth) in a Stage, where $N_1=N_2=512$:

Referring to layout 500 of FIG. 5 illustrates the topmost row of the extension of layout 100H for the network $V_{fold-mlink}(N_1,N_2,d,s)$ where $N_1=N_2=512$; d=2; and s=2. In another embodiment of the complete layout, not shown in FIG. 5, there are four super-super-quadrants namely top-left super-super-quadrant, bottom-left super-super-quadrant, top-right super-super-quadrant, and bottom-right super-super-quadrant. Total number of blocks in the complete layout is two hundred fifty six. Top-left super-super-quadrant implements the blocks from block 1_2 to block 127_128. Bottom-left super-super-quadrant implements the blocks from block 129_130 to block 255_256. Top-right super-super-quadrant implements the blocks from block 257_258 to block 319_320. Bottom-right super-super-quadrant implements the blocks from block 383_384 to block 511_512. Each block in all the super-super-quadrants has two more switches namely switch 8 and switch 9 in addition to the switches [1-7] described in layout 100H of FIG. 1H.

The embodiment of layout 500 of FIG. 5 illustrates the 8's BW and 16's BW provided in the top-most row of the complete layout namely between block 21_22 and block 65_66 the bandwidth provided is 8's BW; between block 17_18 and block 69_70 the bandwidth provided is 8's BW; between block 85_86 and block 257_258 the bandwidth provided is 16's BW; between block 81_82 and block 261_262 the bandwidth provided is 16's BW; between block 275_276 and block 321_322 the bandwidth provided is 8's BW; between block 273_274 and block 325_326 the bandwidth provided is 8's BW. In one embodiment, the 8's BW and 16's BW provided between the respective blocks is through the inter-block links between corresponding switch 6 and switch 7 of the respective blocks. Applicant notes that in layout 500 of FIG. 5 the bandwidth provided between the blocks in the top-most row of the complete layout may be in anyone of the stages. Applicant observes that the 8's bandwidth provided in layout 500 of FIG. 5 is 50% of total 8's BW for full connectivity and 16's BW provided is 25% of the total 16's BW for full connectivity. In layout 500 of FIG. 5, the partial 8's BW and 16's BW is provided in nearest neighbor connectivity manner recursively which makes the wire lengths between different blocks to offer 8's BW is different and also makes the wire lengths between different blocks to offer 16's BW is different. Layout 500 of FIG. 5 illustrates an embodiment to provide partial bandwidth in a tapered manner, where it is not needed to provide the complete bandwidth in the higher stages.

Figure 6:
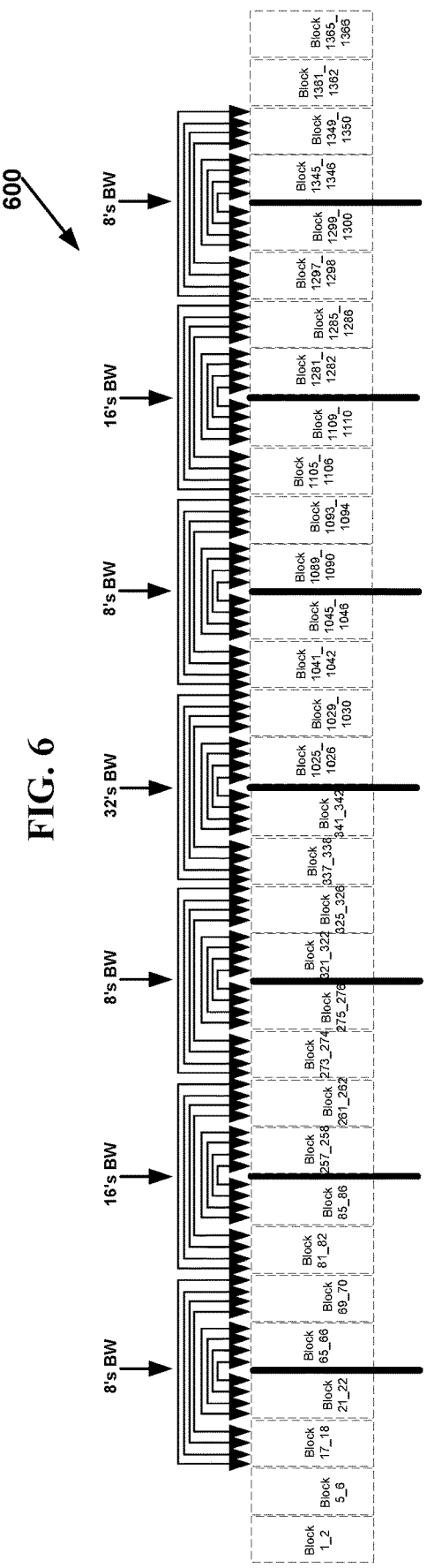
FIG. 6 is a diagram 600 layout of the topmost row of the network $V_{fold-mlink}(N,d,s)$ with N=2048, d=2 and s=2, in one embodiment, illustrating the provisioning of 8's BW, 16's BW and 32's BW in Partial & Tapered Connectivity (Bandwidth) in a stage.

Modified-Hypercube Topology with Partial & Tapered Connectivity (Bandwidth) in a Stage, where $N_1=N_2=2048$:

Referring to layout 600 of FIG. 6 illustrates the topmost row of the extension of layout 100H for the network $V_{fold-mlink}(N_1,N_2,d,s)$ where $N_1=N_2=2048$; $d=2$; and $s=2$. In one embodiment of the complete layout, not shown in FIG. 6, there are four super-super-super-quadrants namely top-left super-super-super-quadrant, bottom-left super-super-super-quadrant, top-right super-super-super-quadrant, and bottom-right super-super-super-quadrant. Total number of blocks in the complete layout is one thousand and twenty four. Top-left super-super-quadrant implements the blocks from block 1_2 to block 511_512. Bottom-left super-super-quadrant implements the blocks from block 513_514 to block 1023_1024. Top-right super-super-quadrant implements the blocks from block 1025_1026 to block 1535_1536. Bottom-right super-super-quadrant implements the blocks from block 1537_1538 to block 2047_2048. Each block in all the super-super-quadrants has four more switches namely switch 8, switch 9, switch 10 and switch 11 in addition to the switches [1-7] described in layout 100H of FIG. 1H.

In the embodiment of Layout 600 of FIG. 6 illustrates the 8's BW, 16's BW and 32's BW provided in the top-most row of the complete layout namely between block 21_22 and block 65_66 the bandwidth provided is 8's BW; between block 17_18 and block 69_70 the bandwidth provided is 8's BW; between block 85_86 and block 257_258 the bandwidth provided is 16's BW; between block 81_82 and block 261_262 the bandwidth provided is 16's BW; between block 275_276 and block 321_322 the bandwidth provided is 8's BW; between block 273_274 and block 325_326 the bandwidth provided is 8's BW; between block 341_342 and block 1025_1026 the bandwidth provided is 32's BW; between block 337_338 and block 1029_1030 the bandwidth provided is 32's BW; between block 1045_1046 and block 1089_1090 the bandwidth provided is 8's BW; between block 1041_1042 and block 1093_1094 the bandwidth provided is 8's BW; between block 1109_1110 and block 1281_1282 the bandwidth provided is 16's BW; between block 1105_1106 and block 1285_1286 the bandwidth provided is 16's BW; between block 1299_1300 and block 1345_1346 the bandwidth provided is 8's BW; and between block 1297_1298 and block 1349_1350 the bandwidth provided is 8's BW.

In one embodiment, the 8's BW, 16's BW, and 32's BW provided between the respective blocks is through the inter-block links between corresponding switch 10 and switch 11 of the respective blocks. Applicant notes that in layout 600 of FIG. 6 the bandwidth provided between the blocks in the top-most row of the complete layout may be in anyone of the stages. Applicant observes that the 8's bandwidth provided in layout 500 of FIG. 5 is 50% of total 8's BW for full connectivity, 16's BW provided is 25% of the total 16's BW for full connectivity and 32's BW provided is 12.5% of the total 32's BW for full connectivity.

Applicant notes that in layout 600 of FIG. 6 the length of some of the wires providing bandwidth to 8's BW, 16's BW and 32's BW are of equal size, and the length of rest of the wires providing bandwidth to 8's BW, 16's BW and 32's BW are of equal size. In layout 600 of FIG. 6, the partial 8's BW, 16's BW and 32's BW is provided in nearest neighbor connectivity manner recursively which makes the wire lengths between different blocks to offer 8's BW is different, also makes the wire lengths between different blocks to offer 16's BW is different and also makes the wire lengths between different blocks to offer 32's BW is different. Layout 600 of FIG. 6 illustrates an embodiment to provide partial bandwidth in a tapered manner, where it is not needed to provide the complete bandwidth in the higher stages.

Figure 7:
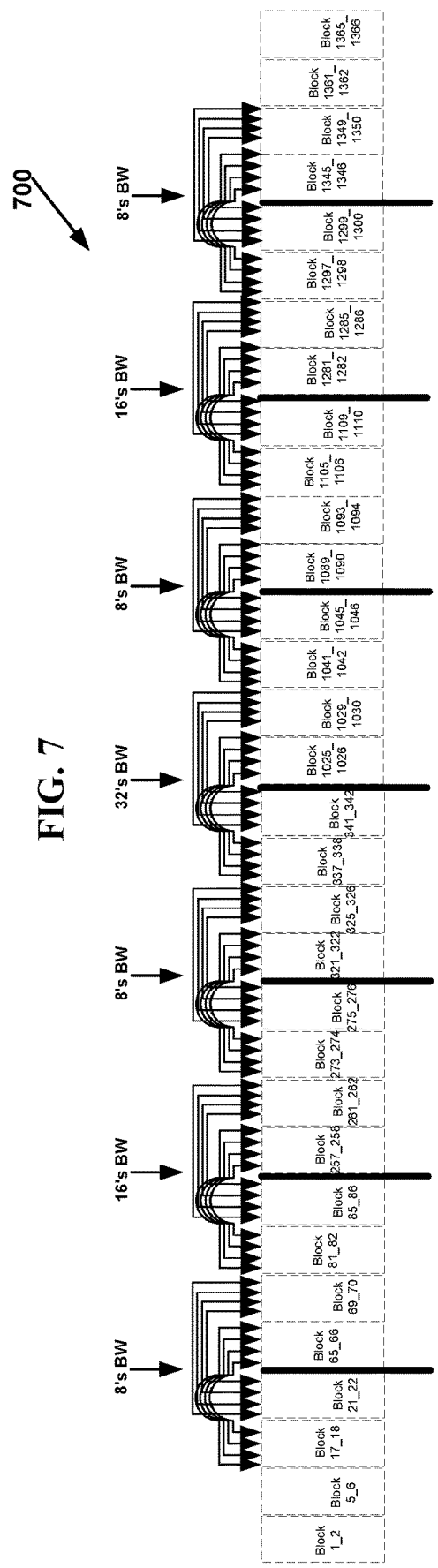
FIG. 7 is a diagram 700 layout of the topmost row of the network $V_{fold-mlink}(N,d,s)$ with N=2048, d=2 and s=2, in one embodiment, illustrating the provisioning of 8's BW, 16's BW and 32's BW in Partial & Tapered Connectivity (Bandwidth) in a stage with equal length wires.

Modified-Hypercube Topology with Partial & Tapered Connectivity (Bandwidth) with Equal Length Wires, in a Stage:

Referring to layout 700 of FIG. 7 illustrates the topmost row of the extension of layout 100H for the network $V_{fold-mlink}(N_1,N_2,d,s)$ where $N_1=N_2=2048$; $d=2$; and $s=2$. In another embodiment of the complete layout, not shown in FIG. 7, there are four super-super-super-quadrants namely top-left super-super-super-quadrant, bottom-left super-super-super-quadrant, top-right super-super-super-quadrant, and bottom-right super-super-super-quadrant. Total number of blocks in the complete layout is one thousand and twenty four. Top-left super-super-quadrant implements the blocks from block 1_2 to block 511_512. Bottom-left super-super-quadrant implements the blocks from block 513_514 to block 1023_1024. Top-right super-super-quadrant implements the blocks from block 1025_1026 to block 1535_1536. Bottom-right super-super-quadrant implements the blocks from block 1537_1538 to block 2047_2048. Each block in all the super-super-quadrants has four more switches namely switch 8, switch 9, switch 10 and switch 11 in addition to the switches [1-7] described in layout 100H of FIG. 1H.

In the embodiment of Layout 700 of FIG. 7 illustrates the 8's BW, 16's BW and 32's BW provided in the top-most row of the complete layout namely between block 21_22 and block 69_70 the bandwidth provided is 8's BW; between block 17_18 and block 65_66 the bandwidth provided is 8's BW; between block 85_86 and block 261_262 the bandwidth provided is 16's BW; between block 81_82 and block 257_258 the bandwidth provided is 16's BW; between block 275_276 and block 325_326 the bandwidth provided is 8's BW; between block 273_274 and block 321_322 the bandwidth provided is 8's BW; between block 341_342 and block 1029_1030 the bandwidth provided is 32's BW; between block 337_338 and block 1025_1026 the bandwidth provided is 32's BW; between block 1045_1046 and block 1093_1094 the bandwidth provided is 8's BW; between block 1041_1042 and block 1089_1090 the bandwidth provided is 8's BW; between block 1109_1110 and block 1285_1286 the bandwidth provided is 16's BW; between block 1105_1106 and block 1281_1282 the bandwidth provided is 16's BW; between block 1299_1300 and block 1349_1350 the bandwidth provided is 8's BW; and between block 1297_1298 and block 1345_1346 the bandwidth provided is 8's BW.

In one embodiment, the 8's BW, 16's BW, and 32's BW provided between the respective blocks is through the inter-block links between corresponding switch 10 and switch 11 of the respective blocks. Applicant notes that in layout 700 of FIG. 7 the bandwidth provided between the blocks in the top-most row of the complete layout may be in anyone of the stages. Applicant observes that the 8's bandwidth provided in layout 500 of FIG. 5 is 50% of total 8's BW for full connectivity, 16's BW provided is 25% of the total 16's BW for full connectivity and 32's BW provided is 12.5% of the total 32's BW for full connectivity. Applicant notes that in layout 700 of FIG. 7 the length of the wires providing bandwidth to 8's BW, 16's BW and 32's BW are all of equal size. Layout 700 of FIG. 7 illustrates another embodiment to provide partial bandwidth in a tapered manner, where it is not needed to provide the complete bandwidth in the higher stages.

All the layout embodiments disclosed in the current invention are applicable to generalized multi-stage networks $V(N_1,N_2,d,s)$, generalized folded multi-stage networks $V_{fold}(N_1,N_2,d,s)$, generalized butterfly fat tree networks $V_{bft}(N_1,N_2,d,s)$, generalized multi-link multi-stage networks $V_{mlink}(N_1,N_2,d,s)$, generalized folded multi-link multi-stage networks $V_{fold-mlink}(N_1,N_2,d,s)$, generalized multi-link butterfly fat tree networks $V_{mlink-bft}(N_1,N_2,d,s)$, and generalized hypercube networks $V_{hcube}(N_1,N_2,d,s)$ for s=1, 2, 3 or any number in general, and for $N_1=N_2=N$ .or $N_1 \neq N_2$, or $N_1 \neq 2_x$ & $N_2 \neq 2^y$ where x, y and d are integers.

Conversely applicant makes another important observation that generalized hypercube networks $V_{hcube}(N_1,N_2,d,s)$ are implemented with the layout topology being the hypercube topology shown in layout 100C of FIG. 1C with large scale cross point reduction as any one of the networks described in the current invention namely: generalized multi-stage networks $V(N_1,N_2,d,s)$, generalized folded multi-stage networks $V_{fold}(N_1,N_2,d,s)$, generalized butterfly fat tree networks $V_{bft}(N_1,N_2,d,s)$, generalized multi-link multi-stage networks $V_{mlink}(N_1,N_2,d,s)$, generalized folded multi-link multi-stage networks $V_{fold-mlink}(N_1,N_2,d,s)$, generalized multi-link butterfly fat tree networks $V_{mlink-bft}(N_1,N_2,d,s)$ for s=1, 2, 3 or any number in general, and for $N_1=N_2=N$ .or $N_1 \neq N_2$, or $N_1 \neq 2^x$ & $N_2 \neq 2^y$ where x, y and d are integers.

Figure 8A:
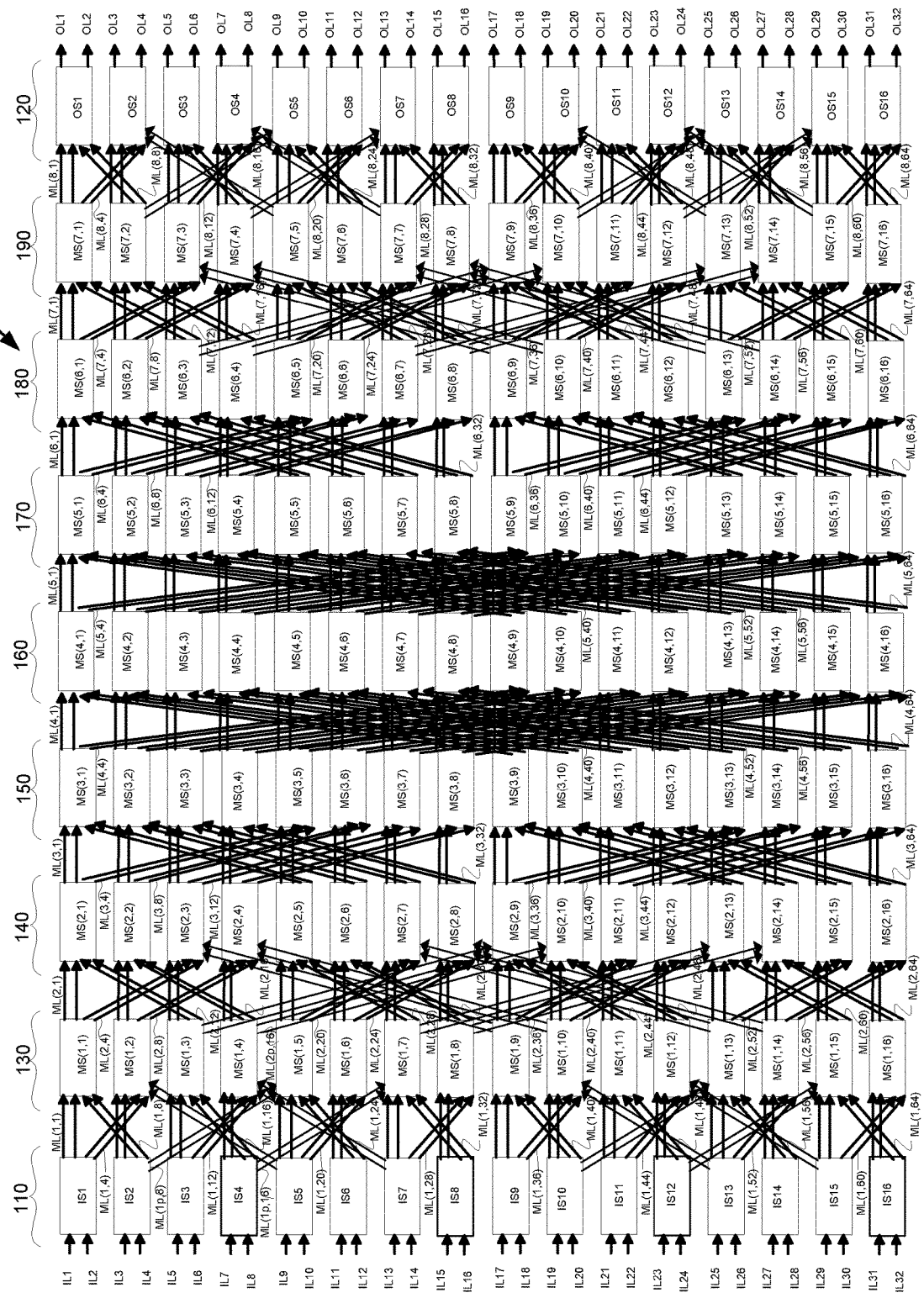
FIG. 8A is a diagram 800A of an exemplary symmetrical multi-link multi-stage pyramid network $V_{mlink-p}(N,d,s)$ having inverse Benes connection topology of nine stages with N=32, d=2 and s=2, strictly nonblocking network for unicast connections and rearrangeably nonblocking network for arbitrary fan-out multicast connections, in accordance with the invention.

Symmetric RNB Generalized Multi-Link Multi-Stage Pyramid Network $V_{mlink-p}(N_1,N_2,d,s)$, Connection Topology: Nearest Neighbor Connectivity and with more than Full Bandwidth:

Referring to diagram 800A in FIG. 8A, in one embodiment, an exemplary generalized multi-link multi-stage pyramid $V_{mlink-p}(N_1,N_2,d,s)$ where $N_1=N_2=32$; d=2; and s=2 with nine stages of one hundred and forty four switches for satisfying communication requests, such as setting up a telephone call or a data call, or a connection between configurable logic blocks, between an input stage 110 and output stage 120 via middle stages 130, 140, 150, 160, 170, 180 and 190 is shown where input stage 110 consists of sixteen switches with ten of two by four switches namely IS1, IS3, IS5, IS6, IS8, IS9, IS11, IS13, IS14, and IS16; and six of two by six switches namely IS2, IS4, IS7, IS10, IS12 and IS15.

The output stage 120 consists of sixteen switches with ten of four by two switches namely OS1, OS3, OS5, OS6, OS8, OS9, OS11, OS13, OS14, and OS16; and six of six by two switches namely OS2, OS4, OS7, OS10, OS12, and OS15.

The middle stage 130 consists of sixteen switches with four of four by four switches namely MS(1,1), MS(1,6), MS(1,11), and MS(1,16); four of six by four switches namely MS(1,2), MS(1,5), MS(1,12) and MS(1,15); four of four by six switches namely MS(1,3), MS(1,8), MS(1,9), and MS(1,14); and four of six by six switches namely MS(1,4), MS(1,7), MS(1,10), and MS(1,13).

The middle stage 190 consists of sixteen switches with four of four by four switches namely MS(7,1), MS(7,6), MS(7,11), and MS(7,16); four of four by six switches namely MS(7,2), MS(7,5), MS(7,12) and MS(7,15); four of six by four switches namely MS(7,3), MS(7,8), MS(7,9), and MS(7,14); and four of six by six switches namely MS(7,4), MS(7,7), MS(7,10), and MS(7,13).

The middle stage 140 consists of sixteen switches with eight of four by four switches namely MS(2,1), MS(2,2), MS(2,5), MS(2,6), MS(2,11), MS(2,12), MS(2,15), and MS(2,16); and eight of six by four switches namely MS(2,3), MS(2,4), MS(2,7), MS(2,8), MS(2,9), MS(2,10), MS(2,13), and MS(2,14).

The middle stage 180 consists of sixteen switches with eight of four by four switches namely MS(6,1), MS(6,2), MS(6,5), MS(6,6), MS(6,11), MS(6,12), MS(6,15), and MS(6,16); and eight of four by six switches namely MS(6,3), MS(6,4), MS(6,7), MS(6,8), MS(6,9), MS(6,10), MS(6,13), and MS(6,14).

And all the remaining middle stages namely the middle stage 150 consists of sixteen, four by four switches MS(3,1)-MS(3,16), middle stage 160 consists of sixteen, four by four switches MS(4,1)-MS(4,16), and middle stage 170 consists of sixteen, four by four switches MS(5,1)-MS(5,16).

The multi-link multi-stage pyramid network $V_{mlink-p}(N_1,N_2,d,s)$ where $N_1=N_2=32$; d=2; and s=2 shown in diagram 800A of FIG. 8A is built on top of the generalized multi-link multi-stage network $V_{mlink}(N_1,N_2,d,s)$ where $N_1=N_2=32$; d=2; and s=2 by adding a few more links.

Since as disclosed in U.S. Provisional Patent Application Ser. No. 60/940,389 that is incorporated by reference above, a network $V_{mlink}(N_1,N_2,d,s)$ can be operated in rearrangeably non-blocking manner for arbitrary fan-out multicast connections and also can be operated in strictly non-blocking manner for unicast connections, the network $V_{mlink-p}(N_1,N_2,d,s)$ can be operated in rearrangeably non-blocking manner for arbitrary fan-out multicast connections and also can be operated in strictly non-blocking manner for unicast connections.

In one embodiment of this network each of the input switches IS1-IS16 and output switches OS1-OS16 are crossbar switches. The number of switches of input stage 110 and of output stage 120 can be denoted in general with the variable $$\frac{N}{d},$$

where N is the total number of inlet links or outlet links. The number of middle switches in each middle stage is denoted by The size of each input switch IS1-IS16 can be denoted in general with the notation $d^+ * (2d)^+$ (hereinafter $d^+$ means d or more; or equivalently $\geq d$) and each output switch OS1-OS16 can be denoted in general with the notation $(2d)^+ * d^+$. Likewise, the size of each switch in any of the middle stages can be denoted as $(2d)^+ * (2d)^+$. A switch as used herein can be either a crossbar switch, or a network of switches each of which in turn may be a crossbar switch or a network of switches. A symmetric multi-stage network can be represented with the notation $V_{mlink\_p}(N,d,s)$, where N represents the total number of inlet links of all input switches (for example the links IL1-IL32), d represents the inlet links of each input switch or outlet links of each output switch, and s is the ratio of number of outgoing links from each input switch to the inlet links of each input switch.

Each of the $$\frac{N}{d}$$

input switches IS1-IS16 are connected to $d^+$ switches in middle stage 130 through two links each for a total of $(2 \times d)^+$ links (for example input switch IS2 is connected to middle switch MS(1,2) through the links ML(1,5), ML(1,6), and also connected to middle switch MS(1,1) through the links ML(1,7) and ML(1,8); In addition input switch IS2 is also connected to middle switch MS(1,5) through the links ML(1p,7) and ML(1p,8). The links ML(1,5), ML(1,6), ML(1,7) and ML(1,8) correspond to multistage network configuration and the links ML(1p,7) and ML(1p,8) correspond to the pyramid network configuration. Hereinafter all the pyramid links are denoted by ML(xp,y) where 'x' represents the stage the link belongs to and 'y' the link number in that stage.)

The middle links which connect switches in the same row in two successive middle stages are called hereinafter straight middle links; and the middle links which connect switches in different rows in two successive middle stages are called hereinafter cross middle links. For example, the middle links ML(1,1) and ML(1,2) connect input switch IS1 and middle switch MS(1,1), so middle links ML(1,1) and ML(1,2) are straight middle links; where as the middle links ML(1,3) and ML(1,4) connect input switch IS1 and middle switch MS(1,2), since input switch IS1 and middle switch MS(1,2) belong to two different rows in diagram 800A of FIG. 8A, middle links ML(1,3) and ML(1,4) are cross middle links. It can be seen that pyramid links such as ML(1p,7) and ML(1p,8) are also cross middle links.

Each of the $$\frac{N}{d}$$

middle switches MS(1,1)-MS(1,16) in the middle stage 130 are connected from $d^+$ input switches through two links each for a total of $(2 \times d)^+$ links (for example the links ML(1,1) and ML(1,2) are connected to the middle switch MS(1,1) from input switch IS1, and the links ML(1,7) and ML(1,8) are connected to the middle switch MS(1,1) from input switch IS2) and also are connected to $d^+$ switches in middle stage 140 through two links each for a total of $(2 \times d)^+$ links (for example the links ML(2,9) and ML(2,10) are connected from middle switch MS(1,3) to middle switch MS(2,3), and the links ML(2,11) and ML(2,12) are connected from middle switch MS(1,3) to middle switch MS(2,1); In addition middle switch MS(1,3) is also connected to middle switch MS(2,9) through the links ML(2p,11) and ML(2p,12). The links ML(2,9), ML(2,10), ML(2,11) and ML(2,12) correspond to multistage network configuration and the links ML(2p,11) and ML(2p,12) correspond to the pyramid network configuration.)

Each of the $$\frac{N}{d}$$

middle switches MS(2,1)-MS(2,16) in the middle stage 140 are connected from $d^+$ input switches through two links each for a total of $(2 \times d)^+$ links (for example the links ML(2,1) and ML(2,2) are connected to the middle switch MS(2,1) from input switch MS(1,1), and the links ML(1,11) and ML(1,12) are connected to the middle switch MS(2,1) from input switch MS(1,3)) and also are connected to $d^+$ switches in middle stage 150 through two links each for a total of $(2 \times d)^+$ links (for example the links ML(3,1) and ML(3,2) are connected from middle switch MS(2,1) to middle switch MS(3,1), and the links ML(3,3) and ML(3,4) are connected from middle switch MS(2,1) to middle switch MS(3,6)).

Each of the $$\frac{N}{d}$$

middle switches MS(3,1)-MS(3,16) in the middle stage 150 are connected from $d^+$ input switches through two links each for a total of $(2 \times d)^+$ links (for example the links ML(3,1) and ML(3,2) are connected to the middle switch MS(3,1) from input switch MS(2,1), and the links ML(2,23) and ML(2,24) are connected to the middle switch MS(3,1) from input switch MS(2,6)) and also are connected to $d^+$ switches in middle stage 160 through two links each for a total of $(2 \times d)^+$ links (for example the links ML(4,1) and ML(4,2) are connected from middle switch MS(3,1) to middle switch MS(4,1), and the links ML(4,3) and ML(4,4) are connected from middle switch MS(3,1) to middle switch MS(4,11)).

Each of the $$\frac{N}{d}$$

middle switches MS(4,1)-MS(4,16) in the middle stage 160 are connected from $d^+$ input switches through two links each for a total of $(2 \times d)^+$ links (for example the links ML(4,1) and ML(4,2) are connected to the middle switch MS(4,1) from input switch MS(3,1), and the links ML(4,43) and ML(4,44) are connected to the middle switch MS(4,1) from input switch MS(3,11)) and also are connected to $d^+$ switches in middle stage 170 through two links each for a total of $(2 \times d)^+$ links (for example the links ML(5,1) and ML(5,2) are connected from middle switch MS(4,1) to middle switch MS(5,1), and the links ML(5,3) and ML(5,4) are connected from middle switch MS(4,1) to middle switch MS(5,11)).

Each of the $$\frac{N}{d}$$

middle switches MS(5,1)-MS(5,16) in the middle stage 170 are connected from d⁺ input switches through two links each for a total of (2×d)⁺ links (for example the links ML(5,1) and ML(5,2) are connected to the middle switch MS(5,1) from input switch MS(4,1), and the links ML(5,43) and ML(5,44) are connected to the middle switch MS(5,1) from input switch MS(4,11)) and also are connected to d⁺ switches in middle stage 180 through two links each for a total of (2×d)⁺ links (for example the links ML(6,1) and ML(6,2) are connected from middle switch MS(5,1) to middle switch MS(6,1), and the links ML(6,3) and ML(6,4) are connected from middle switch MS(5,1) to middle switch MS(6,6)).

Each of the $$\frac{N}{d}$$

middle switches MS(6,1)-MS(6,16) in the middle stage 180 are connected from d⁺ input switches through two links each for a total of (2×d)⁺ links (for example the links ML(6,1) and ML(6,2) are connected to the middle switch MS(6,1) from input switch MS(5,1), and the links ML(6,23) and ML(6,24) are connected to the middle switch MS(6,1) from input switch MS(5,6)) and also are connected to d⁺ switches in middle stage 190 through two links each for a total of (2×d)⁺ links (for example the links ML(7,9) and ML(7,10) are connected from middle switch MS(6,3) to middle switch MS(7,3), and the links ML(7,11) and ML(7,12) are connected from middle switch MS(6,3) to middle switch MS(7,1); In addition middle switch MS(6,3) is also connected to middle switch MS(7,9) through the links ML(7p,11) and ML(7p,12). The links ML(7,9), ML(7,10), ML(7,11) and ML(7,12) correspond to multistage network configuration and the links ML(7p,11) and ML(7p,12) correspond to the pyramid network configuration.)

Each of the $$\frac{N}{d}$$

middle switches MS(7,1)-MS(7,16) in the middle stage 190 are connected from d⁺ input switches through two links each for a total of (2×d)⁺ links (for example the links ML(7,1) and ML(7,2) are connected to the middle switch MS(7,1) from input switch MS(6,1), and the links ML(7,11) and ML(7,12) are connected to the middle switch MS(7,1) from input switch MS(6,3)) and also are connected to d⁺ switches in middle stage 120 through two links each for a total of (2×d)⁺ links (for example middle switch MS(7,2) is connected to output switch OS2 through the links ML(8,5), ML(8,6), and also connected to middle switch OS1 through the links ML(8,7) and ML(8,8); In addition middle switch MS(7,2) is also connected to output switch OS5 through the links ML(8p,7) and ML(8p,8). The links ML(8,5), ML(8,6), ML(8,7) and ML(8,8) correspond to multistage network configuration and the links ML(8p,7) and ML(8p,8) correspond to the pyramid network configuration.)

Each of the $$\frac{N}{d}$$

middle switches OS1-OS16 in the middle stage 120 are connected from d⁺ input switches through two links each for a total of (2×d)⁺ links (for example the links ML(8,1) and ML(8,2) are connected to the output switch OS1 from input switch MS(7,1), and the links ML(8,7) and ML(7,8) are connected to the output switch OS1 from input switch MS(7,2)).

Finally the connection topology of the network 800A shown in FIG. 8A is logically similar to back to back inverse Benes connection topology. In addition there are additional nearest neighbor links (i.e., pyramid links as described before) between the input stage 110 and middle stage 130; between middle stage 130 and middle stage 140; between middle stage 180 and middle stage 190; and middle stage 190 and output stage 120.

Applicant notes that in a multi-stage pyramid network with a fully connected multi-stage network configuration the pyramid links may not contribute for the connectivity however these links can be cleverly used to reduce the latency and power in an integrated circuit even though the number of cross points required are more to connect pyramid links than is required in a purely multi-stage network.

Applicant notes that in the generalized multi-link multi-stage pyramid network $V_{mlink-p}(N_1,N_2,d,s)$ the pyramid links are provided between any two successive stages as illustrated in the diagram 800A of FIG. 8A. The pyramid links in general are also provided between the switches in the same stage. The pyramid links are also provided between any two arbitrary stages.

Figure 8B:
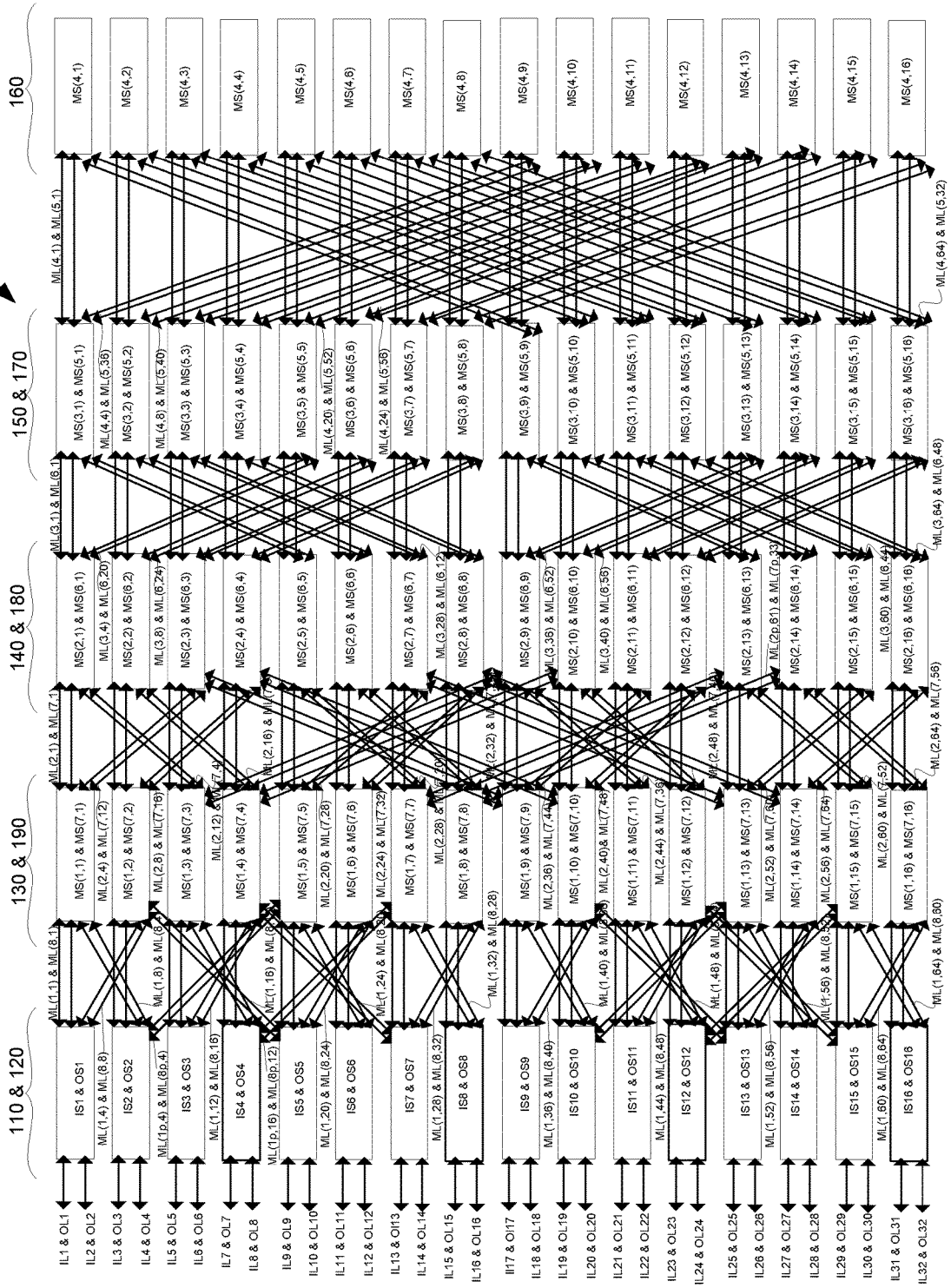
FIG. 8B is a diagram 800B of the equivalent symmetrical folded multi-link multi-stage pyramid network $V_{fold-mlink-p}(N,d,s)$ of the network 800A shown in FIG. 8A, having inverse Benes connection topology of five stages with N=32, d=2 and s=2, strictly nonblocking network for unicast connections and rearrangeably nonblocking network for arbitrary fan-out multicast connections, in accordance with the invention.

Referring to diagram 800B in FIG. 8B, is a folded version of the multi-link multi-stage pyramid network 800A shown in FIG. 8A. The network 800B in FIG. 8B shows input stage 110 and output stage 120 are placed together. That is input switch IS1 and output switch OS1 are placed together, input switch IS2 and output switch OS2 are placed together, and similarly input switch IS16 and output switch OS16 are placed together. All the right going links {i.e., inlet links IL1-IL32 and middle links ML(1,1)-ML(1,64)} correspond to input switches IS1-IS16, and all the left going links {i.e., middle links ML(8,1)-ML(8,64) and outlet links OL1-OL32} correspond to output switches OS1-OS16.

Middle stage 130 and middle stage 190 are placed together. That is middle switches MS(1,1) and MS(7,1) are placed together, middle switches MS(1,2) and MS(7,2) are placed together, and similarly middle switches MS(1,16) and MS(7,16) are placed together. All the right going middle links {i.e., middle links ML(1,1)-ML(1,64) and middle links ML(2,1)-ML(2,64)} correspond to middle switches MS(1,1)-MS(1,16), and all the left going middle links {i.e., middle links ML(7,1)-ML(7,64) and middle links ML(8,1) and ML(8,64)} correspond to middle switches MS(7,1)-MS(7,16).

Middle stage 140 and middle stage 180 are placed together. That is middle switches MS(2,1) and MS(6,1) are placed together, middle switches MS(2,2) and MS(6,2) are placed together, and similarly middle switches MS(2,16) and MS(6,16) are placed together. All the right going middle links {i.e., middle links ML(2,1)-ML(2,64) and middle links ML(3,1)-ML(3,64)} correspond to middle switches MS(2,1)-MS(2,16), and all the left going middle links {i.e., middle links ML(6,1)-ML(6,64) and middle links ML(7,1) and ML(7,64)} correspond to middle switches MS(6,1)-MS(6, 16).

Middle stage 150 and middle stage 170 are placed together. That is middle switches MS(3,1) and MS(5,1) are placed together, middle switches MS(3,2) and MS(5,2) are placed together, and similarly middle switches MS(3,16) and MS(5,16) are placed together. All the right going middle links {i.e., middle links ML(3,1)-ML(3,64) and middle links ML(4,1)-ML(4,64)} correspond to middle switches MS(3, 1)-MS(3,16), and all the left going middle links {i.e., middle links ML(5,1)-ML(5,64) and middle links ML(6,1) and ML(6,64)} correspond to middle switches MS(5,1)-MS(5, 16).

Middle stage 160 is placed alone. All the right going middle links are the middle links ML(4,1)-ML(4,64) and all the left going middle links are middle links ML(5,1)-ML(5, 64).

Just the same way as the connection topology of the network 800A shown in FIG. 8A, the connection topology of the network 800B shown in FIG. 8B is the folded version and logically similar to back to back inverse Benes connection topology. In addition there are additional nearest neighbor links (i.e., pyramid links as described before) between the input stage 110 and middle stage 130; between middle stage 130 and middle stage 140; between middle stage 180 and middle stage 190; and between middle stage 190 and output stage 120.

The multi-link multi-stage pyramid network $V_{fold\ mlink\ p}(N_1,N_2,d,s)$ where $N_1=N_2=32$; $d=2$; and $s=2$ shown in diagram 800B of FIG. 8B is built on top of the generalized multi-link multi-stage network $V_{fold-mlink}(N_1, N_2,d,s)$ where $N_1=N_2=32$; $d=2$; and $s=2$ by also adding a few more links.

Since as disclosed in U.S. Provisional Patent Application Ser. No. 60/940,389 that is incorporated by reference above, a network $V_{fold-mlink}(N_1,N_2,d,s)$ can be operated in rearrangeably non-blocking manner for arbitrary fan-out multicast connections and also can be operated in strictly non-blocking manner for unicast connections, the network $V_{fold-mlink-p}(N_1,N_2,d,s)$ can be operated in rearrangeably non-blocking manner for arbitrary fan-out multicast connections and also can be operated in strictly non-blocking manner for unicast connections.

In one embodiment, in the network 800B of FIG. 8B, the switches that are placed together are implemented as separate switches then the network 800B is the generalized folded multi-link multi-stage pyramid network $V_{fold-mlink-p}$ $(N_1,N_2,d,s)$ where $N_1=N_2=32$; $d=2$; and $s=2$ with nine stages. That is the switches that are placed together in input stage 110 and output stage 120 are implemented as a two by four switch and a four by two switch respectively. For example the input switch IS1 and output switch OS1 are placed together; so input switch IS1 is implemented as two by four switch with the inlet links IL1 and IL2 being the inputs of the input switch IS1 and middle links ML(1,1)-ML(1,4) being the outputs of the input switch IS1; and output switch OS1 is implemented as four by two switch with the middle links ML(8,1), ML(8,2), ML(8,7) and ML(8,8) being the inputs of the output switch OS1 and outlet links OL1-OL2 being the outputs of the output switch OS1. Similarly in this embodiment of network 800B all the switches that are placed together in each middle stage are implemented as separate switches.

Figure 8C:
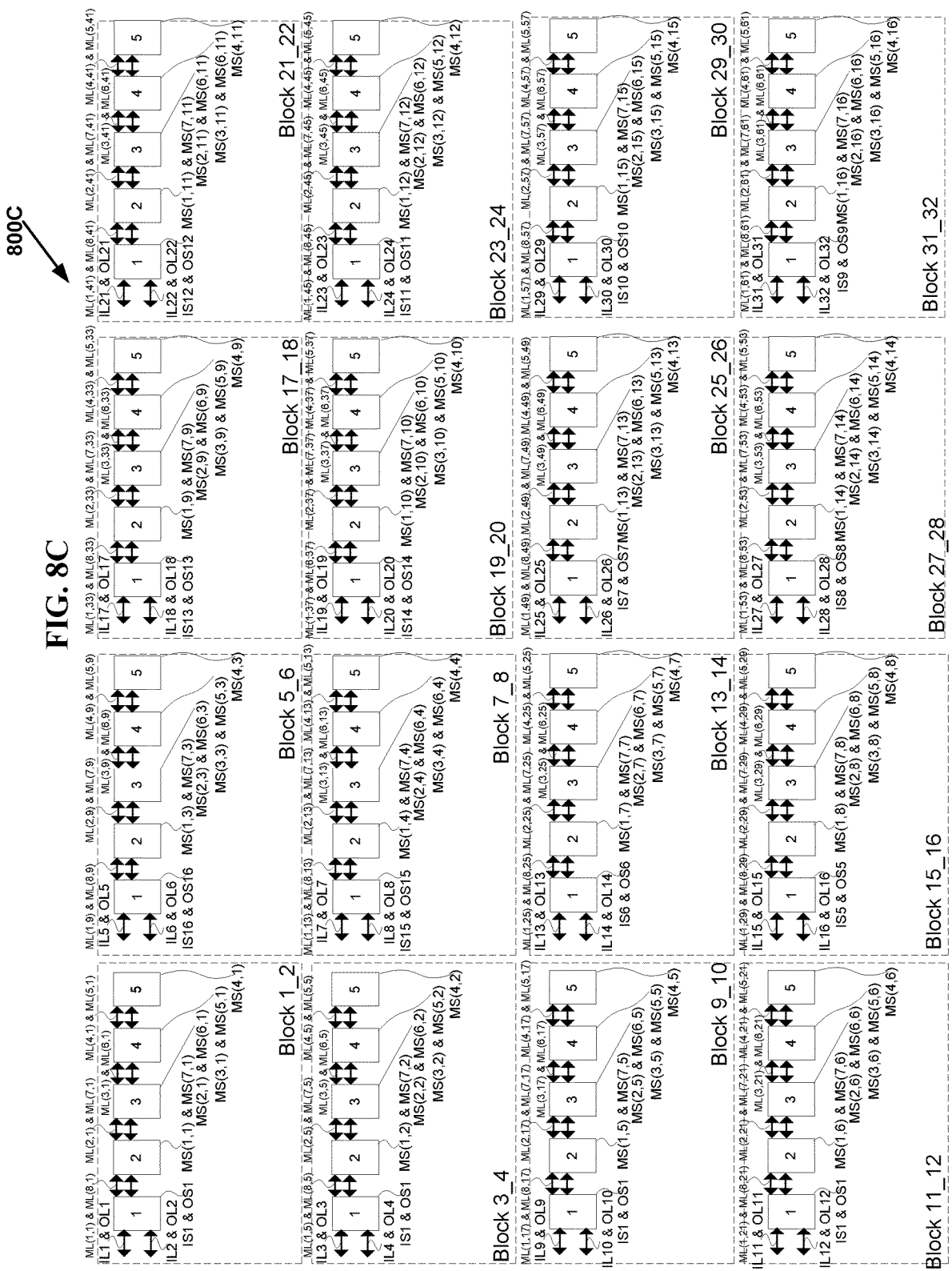
FIG. 8C is a diagram 800C layout of the network $V_{fold-mlink-p}(N,d,s)$ shown in FIG. 8B, in one embodiment, illustrating the connection links belonging with in each block only.

Modified-Hypercube Topology Layout Scheme:

Referring to layout 800C of FIG. 8C, in one embodiment, there are sixteen blocks namely Block 1_2, Block 3_4, Block 5_6, Block 7_8, Block 9_10, Block 11_12, Block 13_14, Block 16_16, Block 17_18, Block 19_20, Block 21_22, Block 23_24, Block 25_26, Block 27_28, Block 29_30, and Block 31_32. Each block implements all the switches in one row of the network 800B of FIG. 8B, one of the key aspects of the current invention. For example Block 1_2 implements the input switch IS1, output Switch OS1, middle switch MS(1,1), middle switch MS(7,1), middle switch MS(2,1), middle switch MS(6,1), middle switch MS(3,1), middle switch MS(5,1), and middle switch MS(4, 1). For the simplification of illustration, Input switch IS1 and output switch OS1 together are denoted as switch 1; Middle switch MS(1,1) and middle switch MS(7,1) together are denoted by switch 2; Middle switch MS(2,1) and middle switch MS(6,1) together are denoted by switch 3; Middle switch MS(3,1) and middle switch MS(5,1) together are denoted by switch 4; Middle switch MS(4,1) is denoted by switch 5.

All the straight middle links are illustrated in layout 800C of FIG. 8C. For example in Block 1_2, inlet links IL1-IL2, outlet links OL1-OL2, middle link ML(1,1), middle link ML(1,2), middle link ML(8,1), middle link ML(8,2), middle link ML(2,1), middle link ML(2,2), middle link ML(7,1), middle link ML(7,2), middle link ML(3,1), middle link ML(3,2), middle link ML(6,1), middle link ML(6,2), middle link ML(4,1), middle link ML(4,2), middle link ML(5,1) and middle link ML(5,2) are illustrated in layout 800C of FIG. 8C.

Even though it is not illustrated in layout 800C of FIG. 8C, in each block, in addition to the switches there may be Configurable Logic Blocks (CLB) or any arbitrary digital circuit depending on the applications in different embodiments. There are four quadrants in the layout 800C of FIG. 8C namely top-left, bottom-left, top-right and bottom-right quadrants. Top-left quadrant implements Block 1_2, Block 3_4, Block 5_6, and Block 7_8. Bottom-left quadrant implements Block 9_10, Block 11_12, Block 13_14, and Block 15_16. Top-right quadrant implements Block 17_18, Block 19_20, Block 21_22, and Block 23_24. Bottom-right quadrant implements Block 25_26, Block 27_28, Block 29_30, and Block 31_32. There are two halves in layout 800C of FIG. 8C namely left-half and right-half. Left-half consists of top-left and bottom-left quadrants. Right-half consists of top-right and bottom-right quadrants.

Recursively in each quadrant there are four sub-quadrants. For example in top-left quadrant there are four sub-quadrants namely top-left sub-quadrant, bottom-left sub-quadrant, top-right sub-quadrant and bottom-right sub-quadrant. Top-left sub-quadrant of top-left quadrant implements Block 1_2. Bottom-left sub-quadrant of top-left quadrant implements Block 3_4. Top-right sub-quadrant of top-left quadrant implements Block 5_6. Finally bottom-right sub-quadrant of top-left quadrant implements Block 7_8. Similarly there are two sub-halves in each quadrant. For example in top-left quadrant there are two sub-halves namely left-sub-half and right-sub-half. Left-sub-half of top-left quadrant implements Block 1_2 and Block 3_4. Right-sub-half of top-left quadrant implements Block 5_6 and Block 7_8. Finally applicant notes that in each quadrant or half the blocks are arranged as a general binary hypercube. Recursively in larger multi-stage network $V_{fold-mlink-p}(N_1,N_2,d,s)$ where $N_1=N_2>32$, the layout in this embodiment in accordance with the current invention, will be such that the super-quadrants will also be arranged in d-ary hypercube manner. (In the embodiment of the layout 800C of FIG. 8C, it is binary hypercube manner since d=2, in the network $V_{fold-mlink-p}(N_1,N_2,d,s)$ 800B of FIG. 8B).

Figure 8D:
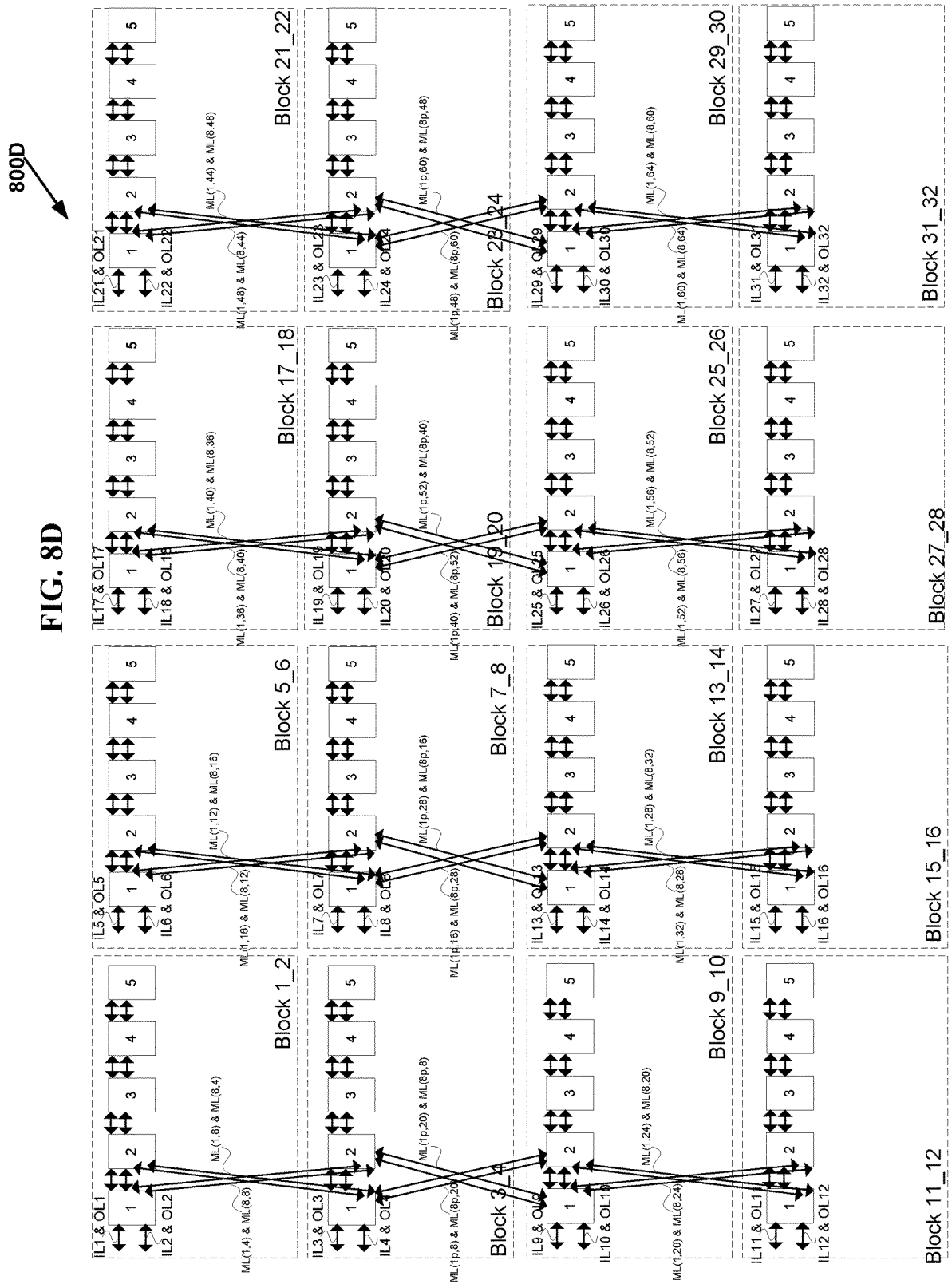
FIG. 8D is a diagram 800D layout of the network $V_{fold-mlink-p}(N,d,s)$ shown in FIG. 8B, in one embodiment, illustrating the connection links $ML(1,i)$ for i=[1, 64] and $ML(8,i)$ for i=[1,64].

Layout 800D of FIG. 8D illustrates the inter-block links between switches 1 and 2 of each block. For example middle links ML(1,3), ML(1,4), ML(8,7), and ML(8,8) are connected between switch 1 of Block 1_2 and switch 2 of Block 3_4. Middle links ML(1,7), ML(1,8), ML(8,3), and ML(8,4) are connected between switch 2 of Block 1_2 and switch 1 of Block 3_4. Similarly pyramid middle links ML(1*p*,7), ML(1*p*,8), ML(8*p*,19), and ML(8*p*,20) are connected between switch 1 of Block 3_4 and switch 2 of Block 9_10. Similarly pyramid middle links ML(1*p*,19), ML(1*p*,20), ML(8*p*,7), and ML(8*p*,8 are connected between switch 2 of Block 3_4 and switch 1 of Block 9_10.

Applicant notes that the inter-block links illustrated in layout 800D of FIG. 8D can be implemented as vertical tracks in one embodiment. Also in one embodiment inter-block links are implemented as two different tracks (for example middle links ML(1,4) and ML(8,8) are implemented as two different tracks); or in an alternative embodiment inter-block links are implemented as a time division multiplexed single track (for example middle links ML(1,4) and ML(8,8) are implemented as a time division multiplexed single track).

Layout 800E of FIG. 8E illustrates the inter-block links between switches 2 and 3 of each block. For example middle links ML(2,3), ML(2,4), ML(7,11), and ML(7,12) are connected between switch 2 of Block 1_2 and switch 3 of Block 3_4. Middle links ML(2,11), ML(2,12), ML(7,3), and ML(7,4) are connected between switch 3 of Block 1_2 and switch 2 of Block 3_4. Similarly pyramid middle links ML(2*p*,35), ML(2*p*,36), ML(7*p*,11), and ML(7*p*,12) are connected between switch 1 of Block 5_6 and switch 2 of Block 17_18. Similarly pyramid middle links ML(2*p*,11), ML(2*p*,12), ML(7*p*,35), and ML(7*p*,36) are connected between switch 2 of Block 5_6 and switch 1 of Block 17_18.

Applicant notes that the inter-block links illustrated in layout 800E of FIG. 8E can be implemented as horizontal tracks in one embodiment. Also in one embodiment inter-block links are implemented as two different tracks (for example middle links ML(2,12) and ML(7,4) are implemented as two different tracks); or in an alternative embodiment inter-block links are implemented as a time division multiplexed single track (for example middle links ML(2,12) and ML(7,4) are implemented as a time division multiplexed single track).

Figure 8F:
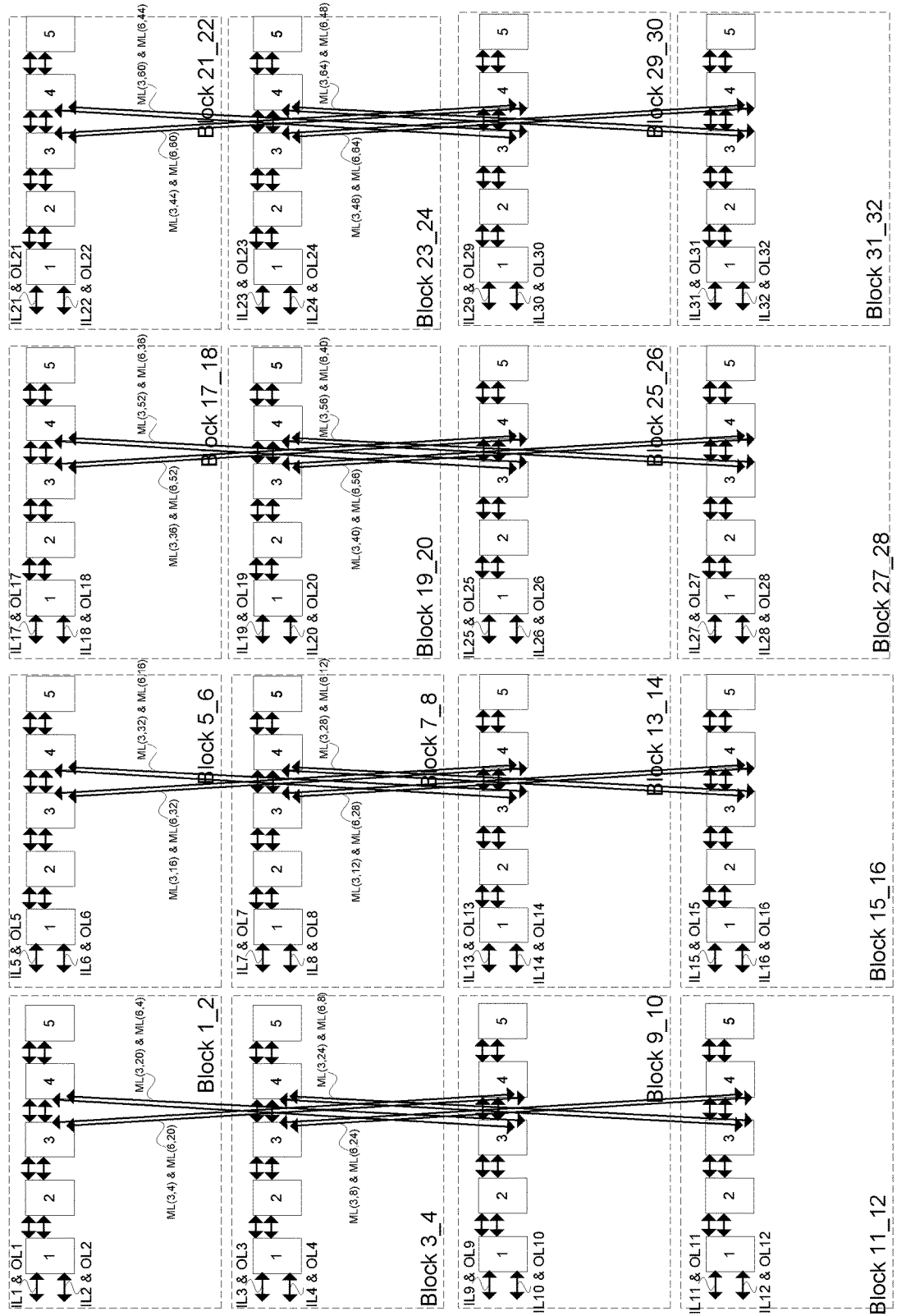
FIG. 8F is a diagram 800F layout of the network $V_{fold-mlink-p}(N,d,s)$ shown in FIG. 8B, in one embodiment, illustrating the connection links $ML(3,i)$ for i=[1, 64] and $ML(6,i)$ for i=[1,64].

Layout 800F of FIG. 8F illustrates the inter-block links between switches 3 and 4 of each block. For example middle links ML(3,3), ML(3,4), ML(6,19), and ML(6,20) are connected between switch 3 of Block 1_2 and switch 4 of Block 3_4. Similarly middle links ML(3,19), ML(3,20), ML(6,3), and ML(6,4) are connected between switch 4 of Block 1_2 and switch 3 of Block 3_4. Applicant notes that the inter-block links illustrated in layout 800F of FIG. 8F can be implemented as vertical tracks in one embodiment. Also in one embodiment inter-block links are implemented as two different tracks (for example middle links ML(3,4) and ML(6,20) are implemented as two different tracks); or in an alternative embodiment inter-block links are implemented as a time division multiplexed single track (for example middle links ML(3,4) and ML(6,20) are implemented as a time division multiplexed single track).

Figure 8G:
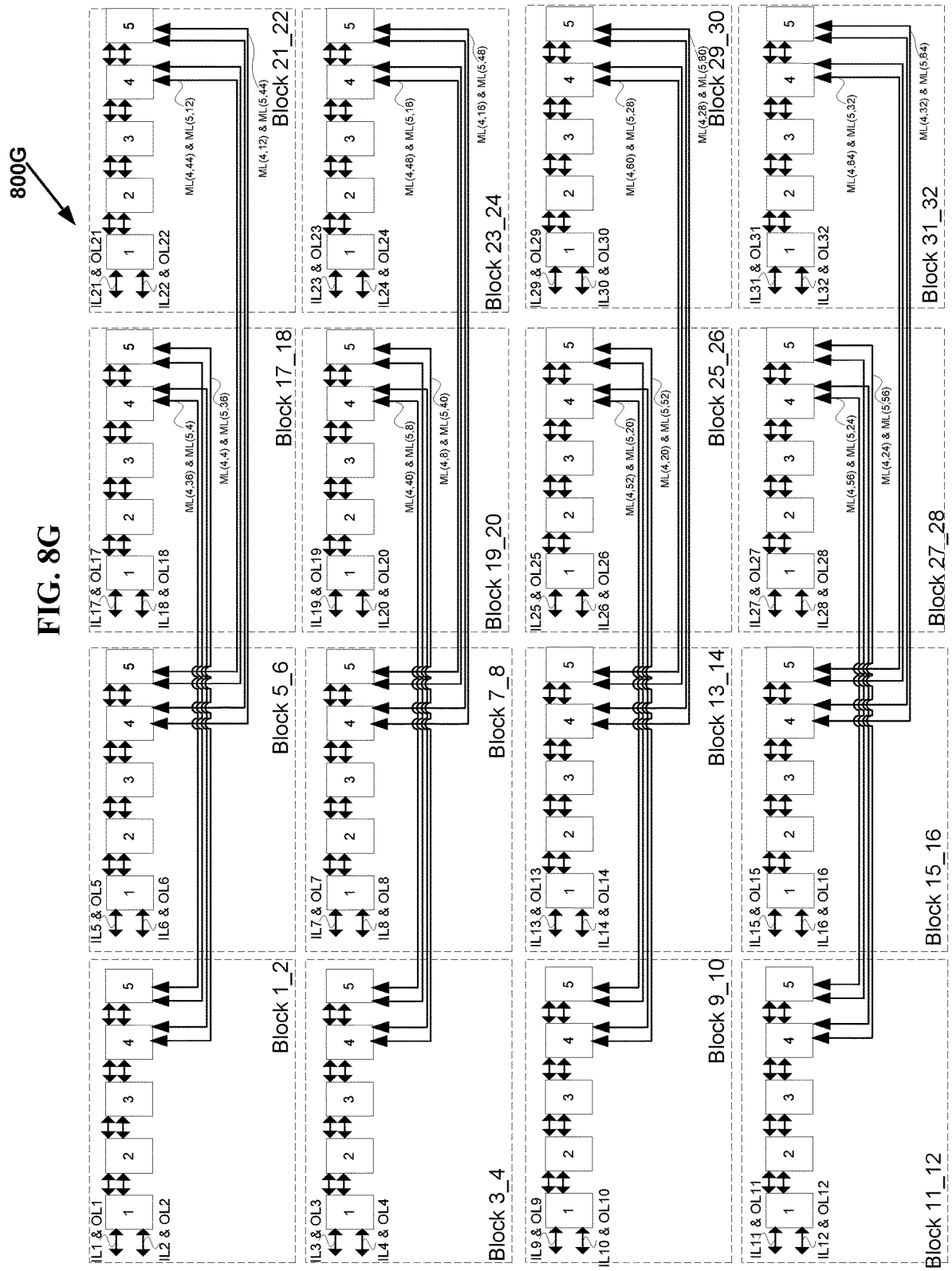
FIG. 8G is a diagram 800G layout of the network $V_{fold-mlink-p}(N,d,s)$ shown in FIG. 8B, in one embodiment, illustrating the connection links $ML(4,i)$ for i=[1, 64] and $ML(5,i)$ for i=[1,64].

Layout 800G of FIG. 8G illustrates the inter-block links between switches 4 and 5 of each block. For example middle links ML(4,3), ML(4,4), ML(5,35), and ML(5,36) are connected between switch 4 of Block 1_2 and switch 5 of Block 3_4. Similarly middle links ML(4,35), ML(4,36), ML(5,3), and ML(5,4) are connected between switch 5 of Block 1_2 and switch 4 of Block 3_4. Applicant notes that the inter-block links illustrated in layout 800G of FIG. 8G can be implemented as horizontal tracks in one embodiment. Also in one embodiment inter-block links are implemented as two different tracks (for example middle links ML(4,4) and ML(5,36) are implemented as two different tracks); or in an alternative embodiment inter-block links are implemented as a time division multiplexed single track (for example middle links ML(4,4) and ML(5,36) are implemented as a time division multiplexed single track).

The complete layout for the network 800B of FIG. 8B is given by combining the links in layout diagrams of 800C, 800D, 800E, 800F, and 800G. Applicant notes that in the layout 800C of FIG. 8C, the inter-block links between switch 1 and switch 2 of corresponding blocks are vertical tracks as shown in layout 800D of FIG. 8D; the inter-block links between switch 2 and switch 3 of corresponding blocks are horizontal tracks as shown in layout 800E of FIG. 8E; the inter-block links between switch 3 and switch 4 of corresponding blocks are vertical tracks as shown in layout 800F of FIG. 8F; and finally the inter-block links between switch 4 and switch 5 of corresponding blocks are horizontal tracks as shown in layout 800G of FIG. 8G. The pattern is alternate vertical tracks and horizontal tracks. It continues recursively for larger networks of N>32 as will be illustrated later.

Some of the key aspects of the current invention are discussed. 1) All the switches in one row of the multi-stage network 800B are implemented in a single block. 2) The blocks are placed in such a way that all the inter-block links are either horizontal tracks or vertical tracks; 3) Since all the inter-block links are either horizontal or vertical tracks, all the inter-block links can be mapped on to island-style architectures in current commercial FPGA's; 4) The length of the longest wire is about half of the width (or length) of the complete layout (For example middle link ML(4,4) is about half the width of the complete layout).

In accordance with the current invention, the layout 800C in FIG. 8C can be recursively extended for any arbitrarily large generalized folded multi-link multi-stage network $V_{fold-mlink-p}(N_1,N_2,d,s)$ the sub-quadrants, quadrants, and super-quadrants are arranged in d-ary hypercube manner and also the inter-blocks are accordingly connected in d-ary hypercube topology. Even though all the embodiments in the current invention are illustrated for $N_1=N_2$, the embodiments can be extended for $N_1 \ne N_2$.

Figure 8H:
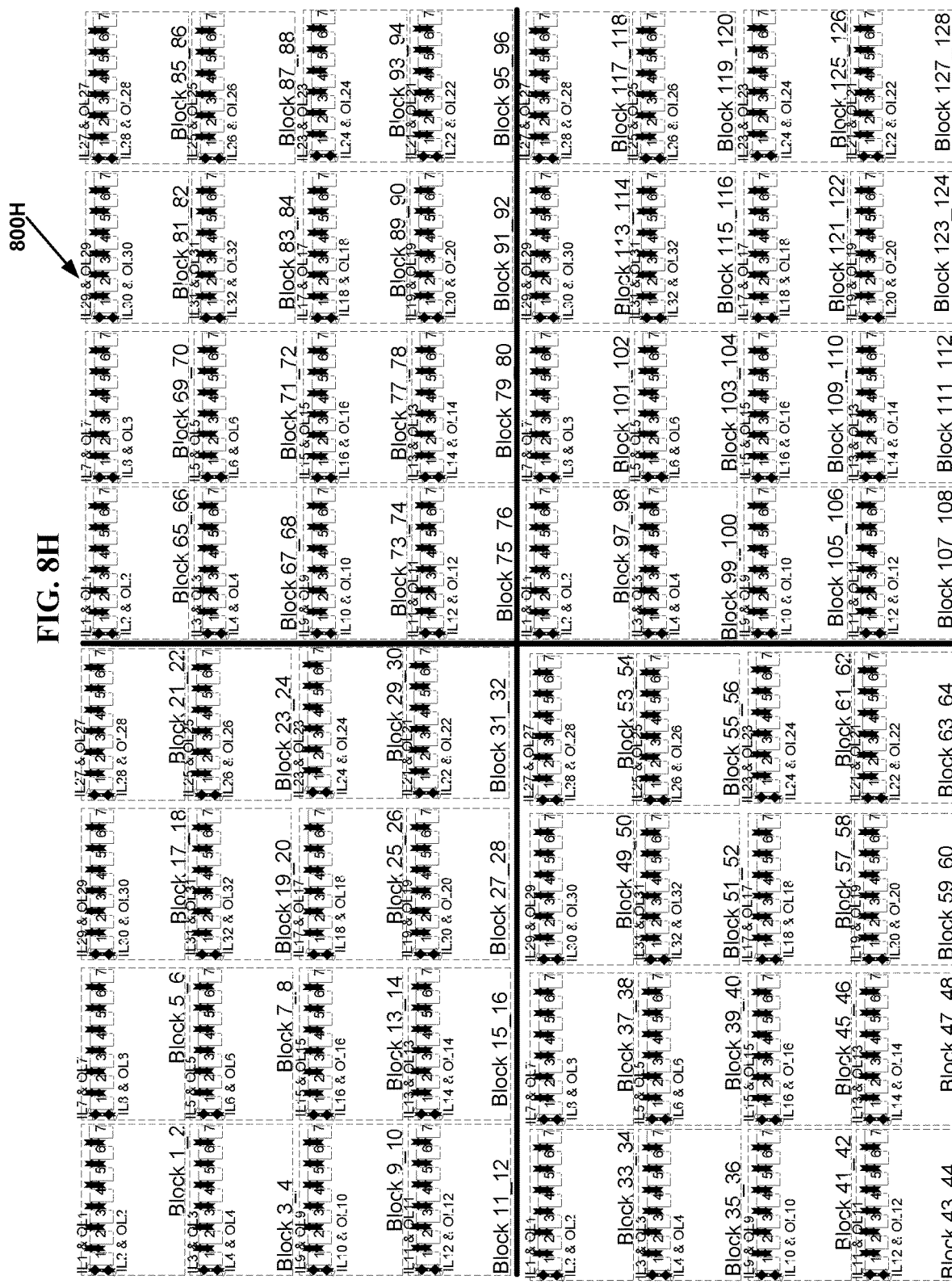
FIG. 8H is a diagram 800H layout of a network $V_{fold-mlink-p}(N,d,s)$ where N=128, d=2, and s=2, in one embodiment, illustrating the connection links belonging with in each block only.

Referring to layout 800H of FIG. 8H, illustrates the extension of layout 800C for the network $V_{fold-mlink-p}(N_1, N_2,d,s)$ where $N_1=N_2=128$; d=2; and s=2. There are four super-quadrants in layout 800H namely top-left super-quadrant, bottom-left super-quadrant, top-right super-quadrant, bottom-right super-quadrant. Total number of blocks in the layout 800H is sixty four. Top-left super-quadrant implements the blocks from block 1_2 to block 31_32. Each block in all the super-quadrants has two more switches namely switch 6 and switch 7 in addition to the switches [1-5] illustrated in layout 800C of FIG. 8C. The inter-block link connection topology is the exactly the same between the switches 1 and 2; switches 2 and 3; switches 3 and 4; switches 4 and 5 as it is shown in the layouts of FIG. 8D, FIG. 8E, FIG. 8F, and FIG. 8G respectively.

Bottom-left super-quadrant implements the blocks from block 33_34 to block 63_64. Top-right super-quadrant implements the blocks from block 65_66 to block 95_96. And bottom-right super-quadrant implements the blocks from block 97_98 to block 127_128. In all these three super-quadrants also, the inter-block link connection topology is exactly the same between the switches 1 and 2;

switches 2 and 3; switches 3 and 4; switches 4 and 5 as that of the top-left super-quadrant.

Recursively in accordance with the current invention, the inter-block links connecting the switch 5 and switch 6 will be vertical tracks between the corresponding switches of top-left super-quadrant and bottom-left super-quadrant. And similarly the inter-block links connecting the switch 5 and switch 6 will be vertical tracks between the corresponding switches of top-right super-quadrant and bottom-right super-quadrant. The inter-block links connecting the switch 6 and switch 7 will be horizontal tracks between the corresponding switches of top-left super-quadrant and top-right super-quadrant. And similarly the inter-block links connecting the switch 6 and switch 7 will be horizontal tracks between the corresponding switches of bottom-left super-quadrant and bottom-right super-quadrant.

Figure 8I:
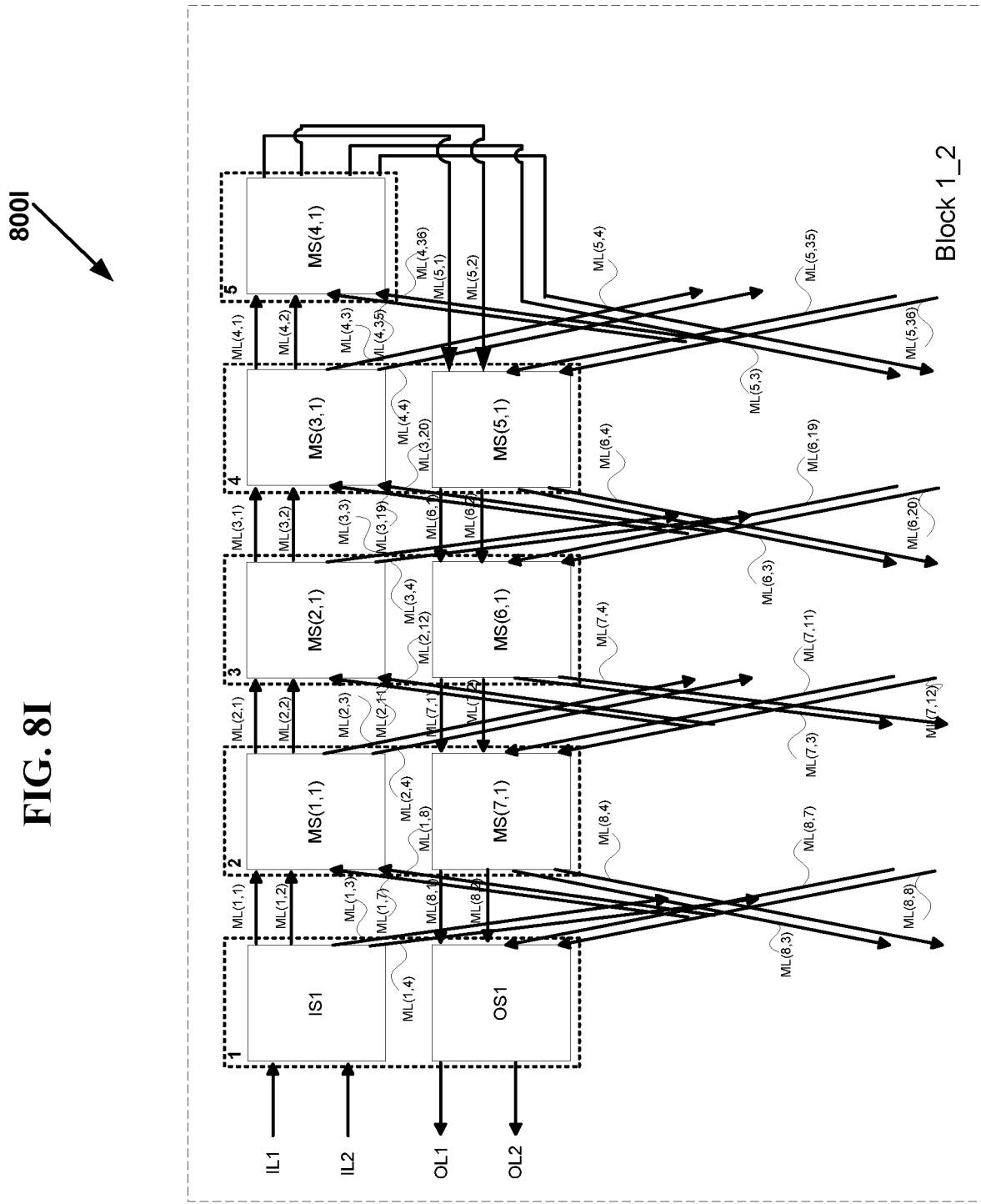
FIG. 8I is a diagram 800I detailed connections of BLOCK 1_2 in the network layout 800C in one embodiment, illustrating the connection links going in and coming out when the layout 800C is implementing $V_{mlink-p}(N,d,s)$ or $V_{fold-mlink-p}(N,d,s)$.

Referring to diagram 800I of FIG. 8I illustrates a high-level implementation of Block 1_2 (Each of the other blocks have similar implementation) of the layout 800C of FIG. 8C which represents a generalized folded multi-link multi-stage network $V_{fold\text{-}mlink\text{-}p}(N_1,N_2,d,s)$ where $N_1=N_2=32$; $d=2$; and $s=2$. Block 1_2 in 800I illustrates both the intra-block and inter-block links connected to Block 1_2. The layout diagram 800I corresponds to the embodiment where the switches that are placed together are implemented as separate switches in the network 800B of FIG. 8B. As noted before then the network 800B is the generalized folded multi-link multi-stage network $V_{fold\text{-}mlink\text{-}p}(N_1,N_2,d,s)$ where $N_1=N_2=32$; $d=2$; and $s=2$ with nine stages.

That is the switches that are placed together in Block 1_2 as shown in FIG. 8I are namely input switch IS1 and output switch OS1 belonging to switch 1, illustrated by dotted lines, (as noted before switch 1 is for illustration purposes only, in practice the switches implemented are input switch IS1 and output switch OS1); middle switch MS(1,1) and middle switch MS(7,1) belonging to switch 2; middle switch MS(2,1) and middle switch MS(6,1) belonging to switch 3; middle switch MS(3,1) and middle switch MS(5,1) belonging to switch 4; And middle switch MS(4,1) belonging to switch 5.

Input switch IS1 is implemented as two by four switch with the inlet links IL1 and IL2 being the inputs of the input switch IS1 and middle links ML(1,1)-ML(1,4) being the outputs of the input switch IS1; and output switch OS1 is implemented as four by two switch with the middle links ML(8,1), ML(8,2), ML(8,7), and ML(8,8) being the inputs of the output switch OS1 and outlet links OL1-OL2 being the outputs of the output switch OS1.

Middle switch MS(1,1) is implemented as four by four switch with the middle links ML(1,1), ML(1,2), ML(1,7) and ML(1,8) being the inputs and middle links ML(2,1)-ML(2,4) being the outputs; and middle switch MS(7,1) is implemented as four by four switch with the middle links ML(7,1), ML(7,2), ML(7,11) and ML(7,12) being the inputs and middle links ML(8,1)-ML(8,4) being the outputs. Similarly all the other middle switches are also implemented as four by four switches as illustrated in 800I of FIG. 8I.

Generalized Multi-Link Butterfly Fat Pyramid Network Embodiment:

In another embodiment in the network 800B of FIG. 8B, the switches that are placed together are implemented as combined switch then the network 800B is the generalized multi-link butterfly fat pyramid network $V_{mlink\text{-}bfp}(N_1,N_2,d,s)$ where $N_1=N_2=32$; $d=2$; and $s=2$ with five stages as disclosed in U.S. Provisional Patent Application Ser. No. 60/940,390 that is incorporated by reference above. That is the switches that are placed together in input stage 110 and output stage 120 are implemented as a six by six switch. For example the input switch IS1 and output switch OS1 are placed together; so input switch IS1 and output switch OS1 are implemented as a six by six switch with the inlet links IL1, IL2, ML(8,1), ML(8,2), ML(8,7) and ML(8,8) being the inputs of the combined switch (denoted as IS1&OS1) and middle links ML(1,1), ML(1,2), ML(1,3), ML(1,4), OL1 and OL2 being the outputs of the combined switch IS1&OS1. Similarly in this embodiment of network 800B all the switches that are placed together are implemented as a combined switch.

Layout diagrams 800C in FIG. 8C, 800D in FIG. 8D, 800E in FIG. 8E, 800F in FIG. 8G are also applicable to generalized multi-link butterfly fat pyramid network $V_{mlink\text{-}bfp}(N_1,N_2,d,s)$ where $N_1=N_2=32$; $d=2$; and $s=2$ with five stages. The layout 800C in FIG. 8C can be recursively extended for any arbitrarily large generalized multi-link butterfly fat pyramid network $V_{mlink\text{-}bfp}(N_1,N_2,d,s)$. Accordingly layout 800H of FIG. 8H is also applicable to generalized multi-link butterfly fat pyramid network $V_{mlink\text{-}bfp}(N_1,N_2,d,s)$.

Figure 8J:
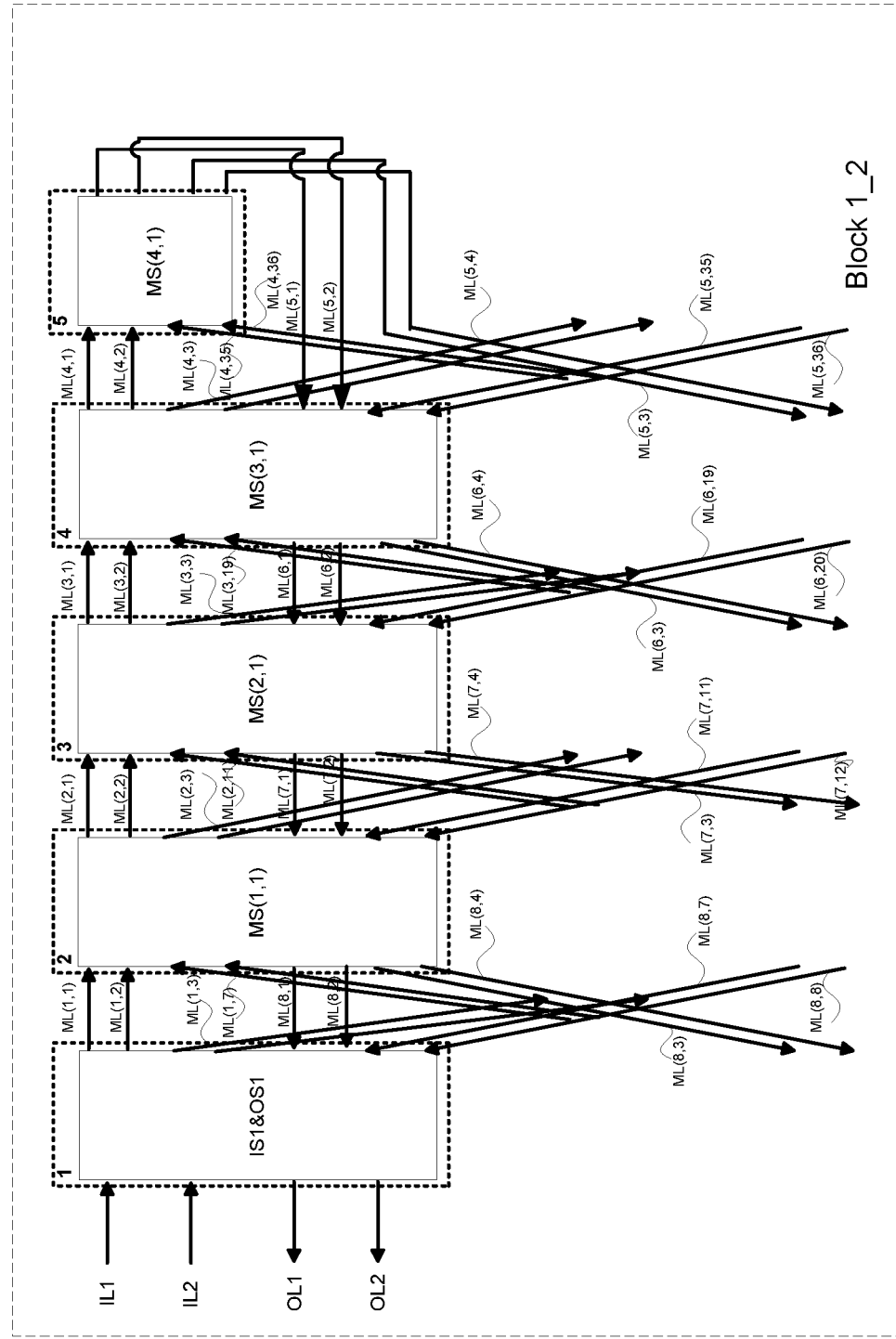
FIG. 8J is a diagram 800J detailed connections of BLOCK 1_2 in the network layout 800C in one embodiment, illustrating the connection links going in and coming out when the layout 800C is implementing $V_{mlink-bfp}(N,d,s)$.

Referring to diagram 800J of FIG. 8J illustrates a high-level implementation of Block 1_2 (Each of the other blocks have similar implementation) of the layout 800C of FIG. 8C which represents a generalized multi-link butterfly fat pyramid network $V_{mlink\text{-}bfp}(N_1,N_2,d,s)$ where $N_1=N_2=32$; $d=2$; and $s=2$. Block 1_2 in 800J illustrates both the intra-block and inter-block links. The layout diagram 800J corresponds to the embodiment where the switches that are placed together are implemented as combined switch in the network 800B of FIG. 8B. As noted before then the network 800B is the generalized multi-link butterfly fat pyramid network $V_{mlink\text{-}bfp}(N_1,N_2,d,s)$ where $N_1=N_2=32$; $d=2$; and $s=2$ with five stages as disclosed in U.S. Provisional Patent Application Ser. No. 60/940,390 that is incorporated by reference above.

That is the switches that are placed together in Block 1_2 as shown in FIG. 8J are namely the combined input and output switch IS1&OS1 belonging to switch 1, illustrated by dotted lines, (as noted before switch 1 is for illustration purposes only, in practice the switch implemented is combined input and output switch IS1&OS1); middle switch MS(1,1) belonging to switch 2; middle switch MS(2,1) belonging to switch 3; middle switch MS(3,1) belonging to switch 4; And middle switch MS(4,1) belonging to switch 5.

Combined input and output switch IS1&OS1 is implemented as six by six switch with the inlet links IL1, IL2 and ML(8,1), ML(8,2), ML(8,7), and ML(8,8) being the inputs and middle links ML(1,1)-ML(1,4), and outlet links OL1-OL2 being the outputs.

Middle switch MS(1,1) is implemented as eight by eight switch with the middle links ML(1,1), ML(1,2), ML(1,7), ML(1,8), ML(7,1), ML(7,2), ML(7,11) and ML(7,12) being the inputs and middle links ML(2,1)-ML(2,4) and middle links ML(8,1)-ML(8,4) being the outputs. Similarly all the other middle switches are also implemented as eight by eight switches as illustrated in 800J of FIG. 8J.

In another embodiment, middle switch MS(1,1) (or the middle switches in any of the middle stage excepting the root middle stage) of Block 1_2 of $V_{mlink\text{-}bfp}(N_1,N_2,d,s)$ can be implemented as a four by eight switch and a four by four switch to save cross points. This is because the left going middle links of these middle switches are never setup to the right going middle links. For example, in middle switch MS(1,1) of Block 1_2 as shown FIG. 8J, the left going middle links namely ML(7,1), ML(7,2), ML(7,11), and ML(7,12) are never switched to the right going middle links ML(2,1), ML(2,2), ML(2,3), and ML(2,4). And hence to implement MS(1,1) two switches namely: 1) a four by eight switch with the middle links ML(1,1), ML(1,2), ML(1,7), and ML(1,8) as inputs and the middle links ML(2,1), ML(2,2), ML(2,3), ML(2,4), ML(8,1), ML(8,2), ML(8,3), and ML(8,4) as outputs and 2) a four by four switch with the middle links ML(7,1), ML(7,2), ML(7,11), and ML(7,12) as inputs and the middle links ML(8,1), ML(8,2), ML(8,3), and ML(8,4) as outputs are sufficient without loosing any connectivity of the embodiment of MS(1,1) being implemented as an eight by eight switch as described before.)

Generalized Multi-Stage Pyramid Network Embodiment:

In one embodiment, in the network 800B of FIG. 8B, the switches that are placed together are implemented as two separate switches in input stage 110 and output stage 120; and as four separate switches in all the middle stages, then the network 800B is the generalized folded multi-stage pyramid network $V_{fold-p}(N_1,N_2,d,s)$ where $N_1=N_2=32$; d=2; and s=2 with nine stages as disclosed in U.S. Provisional Patent Application Ser. No. 60/940,391 that is incorporated by reference above. That is the switches that are placed together in input stage 110 and output stage 120 are implemented as a two by four switch and a four by two switch respectively. For example the switch input switch IS1 and output switch OS1 are placed together; so input switch IS1 is implemented as two by four switch with the inlet links IL1 and IL2 being the inputs and middle links ML(1,1)-ML(1,4) being the outputs; and output switch OS1 is implemented as four by two switch with the middle links ML(8,1), ML(8,2), ML(8,7) and ML(8,8) being the inputs and outlet links OL1-OL2 being the outputs.

The switches, corresponding to the middle stages that are placed together are implemented as four two by two switches. For example middle switches MS(1,1), MS(1,17), MS(7,1), and MS(7,17) are placed together; so middle switch MS(1,1) is implemented as two by two switch with middle links ML(1,1) and ML(1,7) being the inputs and middle links ML(2,1) and ML(2,3) being the outputs; middle switch MS(1,17) is implemented as two by two switch with the middle links ML(1,2) and ML(1,8) being the inputs and middle links ML(2,2) and ML(2,4) being the outputs; middle switch MS(7,1) is implemented as two by two switch with middle links ML(7,1) and ML(7,11) being the inputs and middle links ML(8,1) and ML(8,3) being the outputs; And middle switch MS(7,17) is implemented as two by two switch with the middle links ML(7,2) and ML(7,12) being the inputs and middle links ML(8,2) and ML(8,4) being the outputs; Similarly in this embodiment of network 800B all the switches that are placed together are implemented as separate switches.

Layout diagrams 800C in FIG. 8C, 800D in FIG. 8D, 800E in FIG. 8E, 800F in FIG. 8G are also applicable to generalized folded multi-stage pyramid network $V_{fold-p}(N_1,N_2,d,s)$ where $N_1=N_2=32$; d=2; and s=2 with nine stages. The layout 800C in FIG. 8C can be recursively extended for any arbitrarily large generalized folded multi-stage pyramid network $V_{fold-p}(N_1,N_2,d,s)$. Accordingly layout 800H of FIG. 8H is also applicable to generalized folded multi-stage pyramid network $V_{fold-p}(N_1,N_2,d,s)$.

Figure 8K:
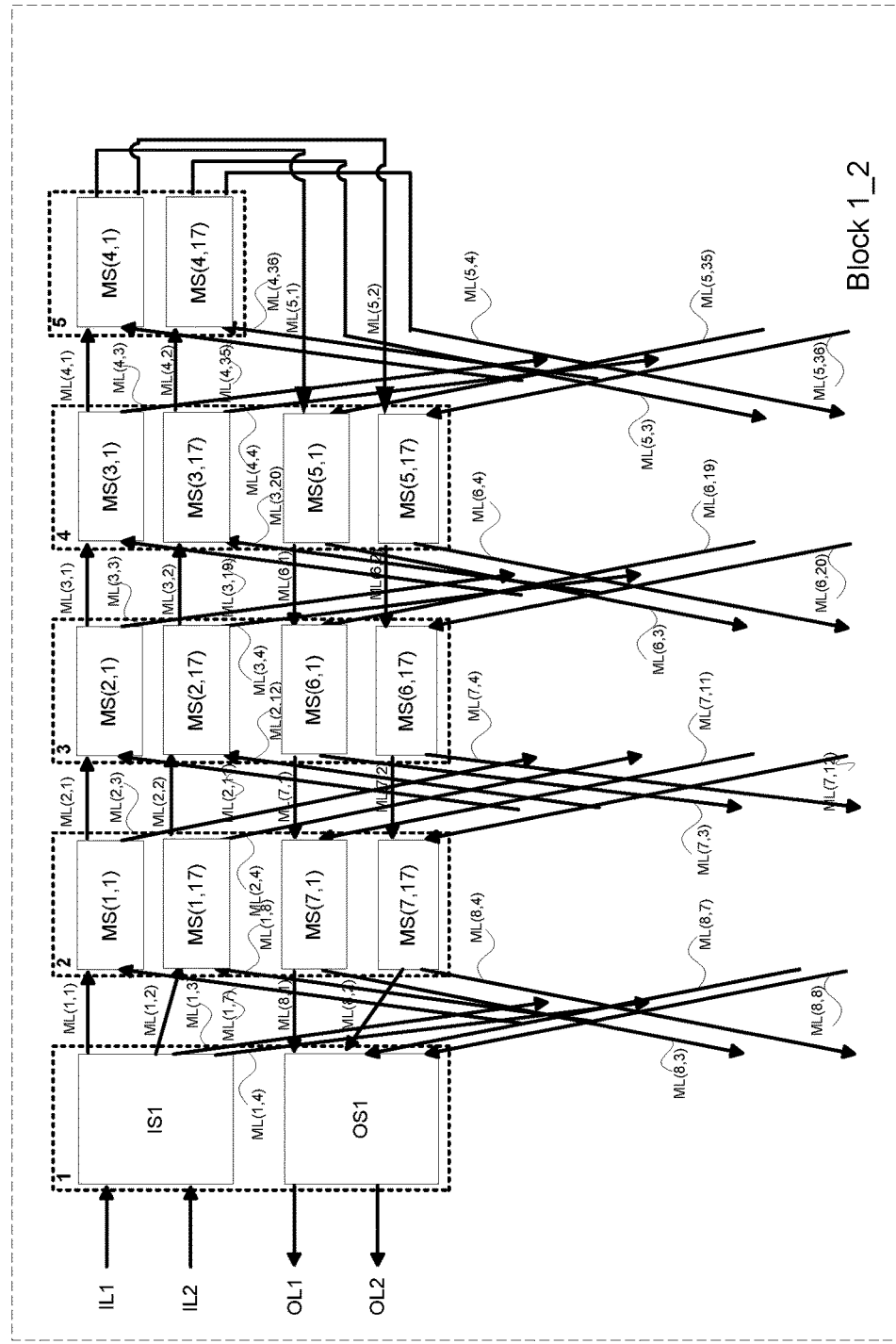
FIG. 8K is a diagram 800K detailed connections of BLOCK 1_2 in the network layout 800C in one embodiment, illustrating the connection links going in and coming out when the layout 800C is implementing $V_p(N,d,s)$ or $V_{fold-p}(N,d,s)$.

Referring to diagram 800K of FIG. 8K illustrates a high-level implementation of Block 1_2 (Each of the other blocks have similar implementation) of the layout 800C of FIG. 8C which represents a generalized folded multi-stage pyramid network $V_{fold-p}(N_1,N_2,d,s)$ where $N_1=N_2=32$; d=2; and s=2. Block 1_2 in 800K illustrates both the intra-block and inter-block links. The layout diagram 800K corresponds to the embodiment where the switches that are placed together are implemented as separate switches in the network 800B of FIG. 8B. As noted before then the network 800B is the generalized folded multi-stage pyramid network $V_{fold-p}(N_1,N_2,d,s)$ where $N_1=N_2=32$; d=2; and s=2 with nine stages as disclosed in U.S. Provisional Patent Application Ser. No. 60/940,391 that is incorporated by reference above.

That is the switches that are placed together in Block 1_2 as shown in FIG. 8K are namely the input switch IS1 and output switch OS1 belonging to switch 1, illustrated by dotted lines, (as noted before switch 1 is for illustration purposes only, in practice the switches implemented are input switch IS1 and output switch OS1); middle switches MS(1,1), MS(1,17), MS(7,1) and MS(7,17) belonging to switch 2; middle switches MS(2,1), MS(2,17), MS(6,1) and MS(6,17) belonging to switch 3; middle switches MS(3,1), MS(3,17), MS(5,1) and MS(5,17) belonging to switch 4; And middle switches MS(4,1), and MS(4,17) belonging to switch 5.

Input switch IS1 and output switch OS1 are placed together; so input switch IS1 is implemented as two by four switch with the inlet links IL1 and IL2 being the inputs and middle links ML(1,1)-ML(1,4) being the outputs; and output switch OS1 is implemented as four by two switch with the middle links ML(8,1), ML(8,2), ML(8,7) and ML(8,8) being the inputs and outlet links OL1-OL2 being the outputs.

Middle switches MS(1,1), MS(1,17), MS(7,1), and MS(7,17) are placed together; so middle switch MS(1,1) is implemented as two by two switch with middle links ML(1,1) and ML(1,7) being the inputs and middle links ML(2,1) and ML(2,3) being the outputs; middle switch MS(1,17) is implemented as two by two switch with the middle links ML(1,2) and ML(1,8) being the inputs and middle links ML(2,2) and ML(2,4) being the outputs; middle switch MS(7,1) is implemented as two by two switch with middle links ML(7,1) and ML(7,11) being the inputs and middle links ML(8,1) and ML(8,3) being the outputs; And middle switch MS(7,17) is implemented as two by two switch with the middle links ML(7,2) and ML(7,12) being the inputs and middle links ML(8,2) and ML(8,4) being the outputs. Similarly all the other middle switches are also implemented as two by two switches as illustrated in 800K of FIG. 8K.

Generalized Multi-Stage Pyramid Network Embodiment with S=1:

In one embodiment, in the network 800B of FIG. 8B (where it is implemented with s=1), the switches that are placed together are implemented as two separate switches in input stage 110 and output stage 120; and as two separate switches in all the middle stages, then the network 800B is the generalized folded multi-stage network $V_{fold-p}(N_1,N_2,d,s)$ where $N_1=N_2=32$; d=2; and s=1 with nine stages as disclosed in U.S. Provisional Patent Application Ser. No. 60/940,391 that is incorporated by reference above. That is the switches that are placed together in input stage 110 and output stage 120 are implemented as two, two by two switches. For example the switch input switch IS1 and output switch OS1 are placed together; so input switch IS1 is implemented as two by two switch with the inlet links IL1 and IL2 being the inputs and middle links ML(1,1)-ML(1,2) being the outputs; and output switch OS1 is implemented as two by two switch with the middle links ML(8,1) and ML(8,3) being the inputs and outlet links OL1-OL2 being the outputs.

The switches, corresponding to the middle stages that are placed together are implemented as two, two by two switches. For example middle switches MS(1,1) and MS(7,1) are placed together; so middle switch MS(1,1) is implemented as two by two switch with middle links ML(1,1) and ML(1,3) being the inputs and middle links ML(2,1) and ML(2,2) being the outputs; middle switch MS(7,1) is implemented as two by two switch with middle links ML(7,1) and ML(7,5) being the inputs and middle links ML(8,1) and ML(8,2) being the outputs; Similarly in this embodiment of network 800B all the switches that are placed together are implemented as two separate switches.

Layout diagrams 800C in FIG. 8C, 800D in FIG. 8D, 800E in FIG. 8E, 800F in FIG. 8G are also applicable to generalized folded multi-stage pyramid network $V_{fold-p}(N_1, N_2, d, s)$ where $N_1 = N_2 = 32$; $d = 2$; and $s = 1$ with nine stages. The layout 800C in FIG. 8C can be recursively extended for any arbitrarily large generalized folded multi-stage network $V_{fold}(N_1, N_2, d, s)$. Accordingly layout 800H of FIG. 8H is also applicable to generalized folded multi-stage pyramid network $V_{fold-p}(N_1, N_2, d, s)$.

Referring to diagram 800K1 of FIG. 8K1 illustrates a high-level implementation of Block 1_2 (Each of the other blocks have similar implementation) for the layout 800C of FIG. 8C when s=1 which represents a generalized folded multi-stage pyramid network $V_{fold-p}(N_1, N_2, d, s)$ where $N_1 = N_2 = 32$; $d = 2$; and $s = 1$ (All the double links are replaced by single links when s=1). Block 1_2 in 800K1 illustrates both the intra-block and inter-block links. The layout diagram 800K1 corresponds to the embodiment where the switches that are placed together are implemented as separate switches in the network 800B of FIG. 8B when s=1. As noted before then the network 800B is the generalized folded multi-stage pyramid network $V_{fold-p}(N_1, N_2, d, s)$ where $N_1 = N_2 = 32$; $d = 2$; and $s = 1$ with nine stages as disclosed in U.S. Provisional Patent Application Ser. No. 60/940,391 that is incorporated by reference above.

That is the switches that are placed together in Block 1_2 as shown in FIG. 8K1 are namely the input switch IS1 and output switch OS1 belonging to switch 1, illustrated by dotted lines, (as noted before switch 1 is for illustration purposes only, in practice the switches implemented are input switch IS1 and output switch OS1); middle switches MS(1,1) and MS(7,1) belonging to switch 2; middle switches MS(2,1) and MS(6,1) belonging to switch 3; middle switches MS(3,1) and MS(5,1) belonging to switch 4; And middle switch MS(4,1) belonging to switch 5.

Input switch IS1 and output switch OS1 are placed together; so input switch IS1 is implemented as two by two switch with the inlet links IL1 and IL2 being the inputs and middle links ML(1,1)-ML(1,2) being the outputs; and output switch OS1 is implemented as two by two switch with the middle links ML(8,1) and ML(8,3) being the inputs and outlet links OL1-OL2 being the outputs.

Middle switches MS(1,1) and MS(7,1) are placed together; so middle switch MS(1,1) is implemented as two by two switch with middle links ML(1,1) and ML(1,3) being the inputs and middle links ML(2,1) and ML(2,2) being the outputs; And middle switch MS(7,1) is implemented as two by two switch with middle links ML(7,1) and ML(7,5) being the inputs and middle links ML(8,1) and ML(8,2) being the outputs. Similarly all the other middle switches are also implemented as two by two switches as illustrated in 800K1 of FIG. 8K1.

Generalized Butterfly Fat Pyramid Network Embodiment:

In another embodiment in the network 800B of FIG. 8B, the switches that are placed together are implemented as two combined switches then the network 800B is the generalized butterfly fat pyramid network $V_{bfp}(N_1, N_2, d, s)$ where $N_1 = N_2 = 32$; $d = 2$; and $s = 2$ with five stages as disclosed in U.S. Provisional Patent Application Ser. No. 60/940,387 that is incorporated by reference above. That is the switches that are placed together in input stage 110 and output stage 120 are implemented as a six by six switch. For example the input switch IS1 and output switch OS1 are placed together; so input output switch IS1&OS1 are implemented as a six by six switch with the inlet links IL1, IL2, ML(8,1), ML(8,2), ML(8,7) and ML(8,8) being the inputs of the combined switch (denoted as IS1&OS1) and middle links ML(1,1), ML(1,2), ML(1,3), ML(1,4), OL1 and OL2 being the outputs of the combined switch IS1&OS1.

The switches, corresponding to the middle stages that are placed together are implemented as two four by four switches. For example middle switches MS(1,1) and MS(1,17) are placed together; so middle switch MS(1,1) is implemented as four by four switch with middle links ML(1,1), ML(1,7), ML(7,1) and ML(7,11) being the inputs and middle links ML(2,1), ML(2,3), ML(8,1) and ML(8,3) being the outputs; middle switch MS(1,17) is implemented as four by four switch with the middle links ML(1,2), ML(1,8), ML(7,2) and ML(7,12) being the inputs and middle links ML(2,2), ML(2,4), ML(8,2) and ML(8,4) being the outputs. Similarly in this embodiment of network 800B all the switches that are placed together are implemented as a two combined switches.

Layout diagrams 800C in FIG. 8C, 800D in FIG. 8D, 800E in FIG. 8E, 800F in FIG. 8G are also applicable to generalized butterfly fat pyramid network $V_{bfp}(N_1, N_2, d, s)$ where $N_1 = N_2 = 32$; $d = 2$; and $s = 2$ with five stages. The layout 800C in FIG. 8C can be recursively extended for any arbitrarily large generalized butterfly fat pyramid network $V_{bfp}(N_1, N_2, d, s)$. Accordingly layout 800H of FIG. 8H is also applicable to generalized butterfly fat pyramid network $V_{bfp}(N_1, N_2, d, s)$.

Figure 8L:
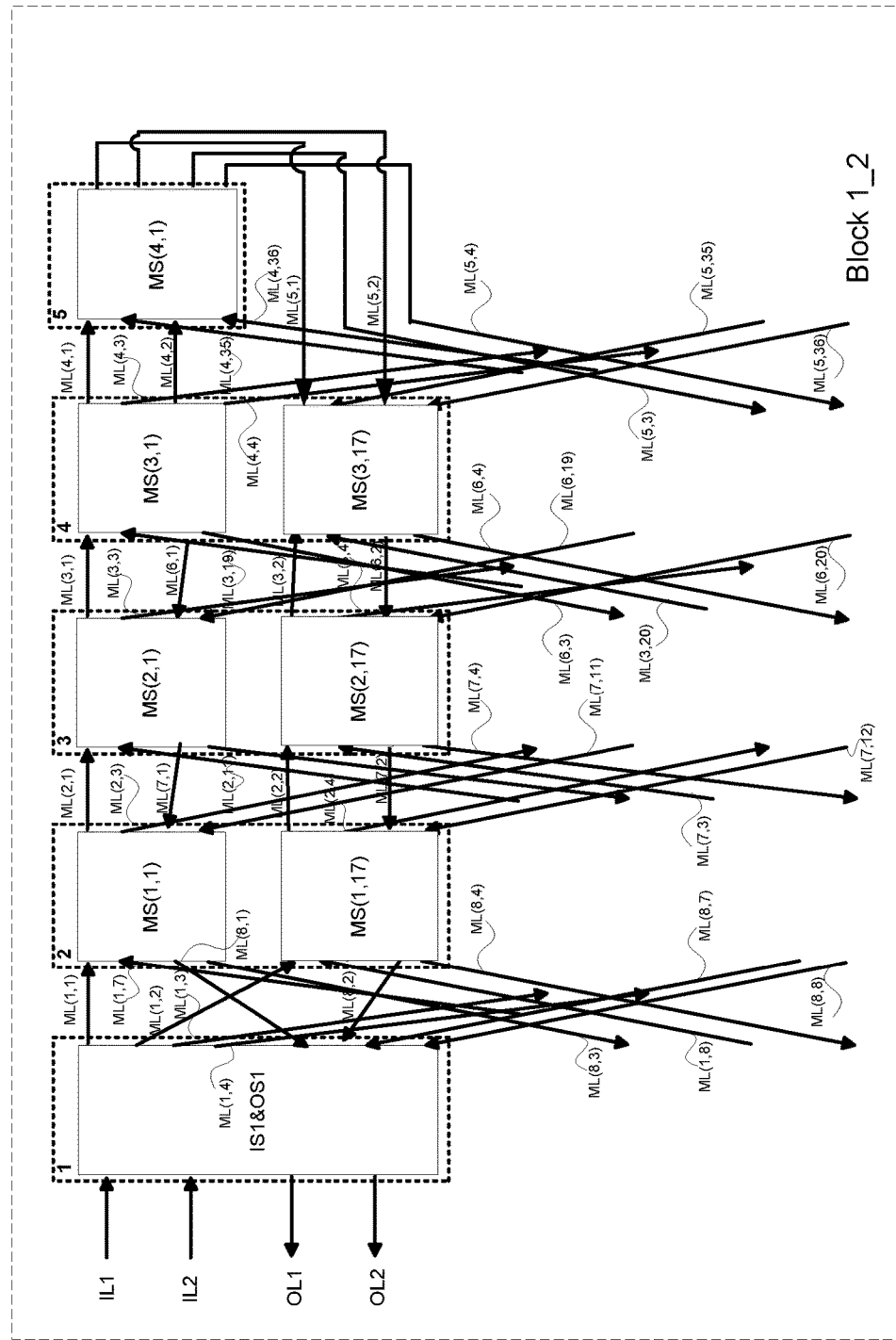
FIG. 8L is a diagram 800L detailed connections of BLOCK 1_2 in the network layout 800C in one embodiment, illustrating the connection links going in and coming out when the layout 800C is implementing $V_{bfp}(N,d,s)$.

Referring to diagram 800L of FIG. 8L illustrates a high-level implementation of Block 1_2 (Each of the other blocks have similar implementation) of the layout 800C of FIG. 8C which represents a generalized butterfly fat pyramid network $V_{bfp}(N_1, N_2, d, s)$ where $N_1 = N_2 = 32$; $d = 2$; and $s = 2$. Block 1_2 in 800L illustrates both the intra-block and inter-block links. The layout diagram 800L corresponds to the embodiment where the switches that are placed together are implemented as two combined switches in the network 800B of FIG. 8B. As noted before then the network 800B is the generalized butterfly fat pyramid network $V_{bfp}(N_1, N_2, d, s)$ where $N_1 = N_2 = 32$; $d = 2$; and $s = 2$ with five stages as disclosed in U.S. Provisional Patent Application Ser. No. 60/940,387 that is incorporated by reference above.

That is the switches that are placed together in Block 1_2 as shown in FIG. 8L are namely the combined input and output switch IS1&OS1 belonging to switch 1, illustrated by dotted lines, (as noted before switch 1 is for illustration purposes only, in practice the switch implemented is combined input and output switch IS1&OS1); middle switch MS(1,1) and MS(1,17) belonging to switch 2; middle switch MS(2,1) and MS(2,17) belonging to switch 3; middle switch MS(3,1) and MS(3,17) belonging to switch 4; And middle switch MS(4,1) belonging to switch 5.

Combined input and output switch IS1&OS1 is implemented as six by six switch with the inlet links IL1, IL2, ML(8,1), ML(8,2), ML(8,7) and ML(8,8) being the inputs and middle links ML(1,1)-ML(1,4) and outlet links OL1-OL2 being the outputs.

Middle switch MS(1,1) is implemented as four by four switch with middle links ML(1,1), ML(1,7), ML(7,1) and ML(7,11) being the inputs and middle links ML(2,1), ML(2,3), ML(8,1) and ML(8,3) being the outputs; And middle switch MS(1,17) is implemented as four by four switch with the middle links ML(1,2), ML(1,8), ML(7,2) and ML(7,12) being the inputs and middle links ML(2,2), ML(2,4), ML(8, 2) and ML(8,4) being the outputs. Similarly all the other middle switches are also implemented as two four by four switches as illustrated in 800L of FIG. 8L.

In another embodiment, middle switch MS(1,1) (or the middle switches in any of the middle stage excepting the root middle stage) of Block 1_2 of $V_{mlink-bfp}(N_1,N_2,d,s)$ can be implemented as a two by four switch and a two by two switch to save cross points. This is because the left going middle links of these middle switches are never setup to the right going middle links. For example, in middle switch MS(1,1) of Block 1_2 as shown FIG. 8L, the left going middle links namely ML(7,1) and ML(7,11) are never switched to the right going middle links ML(2,1) and ML(2,3). And hence to implement MS(1,1) two switches namely: 1) a two by four switch with the middle links ML(1,1) and ML(1,7) as inputs and the middle links ML(2,1), ML(2,3), ML(8,1), and ML(8,3) as outputs and 2) a two by two switch with the middle links ML(7,1) and ML(7,11) as inputs and the middle links ML(8,1) and ML(8,3) as outputs are sufficient without loosing any connectivity of the embodiment of MS(1,1) being implemented as an eight by eight switch as described before.)

Generalized Butterfly Fat Pyramid Network Embodiment with S=1:

In one embodiment, in the network 800B of FIG. 8B (where it is implemented with s=1), the switches that are placed together are implemented as a combined switch in input stage 110 and output stage 120; and as a combined switch in all the middle stages, then the network 800B is the generalized butterfly fat pyramid network $V_{bfp}(N_1,N_2,d,s)$ where $N_1=N_2=32$; d=2; and s=1 with five stages as disclosed in U.S. Provisional Patent Application Ser. No. 60/940,387 that is incorporated by reference above. That is the switches that are placed together in input stage 110 and output stage 120 are implemented as a four by four switch. For example the switch input switch IS1 and output switch OS1 are placed together; so input and output switch IS1&OS1 is implemented as four by four switch with the inlet links IL1, IL2, ML(8,1) and ML(8,3) being the inputs and middle links ML(1,1)-ML(1,2) and outlet links OL1-OL2 being the outputs The switches, corresponding to the middle stages that are placed together are implemented as a four by four switch. For example middle switches MS(1,1) is implemented as four by four switch with middle links ML(1,1), ML(1,3), ML(7,1) and ML(7,5) being the inputs and middle links ML(2,1), ML(2,2), ML(8,1) and ML(8,2) being the outputs.

Layout diagrams 800C in FIG. 8C, 800D in FIG. 8D, 800E in FIG. 8E, 800F in FIG. 8G are also applicable to generalized butterfly fat pyramid network $V_{bfp}(N_1,N_2,d,s)$ where $N_1=N_2=32$; d=2; and s=1 with five stages. The layout 800C in FIG. 8C can be recursively extended for any arbitrarily large generalized butterfly fat pyramid network $V_{bfp}(N_1,N_2,d,s)$. Accordingly layout 800H of FIG. 8H is also applicable to generalized butterfly fat pyramid network $V_{bfp}(N_1,N_2,d,s)$.

Referring to diagram 800L1 of FIG. 8L1 illustrates a high-level implementation of Block 1_2 (Each of the other blocks have similar implementation) for the layout 800C of FIG. 8C when s=1 which represents a generalized butterfly fat pyramid network $V_{bfp}(N_1,N_2,d,s)$ where $N_1=N_2=32$; d=2; and s=1 (All the double links are replaced by single links when s=1). Block 1_2 in 800K1 illustrates both the intra-block and inter-block links. The layout diagram 800L1 corresponds to the embodiment where the switches that are placed together are implemented as a combined switch in the network 800B of FIG. 8B when s=1. As noted before then the network 800B is the generalized butterfly fat pyramid network $V_{bfp}(N_1,N_2,d,s)$ where $N_1=N_2=32$; d=2; and s=1 with nine stages as disclosed in U.S. Provisional Patent Application Ser. No. 60/940,387 that is incorporated by reference above.

That is the switches that are placed together in Block 1_2 as shown in FIG. 8L1 are namely the input and output switch IS1&OS1 belonging to switch 1, illustrated by dotted lines, (as noted before switch 1 is for illustration purposes only, in practice the switches implemented are input switch IS1 and output switch OS1); middle switch MS(1,1) belonging to switch 2; middle switch MS(2,1) belonging to switch 3; middle switch MS(3,1) belonging to switch 4; And middle switch MS(4,1) belonging to switch 5.

Input and output switch IS1&OS1 are placed together; so input and output switch IS1&OS1 is implemented as four by four switch with the inlet links IL1, IL2, ML(8,1) and ML(8,3) being the inputs and middle links ML(1,1)-ML(1,2) and outlet links OL1-OL2 being the outputs.

Middle switch MS(1,1) is implemented as four by four switch with middle links ML(1,1), ML(1,3), ML(7,1) and ML(7,5) being the inputs and middle links ML(2,1), ML(2,2), ML(8,1) and ML(8,2) being the outputs. Similarly all the other middle switches are also implemented as four by four switches as illustrated in 800L1 of FIG. 8L1.

In another embodiment, middle switch MS(1,1) (or the middle switches in any of the middle stage excepting the root middle stage) of Block 1_2 of $V_{mlink-bfp}(N_1,N_2,d,s)$ can be implemented as a two by four switch and a two by two switch to save cross points. This is because the left going middle links of these middle switches are never setup to the right going middle links. For example, in middle switch MS(1,1) of Block 1_2 as shown FIG. 8L1, the left going middle links namely ML(7,1) and ML(7,5) are never switched to the right going middle links ML(2,1) and ML(2,2). And hence to implement MS(1,1) two switches namely: 1) a two by four switch with the middle links ML(1,1) and ML(1,3) as inputs and the middle links ML(2,1), ML(2,2), ML(8,1), and ML(8,2) as outputs and 2) a two by two switch with the middle links ML(7,1) and ML(7,5) as inputs and the middle links ML(8,1) and ML(8,2) as outputs are sufficient without loosing any connectivity of the embodiment of MS(1,1) being implemented as an eight by eight switch as described before.)

All the layout embodiments disclosed in the current invention are applicable to generalized multi-stage pyramid networks $V_p(N_1,N_2,d,s)$, generalized folded multi-stage pyramid networks $V_{fold\text{-}p}(N_1,N_2,d,s)$, generalized butterfly fat pyramid networks $V_{bfp}(N_1,N_2,d,s)$, generalized multi-link multi-stage pyramid networks $V_{mlink\text{-}p}(N_1,N_2,d,s)$, generalized folded multi-link multi-stage pyramid networks $V_{fold\text{-}mlink\text{-}p}(N_1,N_2,d,s)$, generalized multi-link butterfly fat pyramid networks $V_{mlink\text{-}bfp}(N_1,N_2,d,s)$, and generalized hypercube networks $V_{CCC}(N_1,N_2,d,s)$ for s=1, 2, 3 or any number in general, and for both $N_1=N_2=N$ and $N_1 \ne N_2$, and d is any integer.

Conversely applicant makes another important observation that generalized cube connected cycles networks $V_{CCC}(N_1,N_2,d,s)$ are implemented with the layout topology being the hypercube topology shown in layout 200C of FIG. 2C with large scale cross point reduction as any one of the networks described in the current invention namely: generalized multi-stage pyramid networks $V_p(N_1,N_2,d,s)$, generalized folded multi-stage pyramid networks $V_{fold\text{-}p}(N_1,N_2,d,s)$, generalized butterfly fat pyramid networks $V_{bfp}(N_1,N_2,d,s)$, generalized multi-link multi-stage pyramid networks $V_{mlink\text{-}p}(N_1,N_2,d,s)$, generalized folded multi-link multistage pyramid networks $V_{fold\text{-}mlink\text{-}p}(N_1,N_2,d,s)$, generalized multi-link butterfly fat pyramid networks $V_{mlink\text{-}bfp}(N_1,N_2,d,s)$ for s=1, 2, 3 or any number in general, and for both $N_1=N_2=N$ and $N_1 \neq N_2$, and d is any integer.

Applicant notes that in the generalized multi-stage pyramid networks $V_p(N_1,N_2,d,s)$, generalized folded multi-stage pyramid networks $V_{fold\text{-}p}(N_1,N_2,d,s)$, generalized butterfly fat pyramid networks $V_{bfp}(N_1,N_2,d,s)$, generalized multi-link multi-stage pyramid networks $V_{mlink\text{-}p}(N_1,N_2,d,s)$, generalized folded multi-link multi-stage pyramid networks $V_{fold\text{-}mlink\text{-}p}(N_1,N_2,d,s)$, generalized multi-link butterfly fat pyramid networks $V_{mlink\text{-}bfp}(N_1,N_2,d,s)$, and generalized hypercube networks $V_{CCC}(N_1,N_2,d,s)$ the pyramid links are provided a) between the switches in any two successive stages, b) between the switches in the same stage, and c) between the switches any two arbitrary stages.

Figure 9A:
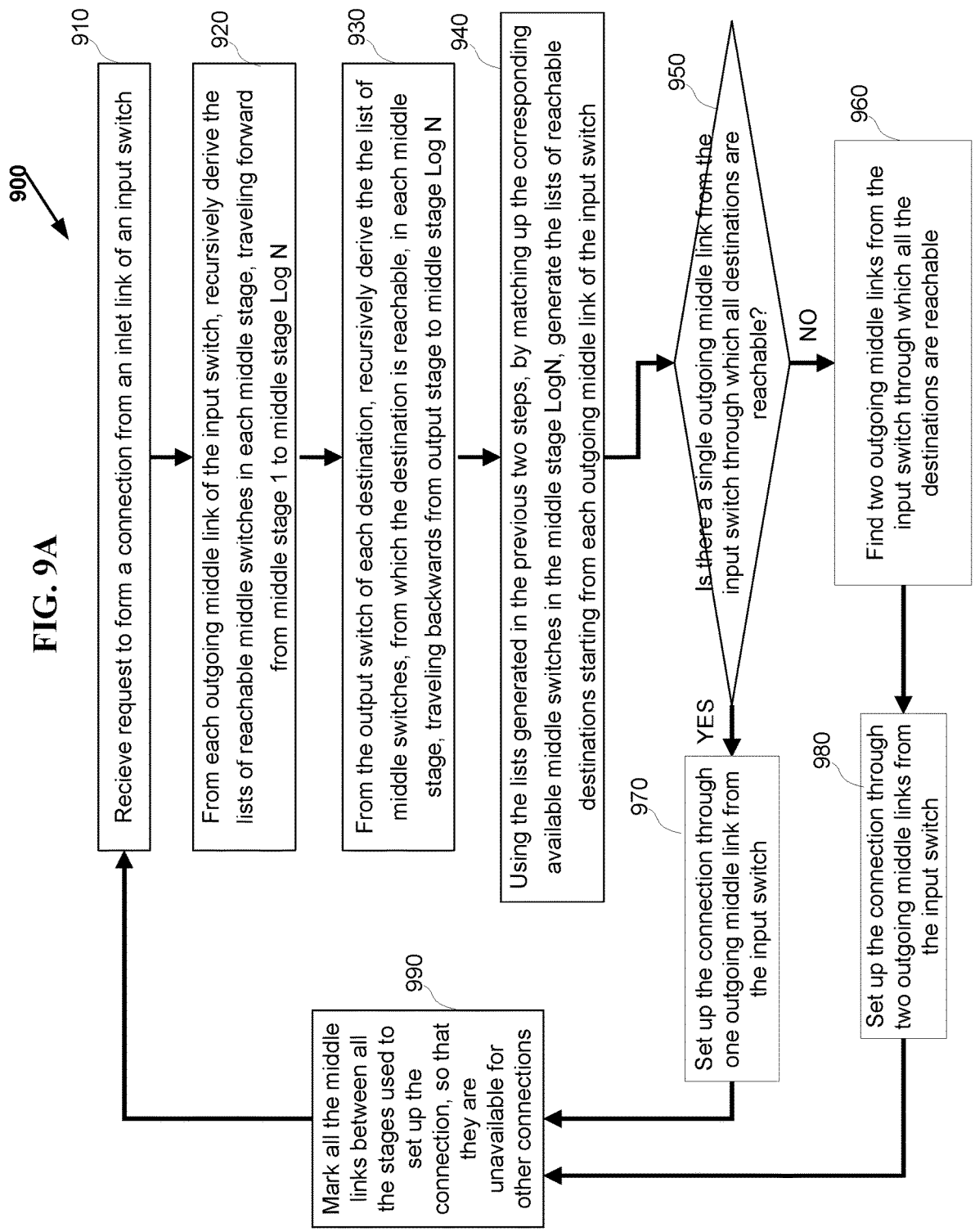
FIG. 9A is high-level flowchart of a scheduling method 900 according to the invention, used to set up the multicast connections in the generalized multi-stage pyramid network and the generalized multi-link multi-stage pyramid network disclosed in this invention.

In all the embodiments disclosed in the current invention, all the switches in some embodiments may be implemented as active switches consisting of cross points using SRAM cells or Flash memory cells. Similarly in other embodiments the switches may be implemented as passive switches consisting of cross points using anti-fuse based vias or connections provided by metal layer programming as in structured ASICs. In another embodiment, the switches may be implemented as in 3D-FPGAs. In another embodiment where ASIC placement & routing, the switches are actually used to determine if two wires are connected together or not; Alternatively they can be seen as switches during the implementation of the placement & routing however cross points in the cross state can be used as wire connections and in the bar state can be used as no connection of the wires.
Scheduling Method Embodiments for Multi-Stage Pyramid Networks and Multi-Link Multi-Stage Pyramid Networks:

FIG. 9A shows a high-level flowchart of a scheduling method 900, in one embodiment executed to setup multicast and unicast connections in the generalized multi-link multi-stage pyramid networks $V_{mlink\text{-}p}(N_1,N_2,d,s)$ (for example the network 800A of FIG. 8A) or generalized folded multi-stage pyramid networks $V_{fold\text{-}mlink\text{-}p}(N_1,N_2,d,s)$ (for example the network 800B of FIG. 8B) or any of the generalized multi-stage pyramid networks $V_p(N_1,N_2,d,s)$, generalized folded multi-stage pyramid networks $V_{fold\text{-}p}(N_1,N_2,d,s)$ disclosed in this invention. According to this embodiment, a multicast connection request is received in act 910. Then the control goes to act 920.

In act 920, based on the inlet link and input switch of the multicast connection received in act 910, from each available outgoing middle link of the input switch of the multicast connection, by traveling forward from middle stage 130 to middle stage $130+10*(Log_dN-2)$, the lists of all reachable middle switches in each middle stage are derived recursively. That is, first, by following each available outgoing middle link of the input switch all the reachable middle switches in middle stage 130 are derived. Next, starting from the selected middle switches in middle stage 130 traveling through all of their available out going middle links to middle stage 140 all the available middle switches in middle stage 140 are derived. This process is repeated recursively until all the reachable middle switches, starting from the outgoing middle link of input switch, in middle stage $130+10*(Log_dN-2)$ are derived. This process is repeated for each available outgoing middle link from the input switch of the multicast connection and separate reachable lists are derived in each middle stage from middle stage 130 to middle stage $130+10*(Log_dN-2)$ for all the available outgoing middle links from the input switch. Then the control goes to act 930.

In act 930, based on the destinations of the multicast connection received in act 910, from the output switch of each destination, by traveling backward from output stage 120 to middle stage $130+10*(Log_dN-2)$, the lists of all middle switches in each middle stage from which each destination output switch (and hence the destination outlet links) is reachable, are derived recursively. That is, first, by following each available incoming middle link of the output switch of each destination link of the multicast connection, all the middle switches in middle stage $130+10*(2*Log_dN-4)$ from which the output switch is reachable, are derived. Next, starting from the selected middle switches in middle stage $130+10*(2*Log_dN-4)$ traveling backward through all of their available incoming middle links from middle stage $130+10*(2*Log_dN-5)$ all the available middle switches in middle stage $130+10*(2*Log_dN-5)$ from which the output switch is reachable, are derived. This process is repeated recursively until all the middle switches in middle stage $130+10*(Log_dN-2)$ from which the output switch is reachable, are derived. This process is repeated for each output switch of each destination link of the multicast connection and separate lists in each middle stage from middle stage $130+10*(2*Log_dN-4)$ to middle stage $130+10*(Log_dN-2)$ for all the output switches of each destination link of the connection are derived. Then the control goes to act 940.

In act 940, using the lists generated in acts 920 and 930, particularly list of middle switches derived in middle stage $130+10*(Log_dN-2)$ corresponding to each outgoing link of the input switch of the multicast connection, and the list of middle switches derived in middle stage $130+10*(Log_dN-2)$ corresponding to each output switch of the destination links, the list of all the reachable destination links from each outgoing link of the input switch are derived. Specifically if a middle switch in middle stage $130+10*(Log_dN-2)$ is reachable from an outgoing link of the input switch, say "x", and also from the same middle switch in middle stage $130+10*(Log_dN-2)$ if the output switch of a destination link, say "y", is reachable then using the outgoing link of the input switch x, destination link y is reachable. Accordingly, the list of all the reachable destination links from each outgoing link of the input switch is derived. The control then goes to act 950.

In act 950, among all the outgoing links of the input switch, it is checked if all the destinations are reachable using only one outgoing link of the input switch. If one outgoing link is available through which all the destinations of the multicast connection are reachable (i.e., act 950 results in "yes"), the control goes to act 970. And in act 970, the multicast connection is setup by traversing from the selected only one outgoing middle link of the input switch in act 950, to all the destinations. Then the control transfers to act 990.

If act 950 results "no", that is one outgoing link is not available through which all the destinations of the multicast connection are reachable, then the control goes to act 960. In act 960, it is checked if all destination links of the multicast connection are reachable using two outgoing middle links from the input switch. According to the current invention, it is always possible to find at most two outgoing middle links from the input switch through which all the destinations of a multicast connection are reachable. So act 960 always results in "yes", and then the control transfers to act 980. In act 980, the multicast connection is setup by traversing from the selected only two outgoing middle links of the input switch in act 960, to all the destinations. Then the control transfers to act 990.

In act 990, all the middle links between any two stages of the network used to setup the connection in either act 970 or act 980 are marked unavailable so that these middle links will be made unavailable to other multicast connections. The control then returns to act 910, so that acts 910, 920, 930, 940, 950, 960, 970, 980, and 990 are executed in a loop, for each connection request until the connections are set up.

In the example illustrated in FIG. 8A, four outgoing middle links are available to satisfy a multicast connection request if input switch is IS2, but only at most two outgoing middle links of the input switch will be used in accordance with this method. Similarly, although three outgoing middle links is available for a multicast connection request if the input switch is IS1, again only at most two outgoing middle links is used. The specific outgoing middle links of the input switch that are chosen when selecting two outgoing middle links of the input switch is irrelevant to the method of FIG. 9A so long as at most two outgoing middle links of the input switch are selected to ensure that the connection request is satisfied, i.e. the destination switches identified by the connection request can be reached from the outgoing middle links of the input switch that are selected. In essence, limiting the outgoing middle links of the input switch to no more than two permits the network $V(N_1,N_2,d,s)$ to be operated in nonblocking manner in accordance with the invention.

According to the current invention, using the method 940 of FIG. 9A, the network $V_p(N_1,N_2,d,s)$ or $V_{mlink-p}(N_1,N_2,d,s)$ is operated in rearrangeably nonblocking for unicast connections when $s \geq 1$, is operated in strictly nonblocking for unicast connections when $s \geq 2$, is operated in rearrangeably nonblocking for multicast connections when $s \geq 2$, and is operated in strictly nonblocking for multicast connections when $s \geq 3$.

The connection request of the type described above in reference to method 900 of FIG. 9A can be unicast connection request, a multicast connection request or a broadcast connection request, depending on the example. In case of a unicast connection request, only one outgoing middle link of the input switch is used to satisfy the request. Moreover, in method 900 described above in reference to FIG. 9A any number of middle links may be used between any two stages excepting between the input stage and middle stage 130, and also any arbitrary fan-out may be used within each output stage switch, to satisfy the connection request.

As noted above method 900 of FIG. 9A can be used to setup multicast connections, unicast connections, or broadcast connection of all the networks $V_p(N,d,s)$, $V_{mlink-p}(N,d,s)$, $V_p(N_1,N_2,d,s)$ or $V_{mlink}(N_1,N_2,d,s)$ disclosed in this invention.

Figure 10A:
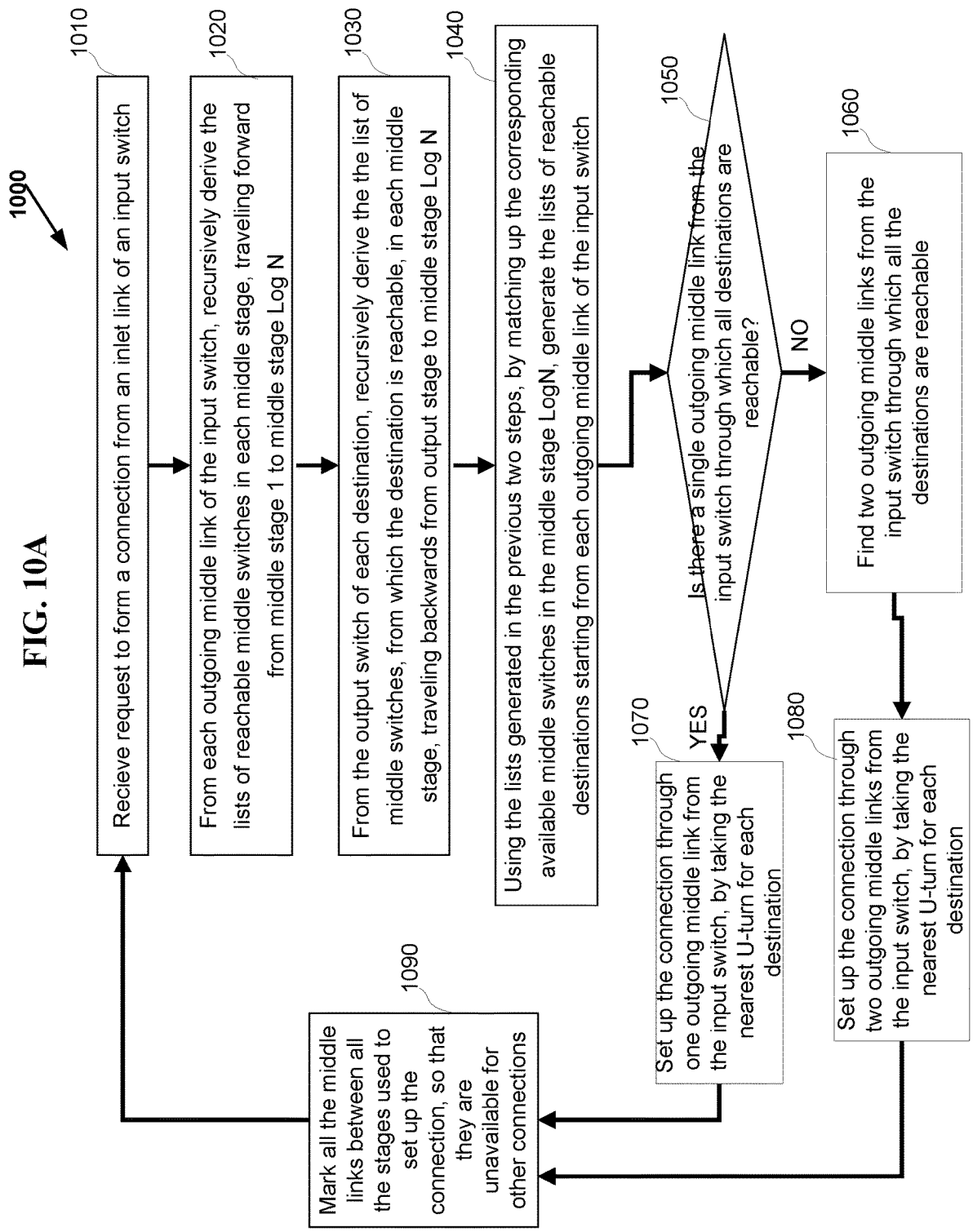
FIG. 10A is high-level flowchart of a scheduling method 1000 according to the invention, used to set up the multicast connections in the generalized butterfly fat pyramid network and the generalized multi-link butterfly fat pyramid network disclosed in this invention.

Scheduling Method Embodiments for Butterfly Fat Pyramid Networks and Multi-Link Butterfly Fat Pyramid Networks:

FIG. 10A shows a high-level flowchart of a scheduling method 1000, in one embodiment executed to setup multicast and unicast connections in the generalized butterfly fat pyramid networks $V_{bfp}(N_1,N_2,d,s)$, generalized folded butterfly fat pyramid networks $V_{fold-bfp}(N_1,N_2,d,s)$, generalized multi-link butterfly fat pyramid networks $V_{mlink-bfp}(N_1,N_2,d,s)$ or generalized folded multi-link butterfly fat pyramid networks $V_{fold-mlink-bfp}(N_1,N_2,d,s)$ disclosed in this invention. According to this embodiment, a multicast connection request is received in act 1010. Then the control goes to act 1020.

In act 1020, based on the inlet link and input switch of the multicast connection received in act 1010, from each available outgoing middle link of the input switch of the multicast connection, by traveling forward from middle stage 130 to middle stage $130+10*(Log_d N-2)$, the lists of all reachable middle switches in each middle stage are derived recursively. That is, first, by following each available outgoing middle link of the input switch all the reachable middle switches in middle stage 130 are derived. Next, starting from the selected middle switches in middle stage 130 traveling through all of their available out going middle links to middle stage 140 (reverse links from middle stage 130 to output stage 120 are ignored) all the available middle switches in middle stage 140 are derived. (In the traversal from any middle stage to the following middle stage only upward links are used and no reverse links or downward links are used. That is for example, while deriving the list of available middle switches in middle stage 140, the reverse links going from middle stage 130 to output stage 120 are ignored.) This process is repeated recursively until all the reachable middle switches, starting from the outgoing middle link of input switch, in middle stage $130+10*(Log_d N-2)$ are derived. This process is repeated for each available outgoing middle link from the input switch of the multicast connection and separate reachable lists are derived in each middle stage from middle stage 130 to middle stage $130+10*(Log_d N-2)$ for all the available outgoing middle links from the input switch. Then the control goes to act 1030.

In act 1030, based on the destinations of the multicast connection received in act 1010, from the output switch of each destination, by traveling backward from output stage 120 to middle stage $130+10*(Log_d N-2)$, the lists of all middle switches in each middle stage from which each destination output switch (and hence the destination outlet links) is reachable, are derived recursively. That is, first, by following each available incoming middle link of the output switch of each destination link of the multicast connection, all the middle switches in middle stage 130 from which the output switch is reachable, are derived. Next, starting from the selected middle switches in middle stage 130 traveling backward through all of their available incoming middle links from middle stage 140 all the available middle switches in middle stage 140 (reverse links from middle stage 130 to input stage 120 are ignored) from which the output switch is reachable, are derived. (In the traversal from any middle stage to the following middle stage only upward links are used and no reverse links or downward links are used. That is for example, while deriving the list of available middle switches in middle stage 140, the reverse links coming to middle stage 130 from input stage 110 are ignored.) This process is repeated recursively until all the middle switches in middle stage $130+10*(Log_d N-2)$ from which the output switch is reachable, are derived. This process is repeated for each output switch of each destination link of the multicast connection and separate lists in each middle stage from middle stage 130 to middle stage $130+10*(Log_d N-2)$ for all the output switches of each destination link of the connection are derived. Then the control goes to act 1040.

In act 1040, using the lists generated in acts 1020 and 1030, particularly list of middle switches derived in middle stage $130+10*(Log_d N-2)$ corresponding to each outgoing link of the input switch of the multicast connection, and the list of middle switches derived in middle stage $130+10*(Log_d N-2)$ corresponding to each output switch of the destination links, the list of all the reachable destination links from each outgoing link of the input switch are derived. Specifically if a middle switch in middle stage $130+10*(Log_d N-2)$ is reachable from an outgoing link of the input switch, say "x", and also from the same middle switch in middle stage $130+10*(Log_d N-2)$ if the output switch of a destination link, say "y", is reachable then using the outgoing link of the input switch x, destination link y is reachable. Accordingly, the list of all the reachable destination links from each outgoing link of the input switch is derived. The control then goes to act 1050.

In act 1050, among all the outgoing links of the input switch, it is checked if all the destinations are reachable using only one outgoing link of the input switch. If one outgoing link is available through which all the destinations of the multicast connection are reachable (i.e., act 1050 results in "yes"), the control goes to act 1070. And in act 1070, the multicast connection is setup by traversing from the selected only one outgoing middle link of the input switch in act 1050, to all the destinations. Also the nearest U-turn is taken while setting up the connection. That is at any middle stage if one of the middle switch in the lists derived in acts 1020 and 1030 are common then the connection is setup so that the U-turn is made to setup the connection from that middle switch for all the destination links reachable from that common middle switch. Then the control transfers to act 1090.

If act 1050 results "no", that is one outgoing link is not available through which all the destinations of the multicast connection are reachable, then the control goes to act 1060. In act 1060, it is checked if all destination links of the multicast connection are reachable using two outgoing middle links from the input switch. According to the current invention, it is always possible to find at most two outgoing middle links from the input switch through which all the destinations of a multicast connection are reachable. So act 1060 always results in "yes", and then the control transfers to act 1080. In act 1080, the multicast connection is setup by traversing from the selected only two outgoing middle links of the input switch in act 1060, to all the destinations. Also the nearest U-turn is taken while setting up the connection. That is at any middle stage if one of the middle switch in the lists derived in acts 1020 and 1030 are common then the connection is setup so that the U-turn is made to setup the connection from that middle switch for all the destination links reachable from that common middle switch. Then the control transfers to act 1090.

In act 1090, all the middle links between any two stages of the network used to setup the connection in either act 1070 or act 1080 are marked unavailable so that these middle links will be made unavailable to other multicast connections. The control then returns to act 1010, so that acts 1010, 1020, 1030, 1040, 1050, 1060, 1070, 1080, and 1090 are executed in a loop, for each connection request until the connections are set up.

According to the current invention, using the method 1040 of FIG. 10A, the network $V_{bfp}(N_1,N_2,d,s)$ or $V_{mlink-bfp}(N_1,N_2,d,s)$ is operated in rearrangeably nonblocking for unicast connections when $s \geq 1$, is operated in strictly nonblocking for unicast connections when $s \geq 2$, is operated in rearrangeably nonblocking for multicast connections when $s \geq 2$, and is operated in strictly nonblocking for multicast connections when $s \geq 3$.

The connection request of the type described above in reference to method 1000 of FIG. 10A can be unicast connection request, a multicast connection request or a broadcast connection request, depending on the example. In case of a unicast connection request, only one outgoing middle link of the input switch is used to satisfy the request. Moreover, in method 1000 described above in reference to FIG. 10A any number of middle links may be used between any two stages excepting between the input stage and middle stage 130, and also any arbitrary fan-out may be used within each output stage switch, to satisfy the connection request.

As noted above method 1000 of FIG. 10A can be used to setup multicast connections, unicast connections, or broadcast connection of all the networks $V_{bfp}(N,d,s)$, $V_{mlink-bfp}(N,d,s)$, $V_{bfp}(N_1,N_2,d,s)$ or $V_{mlink-bfp}(N_1,N_2,d,s)$ disclosed in this invention.

Applications Embodiments:

All the embodiments disclosed in the current invention are useful in many varieties of applications. FIG. 11A1 illustrates the diagram of 1100A1 which is a typical two by two switch with two inlet links namely IL1 and IL2, and two outlet links namely OL1 and OL2. The two by two switch also implements four crosspoints namely CP(1,1), CP(1,2), CP(2,1) and CP(2,2) as illustrated in FIG. 11A1. For example the diagram of 1100A1 may the implementation of middle switch MS(1,1) of the diagram 100K of FIG. 1K where inlet link IL1 of diagram 1100A1 corresponds to middle link ML(1,1) of diagram 100K, inlet link IL2 of diagram 1100A1 corresponds to middle link ML(1,7) of diagram 100K, outlet link OL1 of diagram 1100A1 corresponds to middle link ML(2,1) of diagram 100K, outlet link OL2 of diagram 1100A1 corresponds to middle link ML(2,3) of diagram 100K.

1) Programmable Integrated Circuit Embodiments:

All the embodiments disclosed in the current invention are useful in programmable integrated circuit applications. FIG. 11A2 illustrates the detailed diagram 1100A2 for the implementation of the diagram 1100A1 in programmable integrated circuit embodiments. Each crosspoint is implemented by a transistor coupled between the corresponding inlet link and outlet link, and a programmable cell in programmable integrated circuit embodiments. Specifically crosspoint CP(1,1) is implemented by transistor C(1,1) coupled between inlet link IL1 and outlet link OL1, and programmable cell P(1,1); crosspoint CP(1,2) is implemented by transistor C(1,2) coupled between inlet link IL1 and outlet link OL2, and programmable cell P(1,2); crosspoint CP(2,1) is implemented by transistor C(2,1) coupled between inlet link IL2 and outlet link OL1, and programmable cell P(2,1); and crosspoint CP(2,2) is implemented by transistor C(2,2) coupled between inlet link IL2 and outlet link OL2, and programmable cell P(2,2).

If the programmable cell is programmed ON, the corresponding transistor couples the corresponding inlet link and outlet link. If the programmable cell is programmed OFF, the corresponding inlet link and outlet link are not connected. For example if the programmable cell P(1,1) is programmed ON, the corresponding transistor C(1,1) couples the corresponding inlet link IL1 and outlet link OL1. If the programmable cell P(1,1) is programmed OFF, the corresponding inlet link IL1 and outlet link OL1 are not connected. In volatile programmable integrated circuit embodiments the programmable cell may be an SRAM (Static Random Address Memory) cell. In non-volatile programmable integrated circuit embodiments the programmable cell may be a Flash memory cell. Also the programmable integrated circuit embodiments may implement field programmable logic arrays (FPGA) devices, or programmable Logic devices (PLD), or Application Specific Integrated Circuits (ASIC) embedded with programmable logic circuits or 3D-FPGAs.

FIG. 11A2 also illustrates a buffer B1 on inlet link IL2. The signals driven along inlet link IL2 are amplified by buffer B1. Buffer B1 can be inverting or non-inverting buffer. Buffers such as B1 are used to amplify the signal in links which are usually long.

2) One-Time Programmable Integrated Circuit Embodiments:

All the embodiments disclosed in the current invention are useful in one-time programmable integrated circuit applications. FIG. 11A3 illustrates the detailed diagram 1100A3 for the implementation of the diagram 1100A1 in one-time programmable integrated circuit embodiments. Each crosspoint is implemented by a via coupled between the corresponding inlet link and outlet link in one-time programmable integrated circuit embodiments. Specifically crosspoint CP(1,1) is implemented by via V(1,1) coupled between inlet link IL1 and outlet link OL1; crosspoint CP(1,2) is implemented by via V(1,2) coupled between inlet link IL1 and outlet link OL2; crosspoint CP(2,1) is implemented by via V(2,1) coupled between inlet link IL2 and outlet link OL1; and crosspoint CP(2,2) is implemented by via V(2,2) coupled between inlet link IL2 and outlet link OL2.

If the via is programmed ON, the corresponding inlet link and outlet link are permanently connected which is denoted by thick circle at the intersection of inlet link and outlet link. If the via is programmed OFF, the corresponding inlet link and outlet link are not connected which is denoted by the absence of thick circle at the intersection of inlet link and outlet link. For example in the diagram 1100A3 the via V(1,1) is programmed ON, and the corresponding inlet link IL1 and outlet link OL1 are connected as denoted by thick circle at the intersection of inlet link IL1 and outlet link OL1; the via V(2,2) is programmed ON, and the corresponding inlet link IL2 and outlet link OL2 are connected as denoted by thick circle at the intersection of inlet link IL2 and outlet link OL2; the via V(1,2) is programmed OFF, and the corresponding inlet link IL1 and outlet link OL2 are not connected as denoted by the absence of thick circle at the intersection of inlet link IL1 and outlet link OL2; the via V(2,1) is programmed OFF, and the corresponding inlet link IL2 and outlet link OL1 are not connected as denoted by the absence of thick circle at the intersection of inlet link IL2 and outlet link OL1. One-time programmable integrated circuit embodiments may be anti-fuse based programmable integrated circuit devices or mask programmable structured ASIC devices.

3) Integrated Circuit Placement and Route Embodiments:

All the embodiments disclosed in the current invention are useful in Integrated Circuit Placement and Route applications, for example in ASIC backend Placement and Route tools. FIG. 11A4 illustrates the detailed diagram 1100A4 for the implementation of the diagram 1100A1 in Integrated Circuit Placement and Route embodiments. In an integrated circuit since the connections are known a-priori, the switch and crosspoints are actually virtual. However the concept of virtual switch and virtal crosspoint using the embodiments disclosed in the current invention reduces the number of required wires, wire length needed to connect the inputs and outputs of different netlists and the time required by the tool for placement and route of netlists in the integrated circuit.

Each virtual crosspoint is used to either to hardwire or provide no connectivity between the corresponding inlet link and outlet link. Specifically crosspoint CP(1,1) is implemented by direct connect point DCP(1,1) to hardwire (i.e., to permanently connect) inlet link IL1 and outlet link OL1 which is denoted by the thick circle at the intersection of inlet link IL1 and outlet link OL1; crosspoint CP(2,2) is implemented by direct connect point DCP(2,2) to hardwire inlet link IL2 and outlet link OL2 which is denoted by the thick circle at the intersection of inlet link IL2 and outlet link OL2. The diagram 1100A4 does not show direct connect point DCP(1,2) and direct connect point DCP(1,3) since they are not needed and in the hardware implementation they are eliminated. Alternatively inlet link IL1 needs to be connected to outlet link OL1 and inlet link IL1 does not need to be connected to outlet link OL2. Also inlet link IL2 needs to be connected to outlet link OL2 and inlet link IL2 does not need to be connected to outlet link OL1. Furthermore in the example of the diagram 1100A4, there is no need to drive the signal of inlet link IL1 horizontally beyond outlet link OL1 and hence the inlet link IL1 is not even extended horizontally until the outlet link OL2. Also the absence of direct connect point DCP(2,1) illustrates there is no need to connect inlet link IL2 and outlet link OL1.

In summary in integrated circuit placement and route tools, the concept of virtual switches and virtual cross points is used during the implementation of the placement & routing algorithmically in software, however during the hardware implementation cross points in the cross state are implemented as hardwired connections between the corresponding inlet link and outlet link, and in the bar state are implemented as no connection between inlet link and outlet link.

3) More Application Embodiments:

All the embodiments disclosed in the current invention are also useful in the design of SoC interconnects, Field programmable interconnect chips, parallel computer systems and in time-space-time switches.

Numerous modifications and adaptations of the embodiments, implementations, and examples described herein will be apparent to the skilled artisan in view of the disclosure.

What is claimed is:

1. A network implemented in a non-transitory medium comprising a plurality of blocks and a plurality of inlet links and a plurality of outlet links said plurality of blocks arranged in a two-dimensional grid of a plurality of rows and a plurality of columns; and each block of said plurality of blocks comprising y stages, where y≥1; and each stage of said y stages comprising one or more switches of size $d_i \times d_o$, where $d_i, d_o$ are integers, and $d_i \geq 2$ and $d_o \geq 2$ and each switch of said one or more switches of size $d_i \times d_o$ having $d_i$ incoming links and $d_o$ outgoing links; and each switch of said one or more switches of size $d_i \times d_o$ further comprising a plurality of multiplexers of size d≥2, with each multiplexer of said plurality of multiplexers comprising d inputs and one output; and each switch of said one or more switches of size $d_i \times d_o$ comprises either only a forward switch, or only a backward switch, or both a forward switch and a backward switch, or a forward switch, a backward switch and U-turn switch; and said $d_i$ incoming links and said $d_o$ outgoing links comprises a plurality of straight links and a plurality of cross links; and each outlet link of said plurality of outlet links is connected to the output of one of said multiplexers of said plurality of multiplexers of one switch of one or more switches of size $d_i \times d_o$ of one stage of said y stages of one block of said plurality of blocks, and each inlet link of said plurality of inlet links is connected to one input of said d inputs of one or more multiplexers of said plurality of multiplexers of one or more switches of said one or more switches of size $d_i \times d_o$ of one or more stages of said y stages of one or more blocks of said plurality of blocks; and a first block of the plurality of blocks comprising the same or different number of said y stages as a second block of the plurality of blocks; a first stage of said y stages comprising the same or different number of said one or more switches of size $d_i \times d_o$ as a second stage of said y stages; and a first switch of said one or more switches of size $d_i \times d_o$ in each stage of said y stages is of the same or different size as a second switch of said one or more switches of size $d_i \times d_o$, each multiplexer of said plurality of multiplexers in each stage is of the same or different size; and each straight link of said plurality of straight links connected from the output of a first multiplexer of said plurality of multiplexers of a first switch of said at least one switch of size $d_i \times d_o$ of a first stage of said y stages in one block of said plurality of blocks to input of a second multiplexer of said plurality of multiplexers of a second switch of said at least one switch of size $d_i \times d_o$ of a second stage of said y stages in the same block of said plurality of blocks; and each cross link of said plurality of cross links connected from the output of a first multiplexer of said plurality of multiplexers of a first switch of said at least one switch of size $d_i \times d_o$ of a first stage of said y stages of one block of said plurality of blocks to one or more inputs of said d inputs of one or more multiplexers of said plurality of multiplexers of a second switch of said at least one switch of size $d_i \times d_o$ of either the same numbered stage or an immediately succeeding stage or an immediately preceding stage of said y stages in a second block of said plurality of blocks; and one or more cross links of said plurality of cross links are either connected between multiplexers of said plurality of multiplexers of switches of said at least one switch of size $d_i \times d_o$ in same numbered stages in two different blocks of said plurality of blocks or connected between multiplexers of said plurality of multiplexers of switches of said at least one switch of size $d_i \times d_o$ in different numbered stages in two different blocks of said plurality of blocks.

2. The network implemented in a non-transitory medium of claim 1, wherein said plurality of cross links are connected as either vertical tracks only, or horizontal tracks only; and each block of said plurality of blocks with its said y stages is replicated in either said plurality of rows or said plurality of columns of the two-dimensional grid.

3. The network implemented in a non-transitory medium of claim 1, wherein said plurality of cross links are cascaded through only one multiplexer of said plurality of multiplexers at each switch of said at least one switch of size $d_i \times d_o$.

4. The network implemented in a non-transitory medium of claim 1, wherein said one or more cross links of said plurality of cross links are connected between at least one same numbered stage in all said plurality of blocks, or said one or more cross links of said plurality of cross links are connected between at least two not same numbered stages of said y stages in all said plurality of blocks, or said plurality of cross links are all connected between same numbered stages of said y stages in all stages of said y stages of all said plurality of blocks.

5. The network implemented in a non-transitory medium of claim 1, wherein said one or more stages of said y stages in one block of said plurality of blocks are not connected to any other stages of said y stages in another block of said plurality of blocks, or one or more stages of said y stages in one block of said plurality of blocks are connected to stages of said y stages in another block of said plurality of blocks by one or more cross links of said plurality of cross links, when said two-dimensional grid is replicated by increasing said plurality of rows or said plurality of columns.

6. The network implemented in a non-transitory medium of claim 1, wherein said plurality of cross links are implemented in two or more metal layers, or each multiplexer of said plurality of multiplexers is configurable by SRAM cells or Flash Cells, or said plurality of cross links use a plurality of buffers to amplify signals driven through them; and said buffers are either inverting or non-inverting buffers, or one or more stages of said y stages in a block of said plurality of blocks comprising a switch of size $(d_i+m) \times (d_o+n)$, where $d_i \geq 2$, $d_o \geq 2$, $m \geq 0$, $n \geq 0$ where m, n are integers, or # one or more of said y stages in a block of said plurality of blocks comprising six 2:1 multiplexers, or eight 2:1 multiplexers, or four 3:1 multiplexers, or four 4:1 multiplexers.

7. The network implemented in a non-transitory medium of claim 1, wherein said switches of size $d_i \times d_o$ are either fully populated or partially populated, or said plurality of blocks are implemented in a 3D integrated circuit device.

8. A network implemented in a non-transitory medium comprising a plurality of blocks and a plurality of inlet links and a plurality of outlet links said plurality of blocks arranged in a two-dimensional grid of a plurality of rows and a plurality of columns; and each block of said plurality of blocks comprising y stages, where $y \geq 1$; and each stage of said y stages comprising one or more switches of size $d_i \times d_o$, where $d_i, d_o$ are integers, and $d_i \geq 2$ and $d_o \geq 2$ and each switch of said one or more switches of size $d_i \times d_o$ having $d_i$ incoming links and $d_o$ outgoing links;

each switch of said one or more switches of size $d_i \times d_o$ comprises either only a forward switch, or only a backward switch, or both a forward switch and a backward switch, or a forward switch, a backward switch and U-turn switch; and said $d_i$ incoming links and said $d_o$ outgoing links comprises a plurality of straight links and a plurality of cross links; and each outlet link of said plurality of outlet links is connected to the output of one switch of said one or more switches of size $d_i \times d_o$ of one stage of said y stages of one block of said plurality of blocks, and each inlet link of said plurality of inlet links is connected to one input of said d inputs of one or more switches of said one or more switches of size $d_i \times d_o$ of one or more stages of said y stages of one or more blocks of said plurality of blocks; and a first block of the plurality of blocks comprising the same or different number of said y stages as a second block of the plurality of blocks; a first stage of said y stages comprising the same or different number of said one or more switches of size $d_i \times d_o$ as a second stage of said y stages; and a first switch of said one or more switches of size $d_i \times d_o$ in each stage of said y stages is of the same or different size as a second switch of said one or more switches of size $d_i \times d_o$; and each straight link of said plurality of straight links connected from the output of a first switch of said at least one switch of size $d_i \times d_o$ of a first stage of said y stages in one block of said plurality of blocks to input of a second switch of said at least one switch of size $d_i \times d_o$ of a second stage of said y stages in the same block of said plurality of blocks; and each cross link of said plurality of cross links connected from the output of a first switch of said at least one switch of size $d_i \times d_o$ of a first stage of said y stages of one block of said plurality of blocks to one or more inputs of said d inputs of a second switch of said at least one switch of size $d_i \times d_o$ of either the same numbered stage or an immediately succeeding stage or an immediately preceding stage of said y stages in a second block of said plurality of blocks; and one or more cross links of said plurality of cross links are either connected between switches of said at least one switch of size $d_i \times d_o$ in same numbered stages in two different blocks of said plurality of blocks.

9. The network implemented in a non-transitory medium of claim 8, wherein said plurality of cross links are connected as either vertical tracks only, or horizontal tracks only; and each block of said plurality of blocks with its said y stages is replicated in either said plurality of rows or said plurality of columns of the two-dimensional grid.

10. The network implemented in a non-transitory medium of claim 8, wherein said one or more cross links of said plurality of cross links are connected between at least one same numbered stage in all said plurality of blocks, or said one or more cross links of said plurality of cross links are connected between at least two not same numbered stages of said y stages in all said plurality of blocks, or said plurality of cross links are all connected between same numbered stages of said y stages in all stages of said y stages of all said plurality of blocks.

11. The network implemented in a non-transitory medium of claim 8, wherein said one or more stages of said y stages in one block of said plurality of blocks are not connected to any other stages of said y stages in another block of said plurality of blocks, or one or more stages of said y stages in one block of said plurality of blocks are connected to stages of said y stages in another block of said plurality of blocks by one or more cross links of said plurality of cross links, when said two-dimensional grid is replicated by increasing said plurality of rows or said plurality of columns.

12. The network implemented in a non-transitory medium of claim 8, wherein said plurality of cross links are implemented in two or more metal layers, or each switch is configurable by SRAM cells or Flash Cells, or said plurality of cross links use a plurality of buffers to amplify signals driven through them; and said buffers are either inverting or non-inverting buffers, or one or more stages of said y stages in a block of said plurality of blocks comprising a switch of size $(d_i+m) \times (d_o+n)$, where $d_i \geq 2$, $d_o \geq 2$, $m \geq 0$, $n \geq 0$ where m,n are integers.

13. The network implemented in a non-transitory medium of claim 8, wherein said switches of size $d_i \times d_o$ are either fully populated or partially populated, or said plurality of blocks are implemented in a 3D integrated circuit device.

14. A network implemented in a non-transitory medium comprising a plurality of blocks and a plurality of inlet links and a plurality of outlet links said plurality of blocks arranged in a two-dimensional grid of a plurality of rows and a plurality of columns; and each block of said plurality of blocks comprising y stages, where $y \geq 1$; and each stage of said y stages comprising a switch one or more switches of size $d_i \times d_o$, where $d_i, d_o$ are integers, and $d_i \geq 2$ and $d_o \geq 2$ and each switch of said one or more switches of size $d_i \times d_o$ having $d_i$ incoming links and $d_o$ outgoing links; and each switch of said one or more switches of size $d_i \times d_o$ further comprising a plurality of multiplexers of size $d \geq 2$, with each multiplexer of said plurality of multiplexers comprising d inputs and one output; and each switch of said one or more switches of size $d_i \times d_o$ comprises either only a forward switch, or only a backward switch, or both a forward switch and a backward switch, or a forward switch, a backward switch and U-turn switch; and said $d_i$ incoming links and said $d_o$ outgoing links comprises a plurality of straight links and a plurality of cross links; and each outlet link of said plurality of outlet links is connected to the output of one of said multiplexers of said plurality of multiplexers of one switch of said one or more switches of size $d_i \times d_o$ of one stage of said y stages of one block of said plurality of blocks, and each inlet link of said plurality of inlet links is connected to one input of said d inputs of one or more multiplexers of said plurality of multiplexers of one or more switches of said one or more switches of size $d_i \times d_o$ of one or more stages of said y stages of one or more blocks of said plurality of blocks; and a first block of the plurality of blocks comprising the same or different number of said y stages as a second block of the plurality of blocks; a first stage of said y stages comprising the same or different number of said one or more switches of size $d_i \times d_o$ as a second stage of said y stages; and a first switch of said one or more switches of size $d_i \times d_o$ in each stage of said y stages is of the same or different size as a second switch of said one or more switches of size $d_i \times d_o$, each multiplexer of said plurality of multiplexers in each stage is of the same or different size; and each straight link of said plurality of straight links connected from the output of a first multiplexer of said plurality of multiplexers of a first switch of said at least one switch of size $d_i \times d_o$ of a first stage of said y stages in one block of said plurality of blocks to input of a second multiplexer of said plurality of multiplexers of a second switch of said at least one switch of size $d_i \times d_o$ of a second stage of said y stages in the same block of said plurality of blocks; and each cross link of said plurality of cross links connected from the output of a first multiplexer of said plurality of multiplexers of a first switch of said at least one switch of size $d_i \times d_o$ of a first stage of said y stages of one block of said plurality of blocks to one or more inputs of said d inputs of one or more multiplexers of said plurality of multiplexers of a second switch of said at least one switch of size $d_i \times d_o$ of a second stage of said y stages in a second block of said plurality of blocks; and one or more cross links of said plurality of cross links are either connected between multiplexers of said plurality of multiplexers of switches of said at least one switch of size $d_i \times d_o$ in same numbered stages in two different blocks of said plurality of blocks or connected between multiplexers of said plurality of multiplexers of switches of said at least one switch of size $d_i \times d_o$ in different numbered stages in two different blocks of said plurality of blocks.

15. The network implemented in a non-transitory medium of claim 14, wherein said plurality of cross links are connected as either vertical links tracks only, or horizontal tracks only; and each block of said plurality of blocks with its said y stages is replicated in either said plurality of rows or said plurality of columns of the two-dimensional grid.

16. The network implemented in a non-transitory medium of claim 14, wherein said plurality of cross links are cascaded through only one multiplexer of said plurality of multiplexers at each switch of said at least one switch of size $d_i \times d_o$.

17. The network implemented in a non-transitory medium of claim 14, wherein said one or more cross links of said plurality of cross links are connected between at least one same numbered stage in all said plurality of blocks, or said one or more cross links of said plurality of cross links are connected between at least two not same numbered stages of said y stages in all said plurality of blocks, or said plurality of cross links are all connected between same numbered stages of said y stages in all stages of said y stages of all said plurality of blocks.

18. The network implemented in a non-transitory medium of claim 14, wherein said one or more stages of said y stages in one block of said plurality of blocks are not connected to any other stages of said y stages in another block of said plurality of blocks, or one or more stages of said y stages in one block of said plurality of blocks are connected to stages of said y stages in another block of said plurality of blocks by one or more cross links of said plurality of cross links, when said two-dimensional grid is replicated by increasing said plurality of rows or said plurality of columns.

19. The network implemented in a non-transitory medium of claim 14, wherein said plurality of cross links are implemented in two or more metal layers, or each multiplexer of said plurality of multiplexers is configurable by SRAM cells or Flash Cells, or said plurality of cross links use a plurality of buffers to amplify signals driven through them; and said buffers are either inverting or non-inverting buffers, or one or more stages of said y stages in a block of said plurality of blocks comprising a switch of size $(d_i+m) \times (d_o+n)$, where $d_i \geq 2$, $d_o \geq 2$, $m \geq 0$, $n \geq 0$ where m, n are integers, or # one or more of said y stages in a block of said plurality of blocks comprising six 2:1 multiplexers, or eight 2:1 multiplexers, or four 3:1 multiplexers, or four 4:1 multiplexers.

20. The network implemented in a non-transitory medium of claim 14, wherein said switches of size $d_i \times d_o$ are either fully populated or partially populated, or said plurality of blocks are implemented in a 3D integrated circuit device.

\* \* \* \* \*